United States Patent
Ohashi et al.

(10) Patent No.: US 9,223,205 B2
(45) Date of Patent: Dec. 29, 2015

(54) ACID GENERATOR, CHEMICALLY AMPLIFIED RESIST COMPOSITION, AND PATTERNING PROCESS

(71) Applicant: SHIN-ETSU CHEMICAL CO., LTD., Tokyo (JP)

(72) Inventors: Masaki Ohashi, Jyoetsu (JP); Takayuki Nagasawa, Jyoetsu (JP); Ryosuke Taniguchi, Jyoetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 13/770,147

(22) Filed: Feb. 19, 2013

(65) Prior Publication Data
US 2013/0236832 A1 Sep. 12, 2013

(30) Foreign Application Priority Data
Mar. 7, 2012 (JP) ................................. 2012-050515

(51) Int. Cl.
*G03F 7/004* (2006.01)
*G03F 7/039* (2006.01)

(52) U.S. Cl.
CPC .............. *G03F 7/004* (2013.01); *G03F 7/0045* (2013.01); *G03F 7/0046* (2013.01); *G03F 7/0392* (2013.01); *G03F 7/0397* (2013.01)

(58) Field of Classification Search
CPC .................................................... G03F 7/0045
See application file for complete search history.

(56) References Cited

U.S. PATENT DOCUMENTS

| | | | |
|---|---|---|---|
| 6,048,672 | A | 4/2000 | Cameron et al. |
| 6,312,867 | B1 | 11/2001 | Kinsho et al. |
| 7,704,668 | B1 | 4/2010 | Cameron et al. |
| 2002/0102491 | A1 | 8/2002 | Kodama et al. |
| 2002/0197558 | A1 | 12/2002 | Ferreira et al. |

(Continued)

FOREIGN PATENT DOCUMENTS

| | | |
|---|---|---|
| CA | 2049772 | 2/1992 |
| JP | A-4-230645 | 8/1992 |

(Continued)

OTHER PUBLICATIONS

Dammel et al., "193 nm Immersion Lithography—Taking the Plunge," *Journal of Photopolymer Science and Technology*, (2004) vol. 17, No. 4, pp. 587-601.

*Primary Examiner* — Anca Eoff
*Assistant Examiner* — Alyssa L Cepluch
(74) *Attorney, Agent, or Firm* — Oliff PLC

(57) ABSTRACT

There is disclosed an acid generator generating a sulfonic acid represented by the following general formula (1) in response to high-energy beam or heat:

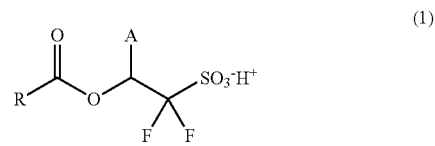

(1)

As a result, there is provided a novel acid generator which is suitably used as an acid generator for a resist composition, which solves the problems of exposure margin and MEF particularly without degradation of resolution and can be effectively and widely used, a chemically amplified resist composition using the same, and a patterning process.

17 Claims, 4 Drawing Sheets

(56) References Cited

U.S. PATENT DOCUMENTS

| | | | |
|---|---|---|---|
| 2003/0013039 A1 | 1/2003 | Kobayashi et al. | |
| 2003/0113659 A1 | 6/2003 | Hatakeyama et al. | |
| 2005/0208424 A1 | 9/2005 | Hasegawa et al. | |
| 2006/0228648 A1 | 10/2006 | Ohsawa et al. | |
| 2007/0099113 A1 | 5/2007 | Kobayashi et al. | |
| 2007/0122750 A1 | 5/2007 | Yamaguchi et al. | |
| 2008/0085469 A1* | 4/2008 | Ohsawa et al. | 430/286.1 |
| 2008/0090172 A1 | 4/2008 | Hatakeyama et al. | |
| 2008/0118860 A1 | 5/2008 | Harada et al. | |
| 2008/0124652 A1* | 5/2008 | Nishi et al. | 430/270.1 |
| 2009/0087786 A1* | 4/2009 | Hatakeyama | 430/285.1 |
| 2010/0055608 A1* | 3/2010 | Ohashi et al. | 430/270.1 |
| 2010/0099042 A1* | 4/2010 | Ohashi et al. | 430/270.1 |
| 2011/0003247 A1 | 1/2011 | Ohashi et al. | |
| 2011/0200936 A1 | 8/2011 | Ichikawa et al. | |
| 2012/0219904 A1* | 8/2012 | Ichikawa et al. | 430/280.1 |

FOREIGN PATENT DOCUMENTS

| | | |
|---|---|---|
| JP | A-11-282168 | 10/1999 |
| JP | A-2000-122296 | 4/2000 |
| JP | A-2000-336121 | 12/2000 |
| JP | A-2002-214774 | 7/2002 |
| JP | A-2003-66612 | 3/2003 |
| JP | A-2003-140332 | 5/2003 |
| JP | A-2004-2252 | 1/2004 |
| JP | A-2004-531749 | 10/2004 |
| JP | A-2005-84365 | 3/2005 |
| JP | A-2005-264103 | 9/2005 |
| JP | A-2005-266766 | 9/2005 |
| JP | A-2007-145797 | 6/2007 |
| JP | A-2007-145804 | 6/2007 |
| JP | A-2007-161707 | 6/2007 |
| JP | A-2008-69146 | 3/2008 |
| JP | A-2008-111103 | 5/2008 |
| JP | A-2008-122932 | 5/2008 |
| JP | A-2011-13479 | 1/2011 |
| JP | A-2011-246439 | 12/2011 |
| WO | WO 02/42845 A2 | 5/2002 |

\* cited by examiner

ACID GENERATOR, CHEMICALLY AMPLIFIED RESIST COMPOSITION, AND PATTERNING PROCESS

BACKGROUND OF THE INVENTION

1. Field of the Invention

The present invention relates to a novel acid generator which is suitably used, especially as an acid generator for a resist composition, a chemically amplified resist composition using the same, and a patterning process.

2. Description of the Related Art

In recent years, as LSI progresses towards high integration and a further acceleration in speed, a miniaturization of a pattern rule is required. Deep-ultraviolet lithography and vacuum ultraviolet lithography are thought to hold particular promise as the next generation microfabrication technology. In particular, photolithography using an ArF excimer laser as the light source is the technique essential to ultra-fine microfabrication capable of achieving a size of 0.13 µm or less.

ArF lithography has started being partially used from production of a 130-nanometer node device, and used as a main lithography technique from production of a 90-nanometer node device. At first, 157-nm lithography with a $F_2$ laser has held promise for the next technique of 45-nm node lithography. However, the delayed development caused by various problems has been pointed, and ArF immersion lithography has been proposed suddenly. In the ArF immersion lithography, a liquid having a higher refractive index than air, such as water, ethylene glycol, or glycerin, is placed between a projection lens and a wafer to set the numerical aperture (NA) of the projection lens to 1.0 or more and achieve a high degree of resolution (see, Non-Patent Document 1).

To prevent a precise and expensive optical material from deteriorating, the ArF lithography requires a resist composition having a high sensitivity capable of getting sufficient resolution even by a small exposure dose. As a strategy for the resist composition, it is most common that a component having a high transparent at a wavelength of 193 nm is selected. For example, a polyacrylic acid and derivatives thereof, a norbornene-maleic acid anhydride alternating polymer, polynorbornene, a ring-opening metathesis polymer, and a hydrogenated ring-opening metathesis polymer have been proposed as a base resin. This proposal achieves some results in terms of increasing the transparency of a resin itself.

Various photoacid generators have been investigated. When a photoacid generator generating an alkane or an arene sulfonic acid, which is used for a chemically amplified resist composition using the conventional KrF excimer laser as the light source, is used as a component of the ArF chemically amplified resist composition, the acid strength is not sufficient to cut the acid labile group of a resin, a resolution cannot be achieved, or a sensitivity is low. Thus, the resist composition is not suitable for production of a device.

For this reason, as a photoacid generator in the ArF chemically amplified resist composition, photoacid generators generating a perfluoroalkanesulfonic acid having a high acid strength are typically used. The photoacid generators generating a perfluoroalkanesulfonic acid have been developed for a KrF resist composition. For example, Patent Documents 1 and 2 describe photoacid generators generating perfluorohexanesulfonic acid, perfluorooctanesulfonic acid, perfluoro-4-ethylcyclohexanesulfonic acid, and perfluorobutanesulfonic acid. Further, as a novel acid generator, acid generators generating a perfluoroalkyl ether sulfonic acid are suggested in Patent Documents 3 to 5.

On the other hand, perfluorooctanesulfonic acid or derivatives thereof are known as its acronym PFOS, and have problems of stability (non-degradability) caused by a C—F bond, bioconcentration due to hydrophobicity and lipophilicity, and accumulation. Environmental Protection Agency (EPA) has adopted Significant New Use Rule, listing 13 PFOS-related chemical substances and further 75 chemical substances although their use in the photoresist field is excluded. Further, it has been suggested that Significant New Use Rule is applied to 183 chemical substances such as a perfluoroalkanesulfonic acid or a derivative thereof.

To cope with the problems of PFOS, various companies have developed a partially fluorine-substituted alkanesulfonic acid having a lower fluorine substitution ratio. For example, Patent Document 6 discloses development of an α,α-difluoroalkanesulfonic acid salt from an α,α-difluoroalkene and a sulfur compound, and a resist composition containing a photoacid generator generating such a sulfonic acid upon exposure, specifically di(4-tert-butylphenyl)iodonium 1,1-difluoro-2-(1-naphthyl)ethanesulfonate. Patent Document 7 discloses development of an α,α,β,β-tetrafluoroalkanesulfonic acid salt from an α,α,β,β-tetrafluoro-α-iodoalkane and a sulfur compound, a photoacid generator generating such a sulfonic acid, and a resist composition. Patent Document 3 discloses a photoacid generator having a difluorosulfoacetic acid alkyl ester (e.g., 1-(alkoxycarbony)-1,1-difluoromethane sulfonate), or a difluorosulfoacetic acid amide (e.g., 1-carbamoyl-1,1-difluoromethane sulfonate), but does not describe a synthesis method thereof. Patent Document 8 discloses a photosensitive composition containing a compound generating a partially fluorinated-alkanesulfonic acid having a sulfonylamide structure derived from perfluoroalkylene disulfonyl difluoride.

The substances described in Patent Documents have a lower fluorine substitution ratio. However, since the substances have a hydrocarbon skeleton which is unlikely to be degraded as a basic skeleton, and do not have a substituent which is easily degraded like an ester group, the substances have low degradability. Further, the molecular design in which the size of alkanesulfonic acid is changed is limited. Moreover, the substances have problems such as expensive starting materials containing fluorine.

For example, as the circuit line width is reduced, the influence of contrast degradation by acid diffusion becomes more serious for a resist composition. This is because the pattern size approaches the diffusion length of acid. As a gap (mask error factor (MEF)) in the size on a wafer relative to a gap in the size of a mask is increased, mask fidelity is decreased and pattern rectangularity is degraded. Accordingly, in order to obtain more benefits from a reduction of the wavelength of light source and an increase of NA, it is necessary that dissolution contrast be increased or acid diffusion be suppressed as compared with the conventional material.

Patent Document 9 discloses alkanecarbonyloxy-1,1,3,3,3-pentafluoropropane sulfonate having 1 to 20 carbon atoms or arenecarbonyloxy-1,1,3,3,3-pentafluoropropane sulfonate having 1 to 20 carbon atoms, such as triphenylsulfonium 2-(adamantane-1-carbonyloxy)-1,1,3,3,3-pentafluoropropane sulfonate, which is not sufficient to control diffusivity.

Patent Documents 10, 11, and 12 disclose photoacid generators generating a partially fluorinated-alkanesulfonic acid having a polycyclic hydrocarbon group, which cannot achieve sufficient resist performance. Since each photoacid generator is a labile ester of difluoroacetic acid, the storage stability of a resist composition containing the photoacid generator may be particularly decreased.

A certain gap in the exposure dose may be generated in the actual production of a device. Therefore, an exposure margin (EL) is required to keep a pattern profile that is substantially the same even when some gap in the exposure dose is generated. While a further miniaturization of a pattern rule is required, excellent performances of sensitivity, substrate adhesion, and etching resistance are required. In addition, a good exposure margin and mask fidelity are necessary without degradation of a resolution.

In immersion lithography, there are problems. Minute water droplets are left on a resist wafer after the exposure, causing damages to the resist pattern profile, collapse or deform into a T-top profile to the developed resist pattern. Therefore, a patterning process which can form a good resist pattern after development in immersion lithography is required.

CITATION LIST

Patent Literature

Patent Document 1: Japanese Patent Laid-Open Publication No. 2000-122296
Patent Document 2: Japanese Patent Laid-Open Publication No. 11-282168
Patent Document 3: Japanese Patent Laid-Open Publication No. 2002-214774
Patent Document 4: Japanese Patent Laid-Open Publication No. 2003-140332
Patent Document 5: Specification in U.S. Patent No. 2002/197558
Patent Document 6: Japanese Patent Application Publication No. 2004-531749
Patent Document 7: Japanese Patent Laid-Open Publication No. 2004-2252
Patent Document 8: Japanese Patent Laid-Open Publication No. 2005-266766
Patent Document 9: Japanese Patent Laid-Open Publication No. 2007-145797
Patent Document 10: Japanese Patent Laid-Open Publication No. 2007-161707
Patent Document 11: Japanese Patent Laid-Open Publication No. 2008-69146
Patent Document 12: Japanese Patent Laid-Open Publication No. 2011-246439

Non-Patent Literature

Non-Patent Document 1: Journal of photopolymer Science and Technology Vol. 17, No. 4, p 587 (2004)

SUMMARY OF THE INVENTION

It is desired that an acid generated from an acid generator has acid strength sufficient to cut an acid labile group in a resist composition, a good storage stability in the resist composition, a suitable diffusibility in the resist composition, a low volatility, and a low elution volume into water, the amounts of foreign substances is small after development and peeling, and the degradability is good without burdening the environment after completion of use for lithography. How-ever, an acid generated from the conventional photoacid generator does not satisfy these requirements.

A resist composition using the conventional photoacid generator cannot solve the problems of exposure margin and MEF without degradation of a resolution. Further, the width of line to be designed using the conventional acid generator is small. As a result, the exposure condition, and the kind and composition of a polymer are necessarily limited, and the conventional acid generator cannot meet a variety of needs.

In view of the above situation, an object of the present invention is to provide a novel acid generator suitable for an acid generator of a resist composition, which solves the problems of exposure margin and MEF without degradation of a resolution and can be widely and effectively used particularly, a chemically amplified resist composition using the same, and a patterning process.

In order to solve the above-described problems, the present invention provides an acid generator generating a sulfonic acid represented by the following general formula (1) in response to high-energy beam or heat,

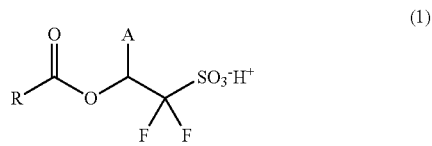

(1)

wherein R represents an oxirane ring or an oxetane ring, or a substituted or an unsubstituted monovalent hydrocarbon group having any of an oxirane ring and an oxetane ring, and 1 to 20 carbon atoms, optionally containing a heteroatom, and A represents a hydrogen atom or a trifluoromethyl group.

Synthesis of such an acid generator is simply and various molecular designs thereof are possible. Therefore, the molecular design can be performed according to a condition for a desired resist. When the acid generator is used for a chemically amplified resist composition, an acid generator having an excellent exposure margin and MEF without degradation of a resolution is produced.

In this case, the acid generator generating a sulfonic acid represented by the general formula (1) may be a sulfonium salt represented by the following general formula (2),

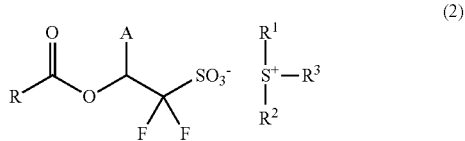

(2)

wherein R and A represent the same meanings as before; each of $R^1$, $R^2$, and $R^3$ independently represents any of a linear or a branched alkyl group, alkenyl group, and oxoalkyl group, substituted or unsubstituted, having 1 to 10 carbon atoms, or any of an aryl group, aralkyl group, and aryloxoalkyl group, substituted or unsubstituted, having 6 to 18 carbon atoms, or any two or more of $R^1$, $R^2$, and $R^3$ may be bonded to form a ring together with the sulfur atom in the formula.

The sulfonium salt may be a sulfonium salt represented by the following general formula (3),

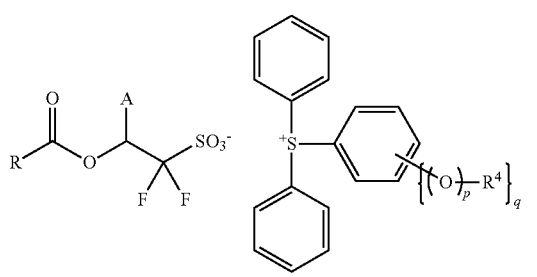
(3)

wherein R and A represent the same meanings as before; $R^4$ represents a linear, a branched, or a cyclic alkyl group or alkenyl group, substituted or unsubstituted, having 1 to 20 carbon atoms, or a substituted or an unsubstituted aryl group having 6 to 14 carbon atoms; p represents 0 or 1; and q represents an integer of 1 to 5.

As described above, the acid generator generating an acid represented by the general formula (1) includes those represented by the general formulae (2) and (3).

The present invention provides a chemically amplified resist composition containing a base resin, an acid generator, a quencher, and an organic solvent, wherein the acid generator is the acid generator of the present invention.

The chemically amplified resist composition of the present invention has a good exposure margin, and a high resolution suitable for microfabrication.

The base resin is preferably a polymer containing a repeating unit having an acid labile group represented by the following general formula (4) and a repeating unit represented by the following general formula (5),

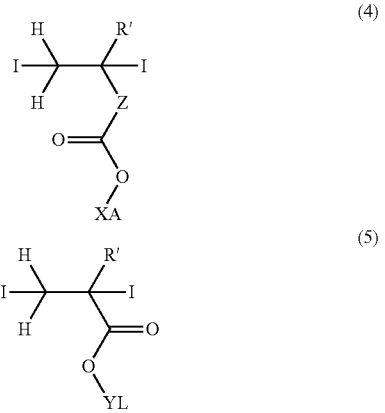

wherein R' represents any of a hydrogen atom, a fluorine atom, a methyl group, and a trifluoromethyl group; Z represents any of a single bond, a phenylene group, a naphthylene group, and (main chain)-C(=O)—O—Z'—; Z' represents a linear, a branched, or a cyclic alkylene group having 1 to 10 carbon atoms, optionally containing any of a hydroxy group, an ether bond, an ester bond, and a lactone ring, a phenylene group, or a naphthylene group; XA represents an acid labile group; and YL represents a hydrogen atom or a polar group having one or more structures selected from a hydroxy group, a cyano group, a carbonyl group, a carboxyl group, an ether bond, an ester bond, a sulfonate ester bond, a carbonate bond, a lactone ring, a sultone ring, and a carboxylic acid anhydride.

A resin composition using such a base resin can have a high resolution. Further, a chemically amplified resin composition using the acid generator of the present invention has a high sensitivity and a high dry etching resistance, and in particular is suitable for deep-ultraviolet lithography.

The present invention provides a patterning process including a step of applying the chemically amplified resist composition to a substrate; a step of conducting heat-treatment; a step of exposing the substrate to any of a KrF excimer laser, an ArF excimer laser, EUV lithography, and an electron beam through a photomask; a step of conducting heat-treatment; and a step of developing it with a developer.

According to the patterning process of the present invention, a pattern having a very excellent pattern profile, roughness, and exposure margin can be formed.

In the exposure, a liquid having a refractive index of 1.0 or more can be placed between an applied resist film and a projection lens to conduct immersion lithography.

As described above, in the exposure step of the present invention, the immersion method in which immersion is conducted by placing a liquid having a refractive index of 1.0 or more between an applied resist film and a projection lens can be used.

Further, a top coat may be formed on the applied resist film, and the liquid may be placed between the top coat and the projection lens to conduct immersion lithography.

Thus, the surface of the applied resist film can be protected in immersion lithography, and therefore a pattern can be formed more exactly.

Effects of Invention

As described above, the synthesis of the acid generator of the present invention is simply and various molecular designs thereof are possible. Therefore, the molecular design can be performed according to a condition for a desired resist. When the acid generator is used for a chemically amplified resist composition, an acid generator having an excellent exposure margin and MEF without degradation of a resolution is produced. The storage stability is also good. A chemically amplified resist composition containing the acid generator of the present invention can be used to form a pattern having excellent pattern profile and roughness, and in particular, a hole pattern which having a good circularity without scum and fitting in the bottom part of a hole even when miniaturization is difficult as compared with a line pattern.

DETAILED DESCRIPTION OF THE PREFERRED EMBODIMENTS

Figure 1:
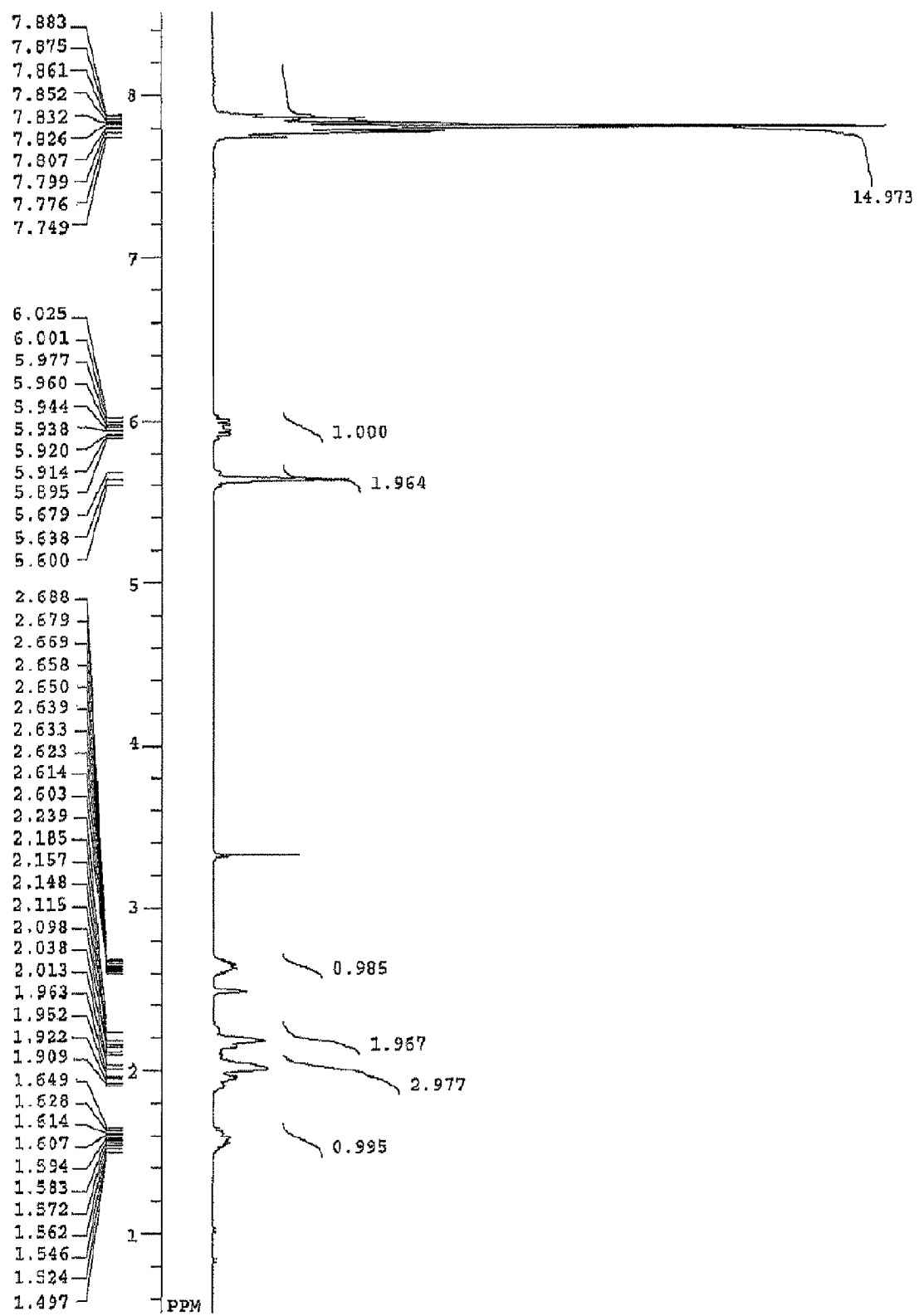
FIG. 1 is a graph showing $^1$H-NMR of [PAG intermediate] in Synthesis Example 1-1.

Hereinafter, the present invention will be described in detail.

As described above, when the conventional acid generator used for a resist composition is used, the generated acid cannot satisfy various characteristics, and in particular, cannot solve the problems of exposure margin and the like without degradation of a resolution. Further, the width of line to be designed using the conventional acid generator is small. As a result, the exposure condition, and the kind and composition of a polymer are necessarily limited, and the conventional acid generator cannot meet a variety of needs.

Inventors of the present invention have carried out extensive investigation of acid generators used for a resist composition and as a result, found that an acid generator generating an acid having a specific structure containing an oxirane ring or an oxetane ring in the molecule can meet various characteristics and solve the problems. The present invention has been accomplished.

The acid generator of the present invention is characterized by generating a sulfonic acid represented by the following general formula (1) in response to high-energy beam or heat,

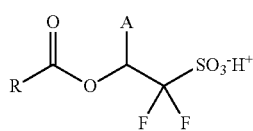
(1)

wherein R represents an oxirane ring or an oxetane ring, or a substituted or an unsubstituted monovalent hydrocarbon group having any of an oxirane ring and an oxetane ring, and 1 to 20 carbon atoms, optionally containing a heteroatom, and A represents a hydrogen atom or a trifluoromethyl group.

One of characteristics of the acid generator of the present invention is easiness of changing a structure represented by R into various structures according to a method described below. Thus, the degree of freedom of changing a structure is high, and the resist characteristics can be easily adjusted by modification of acyl group. Accordingly, an acid generator having an appropriate structure of R can be selected according to the exposure condition, and the kind and composition of a polymer.

The acid generator of the present invention having an oxirane ring or an oxetane ring has an improved resist performance, and in particular an improved exposure margin (EL). It is estimated that an acid generated by exposure gathers around an oxirane ring or an oxetane ring in the acid generator of the present invention to cause a ring opening reaction, resulting in a reaction with a carboxylic acid in a base resin, or the acid generator itself is subjected to ring opening polymerization to prevent the acid from moving, and as a result, acid diffusion is reduced to improve the exposure margin (EL) and MEF.

In the general formula (1), A represents a hydrogen atom or a trifluoromethyl group.

R may be an oxirane ring or an oxetane ring, or a substituted or an unsubstituted monovalent hydrocarbon group having any of an oxirane ring and an oxetane ring, and 1 to 20 carbon atoms, optionally containing a heteroatom. Examples of a monovalent hydrocarbon group having 1 to 20 carbon atoms include an alkyl group such as a methyl group, an ethyl group, a propyl group, an isopropyl group, a n-butyl group, a sec-butyl group, a tert-butyl group, a pentyl group, a hexyl group, a heptyl group, an octyl group, a cyclopentyl group, a cyclohexyl group, a cycloheptyl group, a cyclopropylmethyl group, a 4-methylcyclohexyl group, a cyclohexylmethyl group, a norbornyl group, and an adamantyl group, an alkenyl group such as a vinyl group, an allyl group, a propenyl group, a butenyl group, a hexenyl group, and a cyclohexenyl group, an aryl group such as a phenyl group, a naphthyl group, and a thienyl group, and an aralkyl group such as a benzyl group, a 1-phenylethyl group, and a 2-phenylethyl group. Some hydrogen atoms of the hydrocarbon group may be replaced by the hydrocarbon groups described above, or a heteroatom such as an oxygen atom, a sulfur atom, a nitrogen atom, or a halogen atom. As a result, a hydroxy group, a cyano group, a carbonyl group, an ether bond, an ester bond, a sulfonate ester bond, a carbonate bond, a lactone ring, a sultone ring, a carboxylic acid anhydride, or a haloalkyl group may be formed.

When R in the general formula (1) is a monovalent hydrocarbon group, the monovalent hydrocarbon group further has an oxirane ring or an oxetane ring.

Specific examples of the sulfonic acid represented by the general formula (1) include as follows, but the present invention is not limited to these examples.

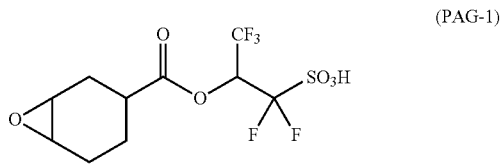
(PAG-1)

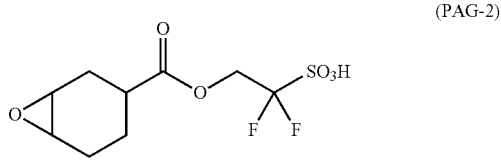
(PAG-2)

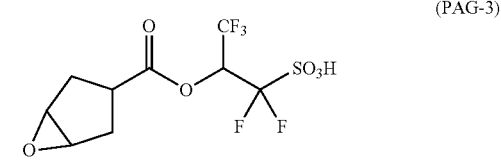
(PAG-3)

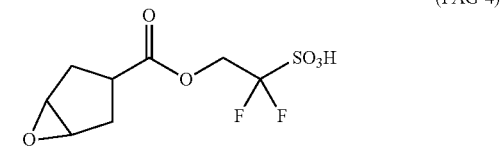
(PAG-4)

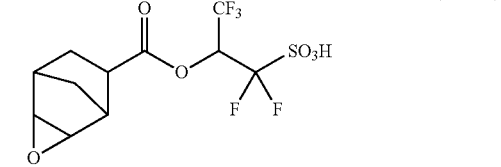
(PAG-5)

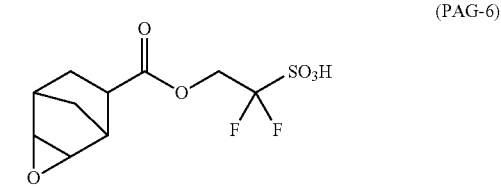
(PAG-6)

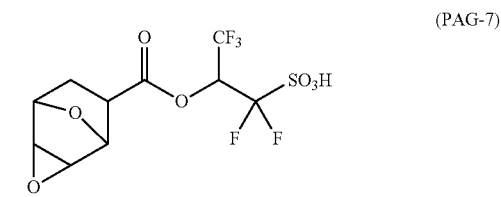
(PAG-7)

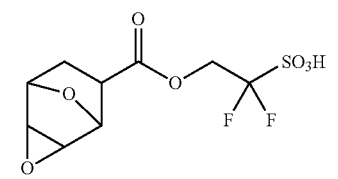
(PAG-8)
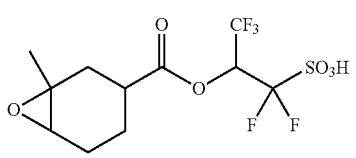
(PAG-9)
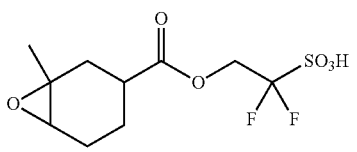
(PAG-10)
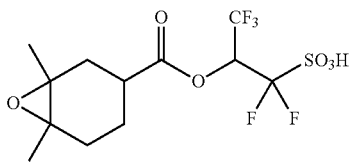
(PAG-11)
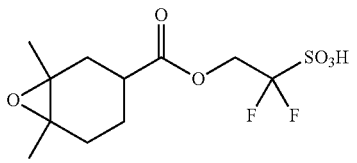
(PAG-12)
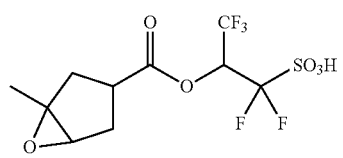
(PAG-13)
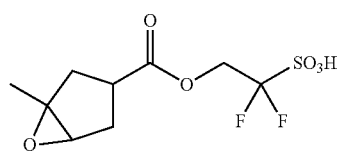
(PAG-14)
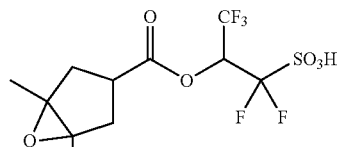
(PAG-15)
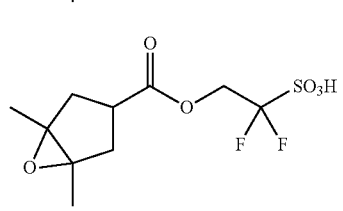
(PAG-16)
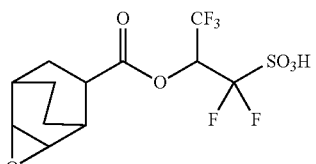
(PAG-17)
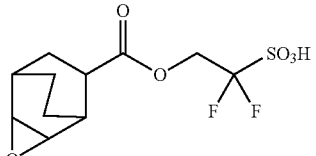
(PAG-18)
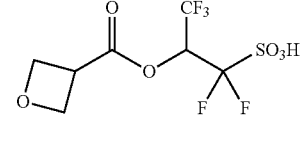
(PAG-19)
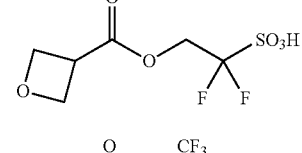
(PAG-20)
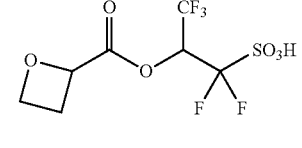
(PAG-21)
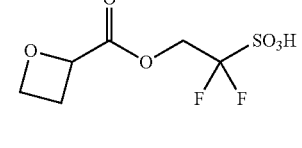
(PAG-22)
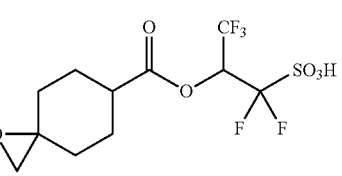
(PAG-23)
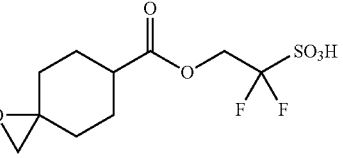
(PAG-24)
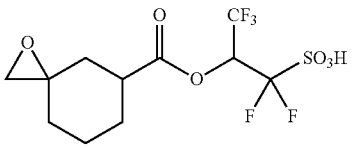
(PAG-25)
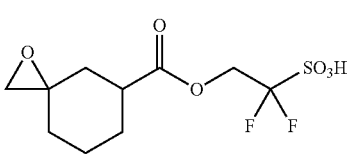
(PAG-26)

(PAG-27) 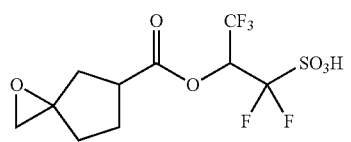
(PAG-28) 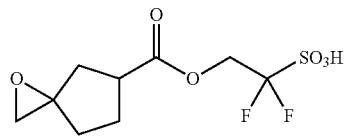
(PAG-29) 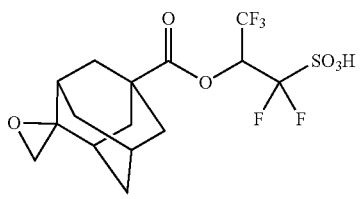
(PAG-30) 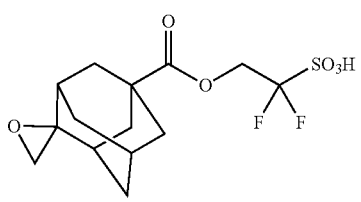
(PAG-31) 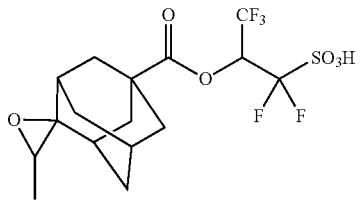
(PAG-32) 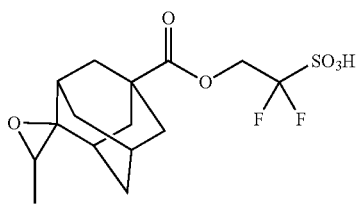
(PAG-33) 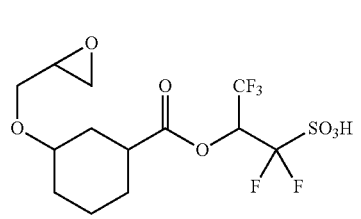
(PAG-34) 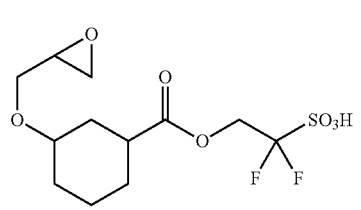
(PAG-35) 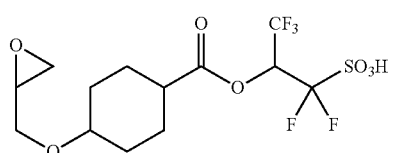
(PAG-36) 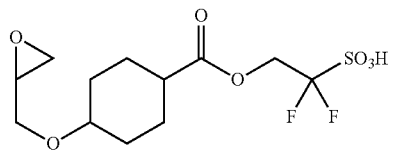
(PAG-37) 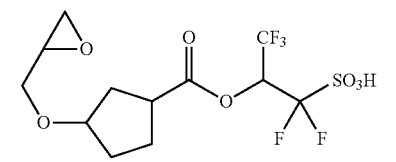
(PAG-38) 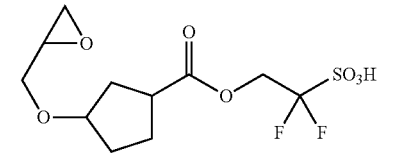
(PAG-39) 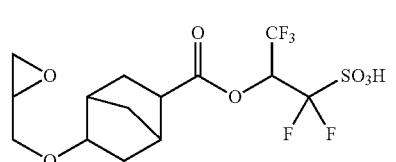
(PAG-40) 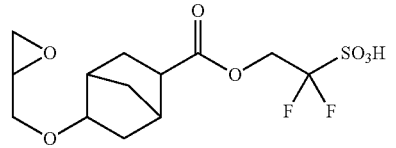
(PAG-41) 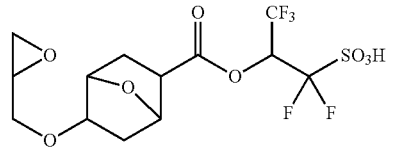
(PAG-42) 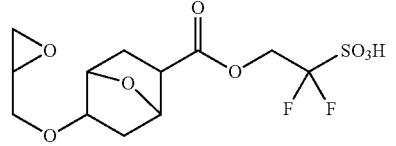
(PAG-43) 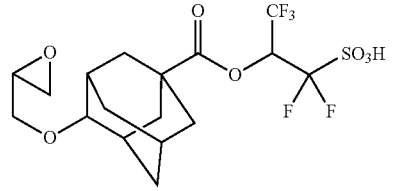

(PAG-44)
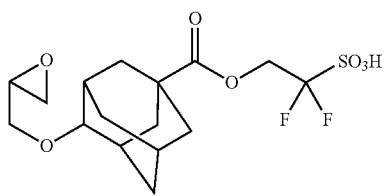
(PAG-45)
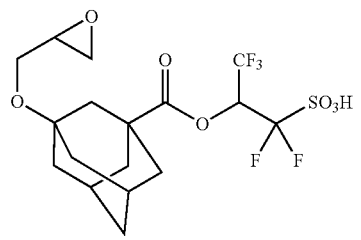
(PAG-46)
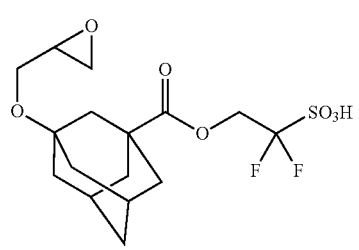
(PAG-47)
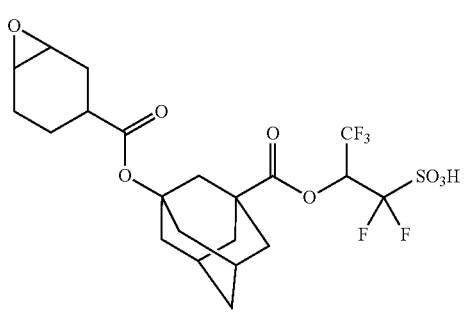
(PAG-48)
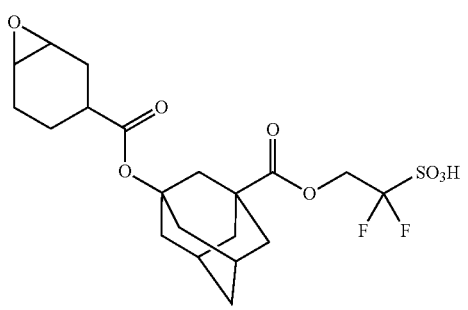
(PAG-49)
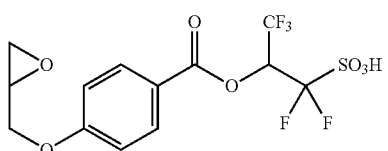
(PAG-50)
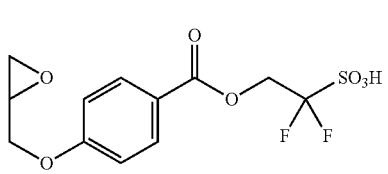
(PAG-51)
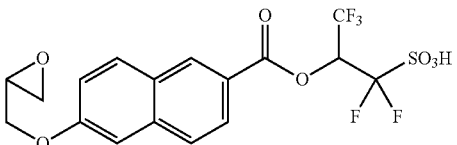
(PAG-52)
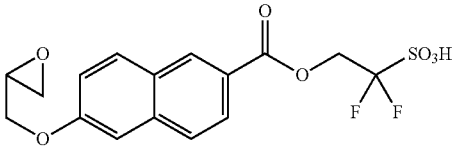
(PAG-53)
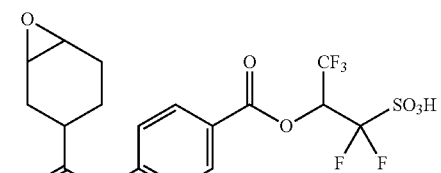
(PAG-54)
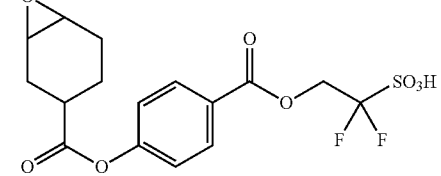
(PAG-55)
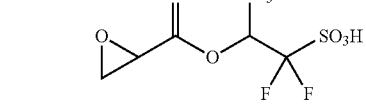
(PAG-56)
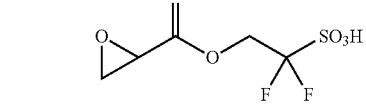
(PAG-57)
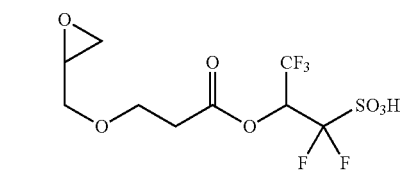
(PAG-58)
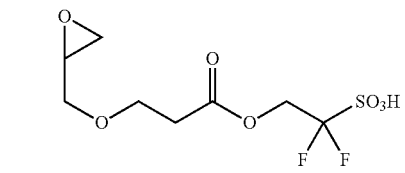
(PAG-59)
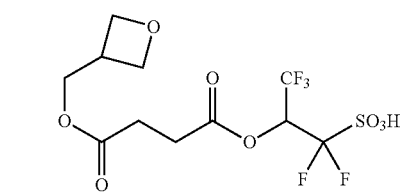

(PAG-60)

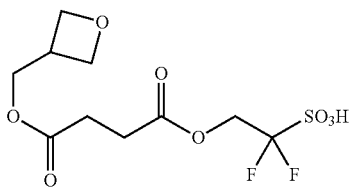

(PAG-61)

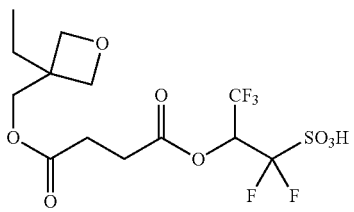

(PAG-62)

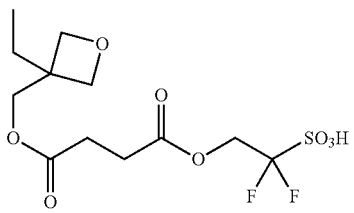

In particular, a sulfonic acid in which a cyclic hydrocarbon group is directly attached to the α-position of the carbonyl group in the general formula (1) and the oxirane ring or oxetane ring forms a condensed ring or a spiro ring together with the cyclic hydrocarbon group is preferable since the effect of suppressing acid diffusion is high and the resist performance can be improved. Among the specific examples, structures represented by PAG-1 to PAG-30 are preferable.

Sulfonic acids in which A in the general formula (1) is a trifluoromethyl group are preferable since the effect of suppressing acid diffusion is high and the resist performance can be improved. Further, the sulfonic acids have an excellent compatibility with other resist compositions, and various compositions can be adopted. Among the specific examples, structures represented by PAG-1, PAG-3, PAG-5, PAG-7, PAG-9, PAG-11, PAG-13, PAG-15, PAG-17, PAG-19, PAG-21, PAG-23, PAG-25, PAG-27, PAG-29, PAG-31, PAG-33, PAG-35, PAG-37, PAG-39, PAG-41, PAG-43, PAG-45, PAG-47, PAG-49, PAG-51, PAG-53, PAG-55, PAG-57, PAG-59, and PAG-61 are preferable.

Accordingly, among sulfonic acids represented by the general formula (1), structures represented by PAG-1, PAG-3, PAG-5, PAG-7, PAG-9, PAG-11, PAG-13, PAG-15, PAG-17, and PAG-19 are particularly preferable.

Examples of the acid generator generating a sulfonic acid represented by the general formula (1) include, but not limited to, an onium salt (e.g., iodonium salt, sulfonium salt, and ammonium salt). The acid generator is not limited as long as it generates an acid represented by the general formula (1) in response to high-energy beam or heat.

More specific examples of the acid generator include a sulfonium salt represented by the following general formula (2):

(2)

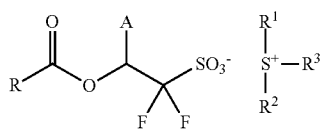

In the general formula (2), R and A represent the same meanings as before; each of $R^1$, $R^2$, and $R^3$ independently represents any of a linear or a branched alkyl group, alkenyl group, and oxoalkyl group, substituted or unsubstituted, having 1 to 10 carbon atoms, or any of an aryl group, aralkyl group, and aryloxoalkyl group, substituted or unsubstituted, having 6 to 18 carbon atoms, or any two or more of $R^1$, $R^2$, and $R^3$ may be bonded to form a ring together with the sulfur atom in the formula.

Specifically, examples of the alkyl group include a methyl group, an ethyl group, a propyl group, an isopropyl group, a n-butyl group, a sec-butyl group, a tert-butyl group, a pentyl group, a hexyl group, a heptyl group, an octyl group, a cyclopentyl group, a cyclohexyl group, a cycloheptyl group, a cyclopropylmethyl group, a 4-methylcyclohexyl group, a cyclohexylmethyl group, a norbornyl group, and an adamantyl group. Examples of the alkenyl group include a vinyl group, an allyl group, a propenyl group, a butenyl group, a hexenyl group, and a cyclohexenyl group. Examples of the oxoalkyl group include a 2-oxocyclopentyl group, a 2-oxocyclohexyl group, a 2-oxopropyl group, a 2-oxoethyl, group, a 2-cyclopentyl-2-oxoethyl group, a 2-cyclohexyl-2-oxoethyl group, and a 2-(4-methylcyclohexyl)-2-oxoethyl group.

Examples of the aryl group include a phenyl group, a naphthyl group, a thienyl group, an alkoxyphenyl group such as a 4-hydroxyphenyl group, a 4-methoxyphenyl group, a 3-methoxyphenyl group, a 2-methoxyphenyl group, a 4-ethoxyphenyl group, a 4-tert-buthoxyphenyl group, and a 3-tert-buthoxyphenyl group, an alkylphenyl group such as a 2-methylphenyl group, a 3-methylphenyl group, a 4-methylphenyl group, a 4-ethylphenyl group, a 4-tert-butylphenyl group, a 4-n-butylphenyl group, and a 2,4-dimethylphenyl group, an alkylnaphthyl group such as a methylnaphthyl group, and an ethylnaphtyl group, an alkoxynaphthyl group such as a methoxynaphthyl group, and an ethoxynaphthyl group, a dialkylnaphthyl group such as a dimethylnaphthyl group, and an diethylnaphtyl group, and an dialkoxynaphthyl group such as a dimethoxynaphthyl group, and a diethoxynaphthyl group. Examples of the aralkyl group include a benzyl group, a 1-phenylethyl group, and a 2-phenylethyl group. Examples of the aryloxoalkyl group include a 2-aryl-2-oxoethyl group such as a 2-phenyl-2-oxoethyl group, a 2-(1-naphthyl)-2-oxoethyl group, and a 2-(2-naphthyl)-2-oxoethyl group.

When any two or more of $R^1$, $R^2$, and $R^3$ may be bonded to form a ring together with the sulfur atom in the formula, examples of a group forming the ring structure include a divalent organic group such as 1,4-butylene and 3-oxa-1,5-pentylene. Further, examples of a substituent include an aryl group having a polymerizable substituent such as an acryloyloxy group and a methacryloyloxy group. Specific example thereof include a 4-acryloyloxyphenyl group, a 4-methacryloyloxyphenyl group, a 4-acryloyloxy-3,5-dimethylphenyl group, a 4-methacryloyloxy-3,5-dimethylphenyl group, a 4-vinyloxyphenyl group, and a 4-vinylphenyl group.

Specific examples of a sulfonium cation include triphenylsulfonium, 4-hydroxyphenyldiphenylsulfonium, bis(4-hydroxyphenyl)phenylsulfonium, tris(4-hydroxyphenyl)sulfonium, 4-tert-butoxyphenyldiphenylsulfonium, bis(4-tert-butoxyphenyl)phenylsulfonium, tris(4-tert-butoxyphenyl)sulfonium, 3-tert-butoxyphenyldiphenylsulfonium, bis(3-tert-butoxyphenyl)phenylsulfonium, tris(3-tert-butoxyphenyl)sulfonium, 3,4-di-tert-butoxyphenyldiphenylsulfonium, bis(3,4-di-tert-butoxyphenyl)phenylsulfonium, tris(3,4-di-tert-butoxyphenyl)sulfonium, diphenyl(4-thiophenoxyphenyl)sulfonium, 4-tert-butoxycarbonylmethyloxyphenyldiphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 2-naphthyldiphenylsulfonium, (4-hydroxy-3,5-dimethylphenyl)diphenylsulfonium, (4-n-hexyloxy-3,5-dimethylphenyl)diphenylsulfonium, dimethyl(2-naphthyl)sulfonium, 4-hydroxyphenyldimethylsulfonium, 4-methoxyphenyldimethylsulfonium, trimethylsulfonium, 2-oxocyclohexylcyclohexylmethylsulfonium, trinaphtylsulfonium, tribenzylsulfonium, diphenylmethylsulfonium, dimethylphenylsulfonium, 5-phenyldibenzothiophenium, 10-phenylphenoxathiinium, 2-oxo-2-phenylethylthiacyclopentanium, diphenyl-2-thienylsulfonium, 4-n-butoxynaphthyl-1-thiacyclopentanium, 2-n-butoxynaphthyl-1-thiacyclopentanium, 4-methoxynaphthyl-1-thiacyclopentanium, and 2-methoxynaphthyl-1-thiacyclopentanium.

Preferred examples thereof include triphenylsulfonium, 4-tert-butylphenyldiphenylsulfonium, 4-tert-butoxyphenyldiphenylsulfonium, tris(4-tert-butylphenyl)sulfonium, and 4-tert-butoxycarbonylmethyloxyphenyldiphenylsulfonium. Further, examples thereof include 4-methacryloyloxyphenyldiphenylsulfonium, 4-acryloyloxyphenyldiphenylsulfonium, 4-methacryloyloxyphenyldimethylsulfonium, 4-acryloyloxyphenyldimethylsulfonium, (4-methacryloyloxy-3,5-dimethylphenyl)diphenylsulfonium, and (4-acryloyloxy-3,5-dimethylphenyl)diphenylsulfonium. On the polymerizable sulfonium cation, Japanese Patent Laid-Open Publication Nos. 4-230645 and 2005-84365 can be used for reference. The polymerizable sulfonium salt can be used as a monomer which is a component of a polymer described below.

For example, the acid generator of the present invention may be a sulfonium salt represented by the following general formula (3):

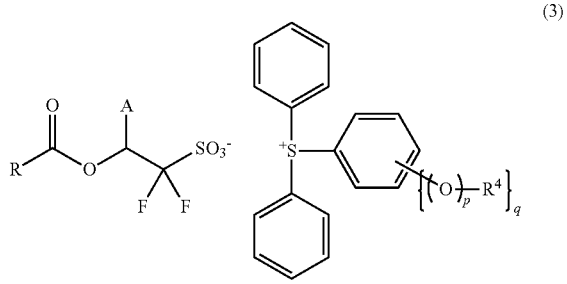

(3)

In the general formula (3), R and A represent the same meanings as before. The site of substitution of a $R^4$—$(O)_p$—group is not particularly limited, and the 4-position or 3-position of a phenyl group is preferable, and the 4-position is more preferable. $R^4$ represents a linear, a branched, or a cyclic alkyl group or alkenyl group, substituted or unsubstituted, having 1 to 20 carbon atoms, or a substituted or an unsubstituted aryl group having 6 to 14 carbon atoms. Specific examples of $R^4$ include a methyl group, an ethyl group, a n-propyl group, a sec-propyl group, a cyclopropyl group, a n-butyl group, a sec-butyl group, an isobutyl group, a tert-butyl group, a n-pentyl group, a cyclopentyl group, a n-hexyl group, a cyclohexyl group, a n-octyl group, a n-decyl group, a n-dodecyl group, a trifluoromethyl group, a phenyl group, a 4-methoxyphenyl group, and a 4-tert-butylphenyl group. In addition, when p represents 1, examples thereof include an acryloyl group, a methacryloyl group, a vinyl group, and an allyl group. p represents 0 or 1. q represents an integer of 1 to 5, preferably 1.

Specific examples of a sulfonium cation include 4-methylphenyldiphenylsulfonium, 4-ethylphenyldiphenylsulfonium, 4-tert-butylphenyldiphenylsulfonium, 4-cyclohexylphenyldiphenylsulfonium, 4-n-hexylphenyldiphenylsulfonium, 4-n-octylphenyldiphenylsulfonium, 4-methoxyphenyldiphenylsulfonium, 4-ethoxyphenyldiphenylsulfonium, 4-tert-butoxyphenyldiphenylsulfonium, 4-cyclohexyloxyphenyldiphenylsulfonium, 4-n-hexyloxyphenyldiphenylsulfonium, 4-n-octyloxyphenyldiphenylsulfonium, 4-dodecyloxyphenyldiphenylsulfonium, 4-trifluoromethylphenyldiphenylsulfonium, 4-trifluoromethyloxyphenyldiphenylsulfonium, 4-tert-butoxycarbonylmethyloxyphenyldiphenylsulfonium, 4-methacryloyloxyphenyldiphenylsulfonium, 4-acryloyloxyphenyldiphenylsulfonium, (4-n-hexyloxy-3,5-dimethylphenyl)diphenylsulfonium, (4-methacryloyloxy-3,5-dimethylphenyl)diphenylsulfonium, and (4-acryloyloxy-3,5-dimethylphenyl)diphenylsulfonium.

Herein, a method for synthesizing a sulfonium salt represented by the general formula (2) which is one of the acid generators of the present invention which generate an acid represented by the general formula (1) will be described.

A synthesizing method in which A represents a trifluoromethyl group will be first described as one example.

With reference to Japanese Patent Laid-Open Publication No. 2007-145804, a triphenylsulfonium salt of 1,1,3,3,3-pentafluoro-2-hydroxypropane sulfonic acid is prepared, and reacted with a carboxylic acid halide or a carboxylic acid anhydride to form an ester. At this time, when the carboxylic acid halide or carboxylic acid anhydride to be reacted has an oxirane ring or an oxetane ring, a skeleton corresponding to an anion part of photoacid generator of the present invention can be constructed. Alternatively, a skeleton of oxirane ring or oxetane ring may be introduced after an esterification reaction. For example, a carboxylic acid halide having an alkene moiety is reacted with an onium salt of 1,1,3,3,3-pentafluoro-2-hydroxypropane sulfonic acid to form an ester, and the alkene moiety is oxidized by the conventional method to introduce an oxirane ring skeleton. For example, m-chlorobenzoic acid can be used as an oxidizing agent.

The esterification reaction can be performed in accordance with the conventional method. For example, the preparation can be easily accomplished by reaction of a triphenylsulfonium salt of 1,1,3,3,3-pentafluoro-2-hydroxypropane sulfonic acid with a carboxylic acid halide under basic conditions.

In the above-described description, a triphenylsulfonium salt is used as a cation. With reference to Japanese Patent Laid-Open Publication No. 2007-145804, when a cation of an onium salt of 1,1,3,3,3-pentafluoro-2-hydroxypropane sulfonic acid is changed into a cation other than triphenylsulfonium and the same esterification reaction is then performed, the cation moiety of photoacid generator of the present invention can be easily changed into a cation other than triphenylsulfonium.

A method for synthesizing the sulfonium salt of the present invention represented by the general formula (2) wherein A represents a hydrogen atom will be then described as one example.

A sulfonium salt (acid generator) of the present invention represented by the general formula (2) wherein A represents a hydrogen atom can be synthesized in the same manner as in the case where A represents a trifluoromethyl group except that a sulfonium salt having 1,1-difluoro-2-hydroxyethanesulfonate is used instead of a sulfonium salt having 1,1,3,3,3-pentafluoro-2-hydroxypropanesulfonate.

Further, the sulfonium salt having 1,1-difluoro-2-hydroxyethanesulfonate can be synthesized with reference to Japanese Patent Laid-Open Publication No. 2011-013479.

A method for synthesizing the acid generator of the present invention which generates an sulfonic acid represented by the general formula (1) is as defined above, but is one of the methods. The present invention is not limited to the method.

[Chemically Amplified Resist Composition]

The present invention provides a chemically amplified resist composition. The acid generator of the present invention (which generates a sulfonic acid represented by the general formula (1) in response to high energy irradiation or heat) is used for the chemically amplified resist composition of the present invention.

The chemically amplified resist composition of present invention is characterized by containing a base resin, an acid generator, a quencher, and an organic solvent, wherein the acid generator is the acid generator of the present invention.

In the chemically amplified resist composition of the present invention, the acid generator of the present invention is as described above. The amount of the acid generator to be blended is preferably 0.1 to 80 parts by mass, particularly preferably 1 to 40 parts by mass, relative to 100 parts by mass of base resin. When the amount falls within the above-described range, the resolution is improved, and a problem of foreign material upon development and resist film peeling is not caused.

The acid generator of the present invention may be used alone or as a mixture of two or more kinds of them.

The chemically amplified resist composition of the present invention may contain an acid generator other than the acid generator according to the present invention. The acid generator other than the acid generator according to the present invention (other acid generator) may be a compound generating an acid under high energy irradiation or heat. A suitable photoacid generator includes sulfonium salt, iodonium salt, sulfonyldiazomethane, N-sulfonyloxyimide, and oxime-O-sulfonate acid generators.

The amount of the other acid generator to be added in the chemically amplified resist composition of the present invention is preferably 0.1 to 80 parts by mass, particularly preferably 0.1 to 40 parts by mass, relative to 100 parts by mass of base resin in the resist composition. When the ratio of the other photoacid generator falls within the above-described range, the resolution is improved, and a problem of foreign material upon development and resist film peeling is not caused.

The other photoacid generators may be used alone or as a mixture of two or more kinds of them. Further, the transmittance of the applied resist film can be controlled by using a photoacid generator having a low transmittance at the exposure wavelength and adjusting the amount of the photoacid generator to be added.

The base resin is preferably a polymer containing a repeating unit having an acid labile group represented by the following general formula (4) and a repeating unit represented by the following general formula (5),

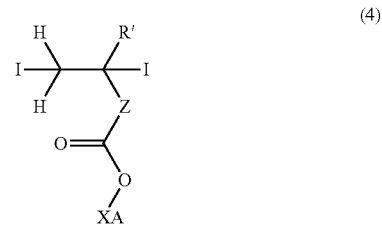

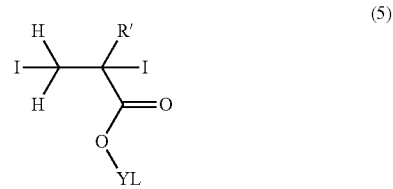

wherein R' represents any of a hydrogen atom, a fluorine atom, a methyl group, and a trifluoromethyl group; Z represents any of a single bond, a phenylene group, a naphthylene group, and (main chain)-C(=O)—O—Z'—; Z' represents a linear, a branched, or a cyclic alkylene group having 1 to 10 carbon atoms, optionally containing any of a hydroxy group, an ether bond, an ester bond, and a lactone ring, a phenylene group, or a naphthylene group; XA represents an acid labile group; and YL represents a hydrogen atom or a polar group having one or more structures selected from a hydroxy group, a cyano group, a carbonyl group, a carboxyl group, an ether bond, an ester bond, a sulfonate ester bond, a carbonate bond, a lactone ring, a sultone ring, and a carboxylic acid anhydride.

Structures in which Z in the general formula (4) is changed may be specifically exemplified as follows.

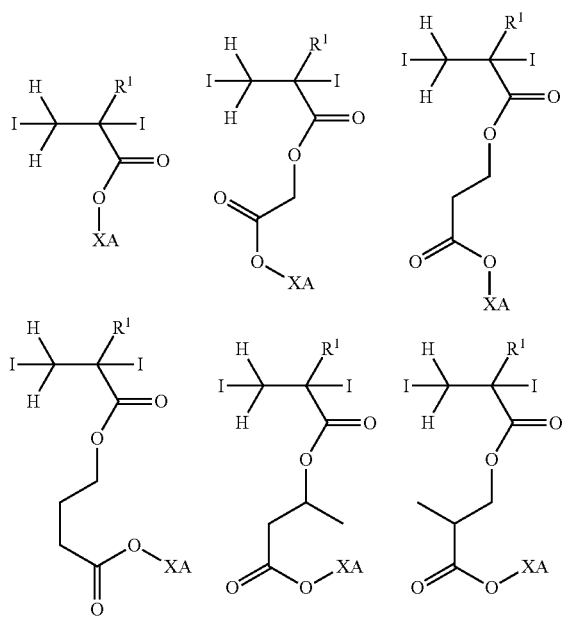

-continued

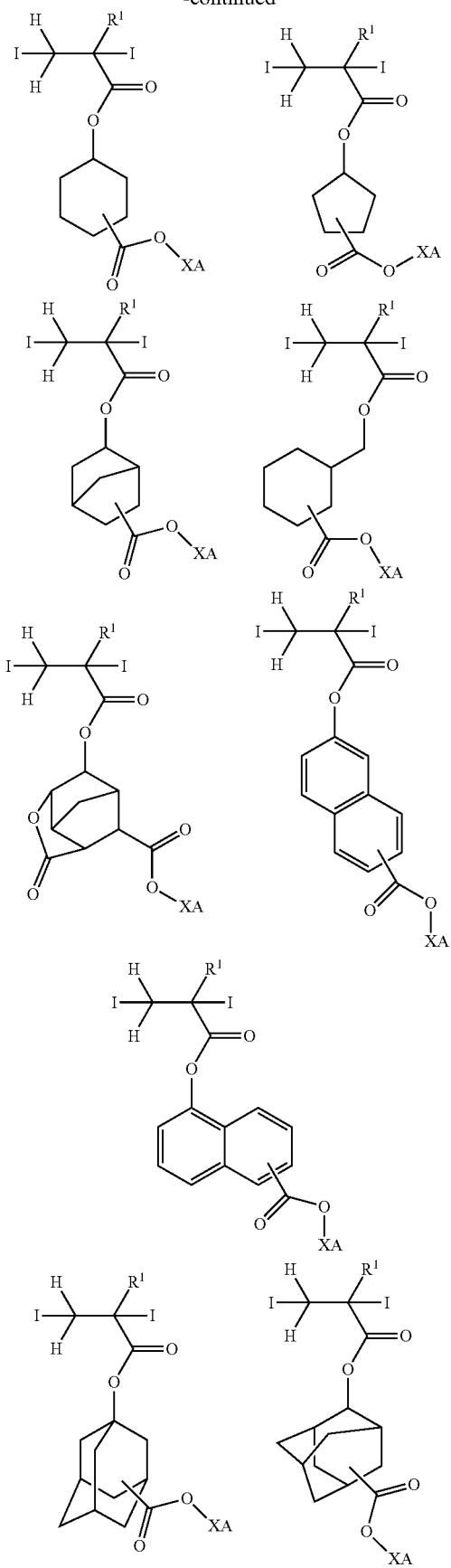
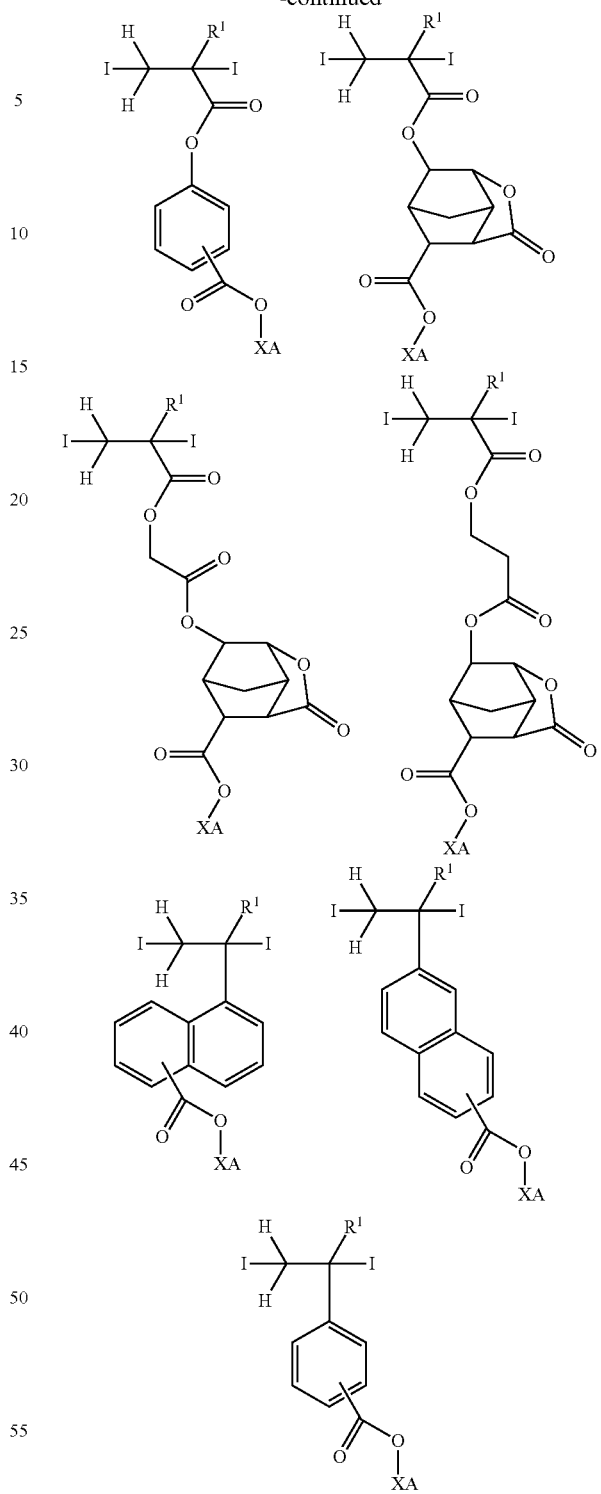

Under the action of acid, a polymer containing a repeating unit repeated by the general formula (4) is decomposed to produce a carboxylic acid, turning to be an alkali soluble polymer. As the acid labile group XA, various groups may be used. Specific examples of the acid labile group include groups represented by the following general formulae (L1) to (L4), a tertiary alkyl group having 4 to 20 carbon atoms, preferably 4 to 15 carbon atoms, a trialkylsilyl group in which each alkyl moiety has 1 to 6 carbon atoms, and an oxoalkyl group having 4 to 20 carbon atoms.

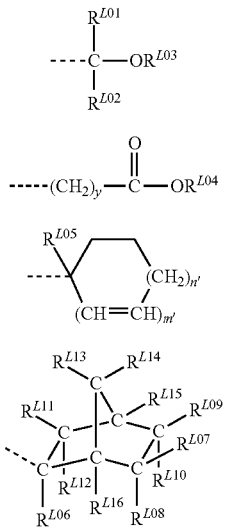

(L1)

(L2)

(L3)

(L4)

In the formula, the broken line represents an atomic bonding (hereinafter as the same).

In the formula (L1), $R^{L01}$ and $R^{L02}$ represent a hydrogen atom or a linear, a branched, a cyclic alkyl group having 1 to 18 carbon atoms, preferably 1 to 10 carbon atoms, and examples thereof include a methyl group, an ethyl group, a propyl group, an isopropyl group, a n-butyl group, a sec-butyl group, a tert-butyl group, a cyclopentyl group, a cyclohexyl group, a 2-ethylhexyl group, a n-octyl group, a norbornyl group, a tricyclodecanyl group, a tetracyclododecanyl group, and an adamantyl group. $R^{L03}$ represents a monovalent hydrocarbon group having 1 to 18 carbon atoms, preferably 1 to 10 carbon atoms, optionally containing a heteroatom such as an oxygen atom. Examples thereof include a linear, a branched, or a cyclic alkyl group, and substituted forms of the alkyl group in which some hydrogen atoms are substituted by a hydroxy group, an alkoxy group, an oxo group, an amino group, or an alkylamino group. Specific examples of the linear, branched, or cyclic alkyl group include a methyl group, an ethyl group, a propyl group, an isopropyl group, a n-butyl group, a sec-butyl group, a tert-butyl group, a cyclopentyl group, a cyclohexyl group, a 2-ethylhexyl group, a n-octyl group, a norbornyl group, a tricyclodecanyl group, a tetracyclododecanyl group, and an adamantyl group. Specific examples of substituted alkyl groups include as follows.

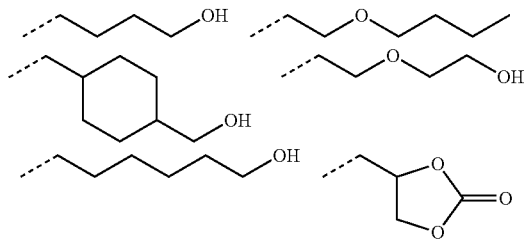

A pair of $R^{L01}$ and $R^{L02}$, $R^{L01}$ and $R^{L03}$, or $R^{L02}$ and $R^{L03}$ may be bonded with each other to form a ring together with the carbon atom and the oxygen atom to which they are attached. When they form a ring, each group forming the ring of $R^{L01}$, $R^{L02}$, and $R^{L03}$ is a linear or a branched alkylene group having 1 to 18 carbon atoms, preferably 1 to 10 carbon atoms.

In the formula (L2), $R^{L04}$ represents a tertiary alkyl group having 4 to 20 carbon atoms, preferably 4 to 15 carbon atoms, a trialkylsilyl group in which each alkyl group has 1 to 6 carbon atoms, an oxoalkyl group having 4 to 20 carbon atoms, or a group represented by the general formula (L1). Specific examples of the tertiary alkyl group include a tert-butyl group, a tert-amyl group, a 1,1-diethylpropyl group, a 2-cyclopentylpropan-2-yl group, a 2-cyclohexylpropan-2-yl group, a 2-(bicyclo[2.2.1]heptan-2-yl)propan-2-yl group, a 2-(adamantan-1-yl)propan-2-yl group, a 1-ethylcyclopentyl group, a 1-butylcyclopentyl group, a 1-ethylcyclohexyl group, a 1-butylcyclohexyl group, a 1-ethyl-2-cyclopentenyl group, a 1-ethyl-2-cyclohexenyl group, a 2-methyl-2-adamantyl group, and a 2-ethyl-2-adamantyl group. Specific examples of the trialkylsilyl group include a trimethylsilyl group, a triethylsilyl group, and a dimethyl-tert-butylsilyl group. Specific examples of the oxoalkyl group include a 3-oxocyclohexyl group, a 4-methyl-2-oxooxan-4-yl group, and a 5-methyl-2-oxooxolan-5-yl group. y represents an integer of 0 to 6.

In the formula (L3), $R^{L05}$ represents a linear, a branched, or a cyclic alkyl group having 1 to 8 carbon atoms optionally substituted or an aryl group having 6 to 20 carbon atoms optionally substituted. Specific examples of an alkyl group optionally substituted include a linear, a branched, or a cyclic alkyl group such as a methyl group, an ethyl group, a propyl group, an isopropyl group, a n-butyl group, a sec-butyl group, a tert-butyl group, a tert-amyl group, a n-pentyl group, a n-hexyl group, a cyclopentyl group, and a cyclohexyl group, and substituted forms of the alkyl group in which some hydrogen atoms are substituted by a hydroxy group, an alkoxy group, a carboxy group, an alkoxycarbonyl group, an oxo group, an amino group, an alkylamino group, a cyano group, a mercapto group, an alkylthio group, or a sulfo group. Specific examples of an aryl group optionally substituted include a phenyl group, a methylphenyl group, a naphthyl group, an anthryl group, a phenanthryl group, and a pyrenyl group. m' is 0 or 1, and n' is one of 0, 1, 2, and 3, wherein is 2 or 3.

In the formula (L4), $R^{L06}$ represents a linear, a branched, or a cyclic alkyl group having 1 to 8 carbon atoms optionally substituted or an aryl group having 6 to 20 carbon atoms optionally substituted, and may be specifically the same as those exemplified for $R^{L05}$. Each of $R^{L07}$ to $R^{L16}$ independently represents a hydrogen atom or a monovalent hydrocarbon group having 1 to 15 carbon atoms, and specific examples thereof include a linear, a branched, or a cyclic alkyl group such as a methyl group, an ethyl group, a propyl group, an isopropyl group, a n-butyl group, a sec-butyl group, a tert-butyl group, a tert-amyl group, a n-pentyl group, a n-hexyl group, a n-octyl group, a n-nonyl group, a n-decyl group, a cyclopentyl group, a cyclohexyl group, a cyclopentylmethyl group, a cyclopentylethyl group, a cyclopentylbutyl group, a cyclohexylmethyl group, a cyclohexylethyl group, and a cyclohexylbutyl group, and substituted forms of the alkyl group in which some hydrogen atoms are substituted by a hydroxy group, an alkoxy group, a carboxy group, an alkoxycarbonyl group, an oxo group, an amino group, an alkylamino group, a cyano group, a mercapto group, an alkylthio group, or a sulfo group. Two of $R^{L07}$ to $R^{L16}$ may be bonded with each other to form a ring together with the carbon atom to which they are attached (e.g., $R^{L07}$ and $R^{L08}$, $R^{L07}$ and $R^{L09}$, $R^{L07}$ and $R^{L10}$, $R^{L08}$ and $R^{L10}$, $R^{L09}$ and $R^{L10}$, $R^{L11}$ and $R^{L12}$, and $R^{L13}$ and $R^{L14}$). In this case, groups involved in the bond represent divalent hydrocarbon groups having 1 to 15 carbon atom, specifically groups obtained by eliminating one hydrogen atom from those exemplified for the monovalent hydrocarbon groups. Further, $R^{L07}$ to $R^{L16}$ may form a double bond by a direct bond between groups connected to adjacent carbons (e.g., $R^{L07}$ and $R^{L09}$, $R^{L09}$ and $R^{L15}$, $R^{L13}$ and $R^{L15}$, and $R^{L14}$ and $R^{L15}$).

Of the acid labile group represented by the formula (L1), a linear or a branched group is specifically as follows.

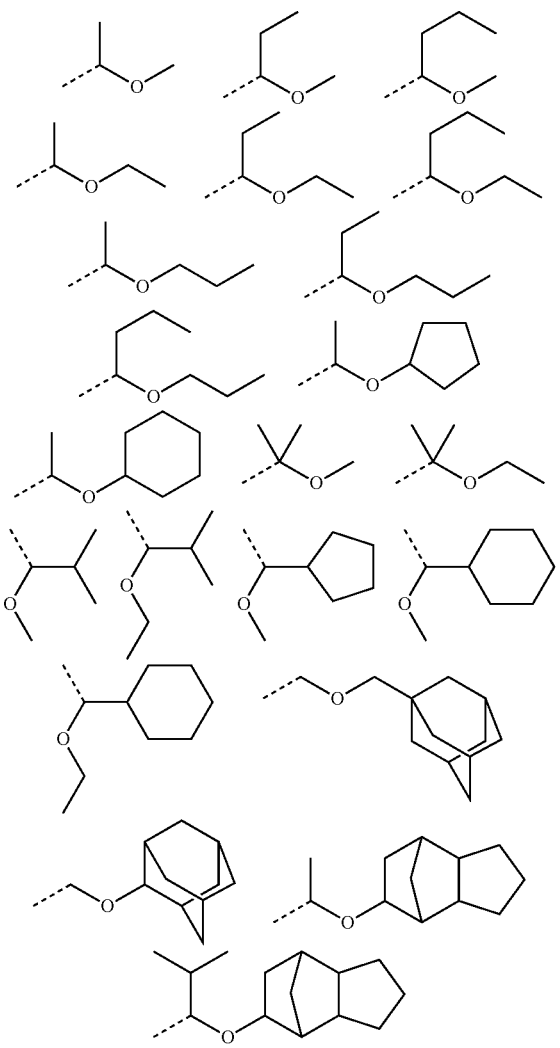

Specific examples of cyclic groups among the acid labile groups represented by the formula (L1) may include a tetrahydrofuran-2-yl group, a 2-methyltetrahydrofuran-2-yl group, a tetrahydropyran-2-yl group, and a 2-methyltetrahydropyran-2-yl group.

Specific examples of the acid labile group of the formula (L2) include a tert-butoxycarbonyl group, a tert-butoxycarbonylmethyl group, a tert-amyloxycarbonyl group, a tert-amyloxycarbonylmethyl group, a 1,1-diethylpropyloxycarbonyl group, a 1,1-diethylpropyloxycarbonylmethyl group, a 1-ethylcyclopentyloxycarbonyl group, a 1-ethylcyclopentyloxycarbonylmethyl group, a 1-ethyl-2-cyclopentenyloxycarbonyl group, a 1-ethyl-2-cyclopentenyloxycarbonylmethyl group, a 1-ethoxyethoxycarbonylmethyl group, a 2-tetrahydropyranyloxycarbonylmethyl group, and a 2-tetrahydrofuranyloxycarbonylmethyl group.

Specific examples of the acid labile group of the formula (L3) include a 1-methylcyclopentyl group, a 1-ethylcyclopentyl group, a 1-n-propylcyclopentyl group, a 1-isopropylcyclopentyl group, a 1-n-butylcyclopentyl group, a 1-sec-butylcyclopentyl group, a 1-cyclohexylcyclopentyl group, a 1-(4-methoxy-n-butyl)cyclopentyl group, a 1-methylcyclohexyl group, a 1-ethylcyclohexyl group, a 3-methyl-1-cyclopenten-3-yl group, a 3-ethyl-1-cyclopenten-3-yl group, a 3-methyl-1-cyclohexen-3-yl group, and a 3-ethyl-1-cyclohexen-3-yl group.

The acid labile group of the formula (L4) is particularly preferably groups represented by the following formulae (L4-1) to (L4-4):

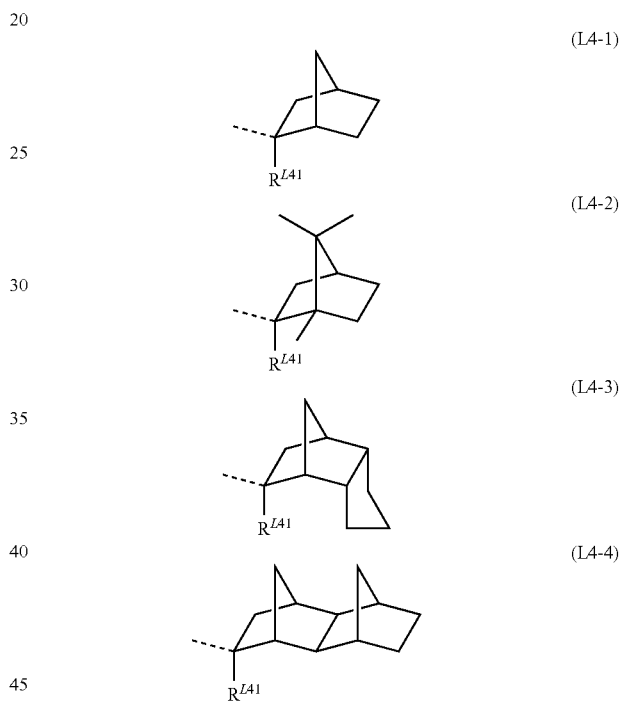

In the general formulae (L4-1) to (L4-4), the broken line represents a bonding site and direction, and $R^{L41}$ independently represents a monovalent hydrocarbon group such as a linear, a branched, or a cyclic alkyl group having 1 to 10 carbon atoms. Specific examples thereof include a methyl group, an ethyl group, a propyl group, an isopropyl group, a n-butyl group, a sec-butyl group, a tert-butyl group, a tert-amyl group, a n-pentyl group, a n-hexyl group, a cyclopentyl group, and a cyclohexyl group.

In the general formulae (L4-1) to (L4-4), an enantiomer or a diastereomer may exist, but each of the general formulae (L4-1) to (L4-4) represents all the stereoisomers thereof. The stereoisomers may be used alone or as a mixture.

For example, the general formula (L4-3) represents one or two mixtures selected from the groups represented by the following general formulae (L4-3-1) and (L4-3-2):

(L4-3-1)

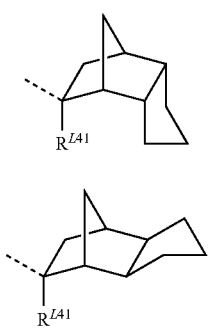

(L4-3-2)

Further, the general formula (L4-4) represents one or more mixtures selected from the groups represented by the following general formulae (L4-4-1) to (L4-4-4):

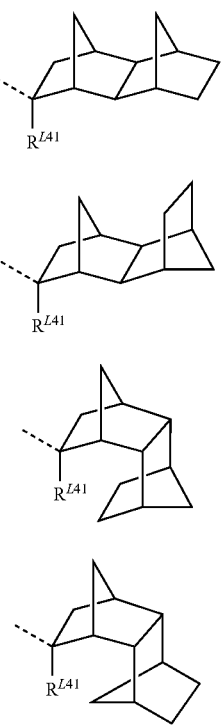

(L4-4-1)

(L4-4-2)

(L4-4-3)

(L4-4-4)

The general formulae (L4-1) to (L4-4), (L4-3-1), (L4-3-2), and (L4-4-1) to (L4-4-4) represent enantiomers thereof and enantiomeric mixtures.

It is noted that in the formulae (L4-1) to (L4-4), (L4-3-1), (L4-3-2), and (L4-4-1) to (L4-4-4), the bond direction is on the exo side relative to the bicyclo[2.2.1]heptane ring, which ensures high reactivity for an acid catalyzed elimination reaction (see Japanese Patent Laid-Open Publication No. 2000-336121). In preparation of these monomers having a tertiary exo-alkyl group of bicyclo[2.2.1]heptane skeleton as a substituent, monomers substituted by an endo-alkyl group represented by the following general formulae (L4-1-endo) to (L4-4-endo) may exist. For good reactivity, an exo proportion is preferably 50% by mole or more, more preferably 80% by mole or more.

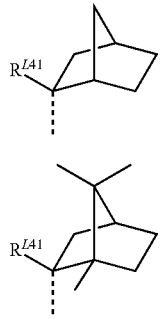

(L4-1-endo)

(L4-2-endo)

(L4-3-endo)

(L4-4-endo)

Specific examples of the acid labile group of the formula (L4) include the following groups,

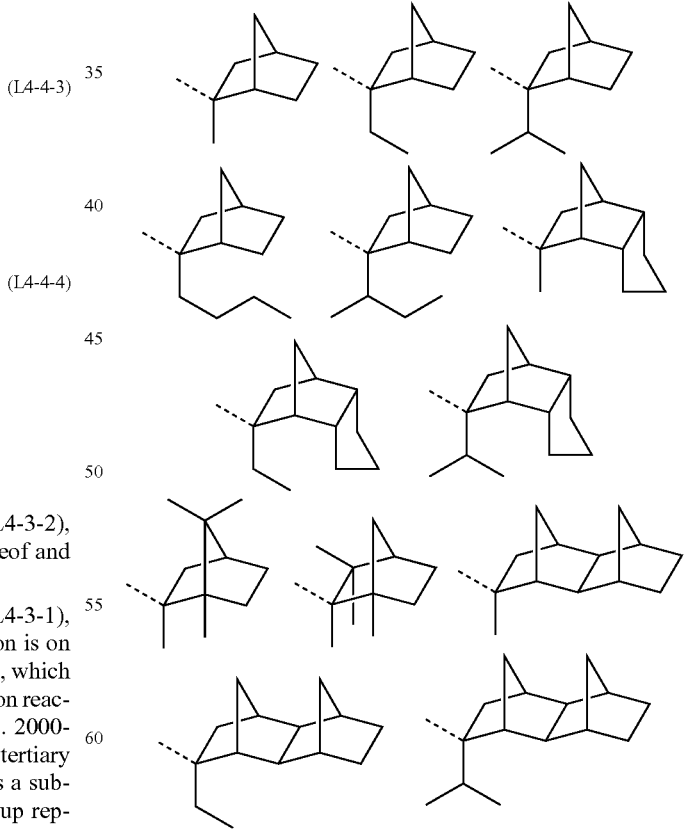

A tertiary alkyl group having 4 to 20 carbon atoms, a trialkylsilyl group in which each alkyl group has 1 to 6 carbon atoms, and an oxoalkyl group having 4 to 20 carbon atoms may be specifically the same groups as those exemplified for $R^{LO4}$.
The repeating unit represented by the general formula (4) may be specifically, but not limited to, as follows.
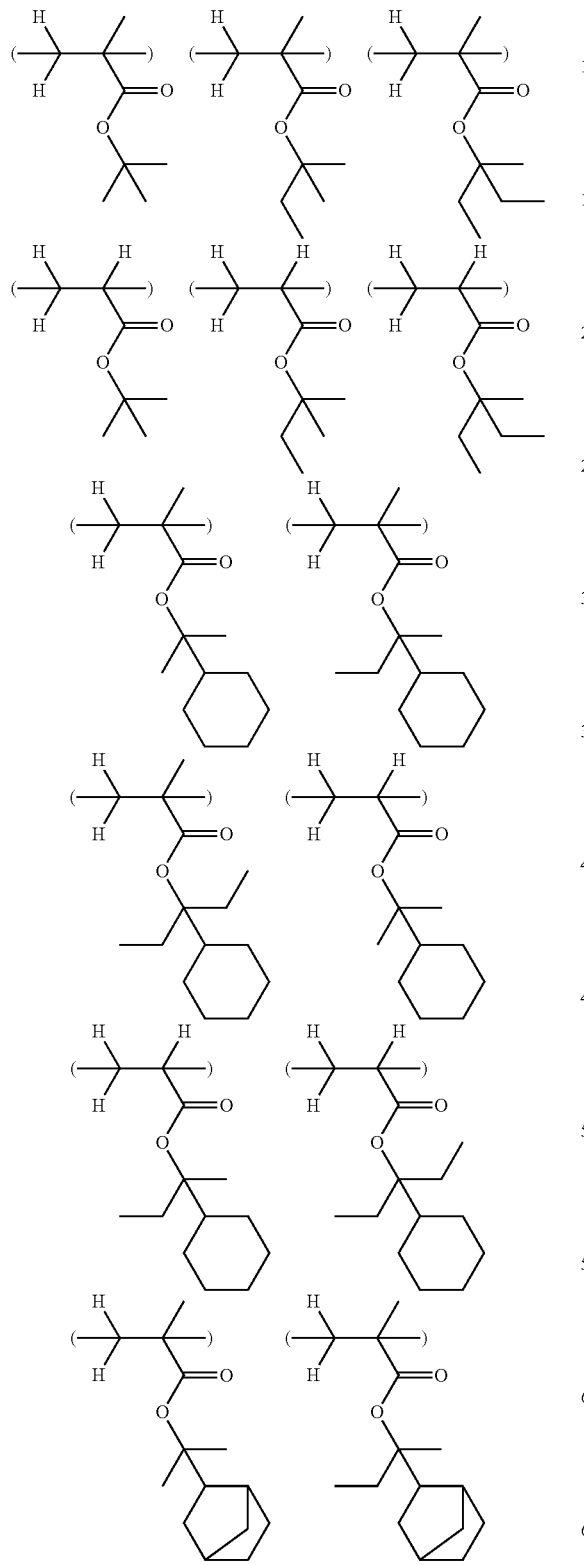
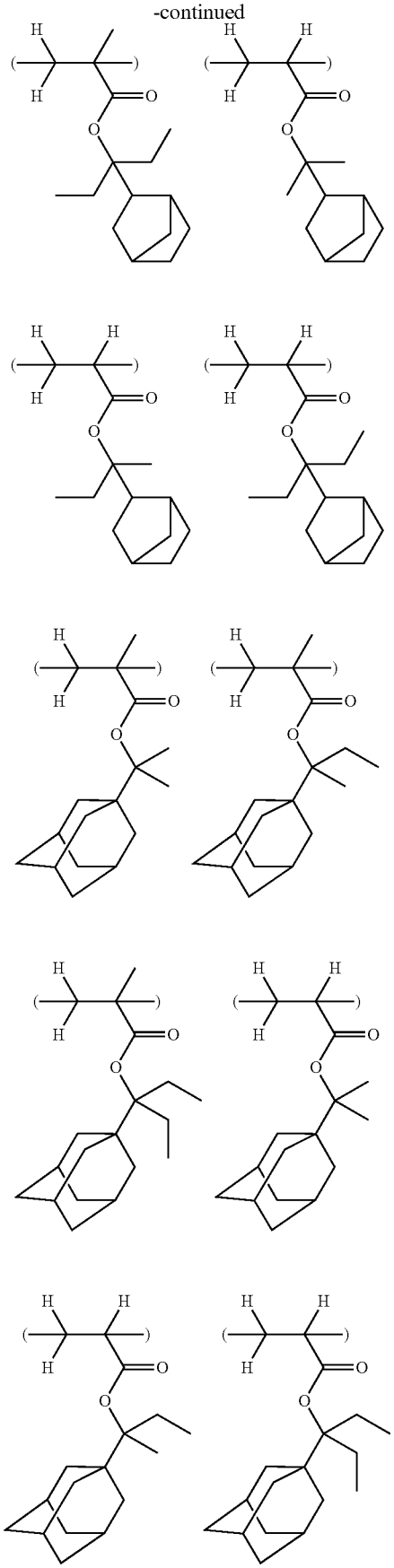

-continued
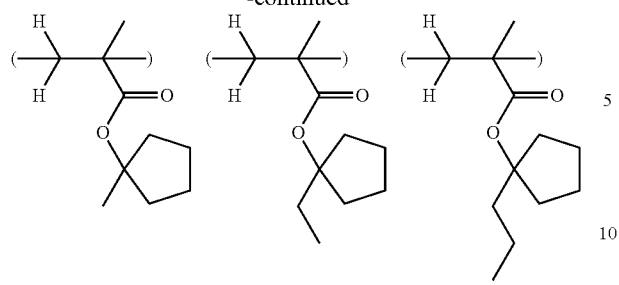
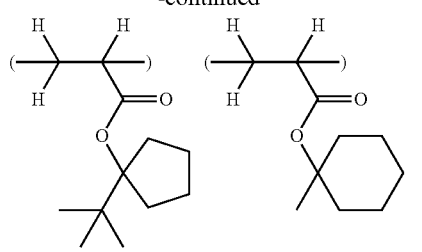
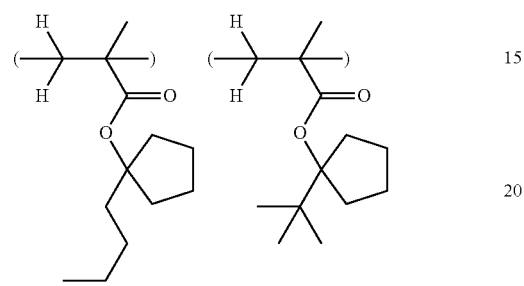
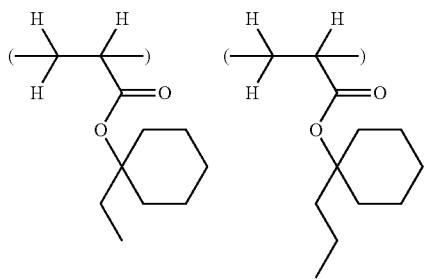
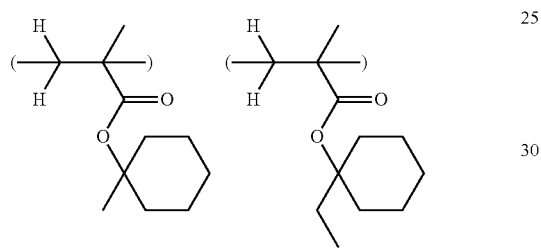
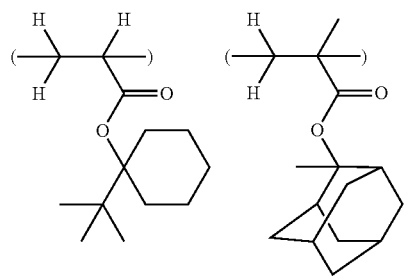
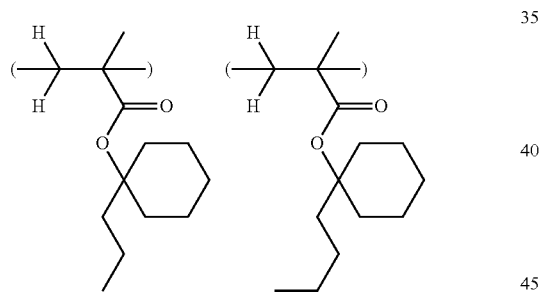
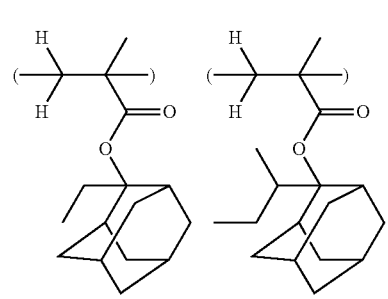
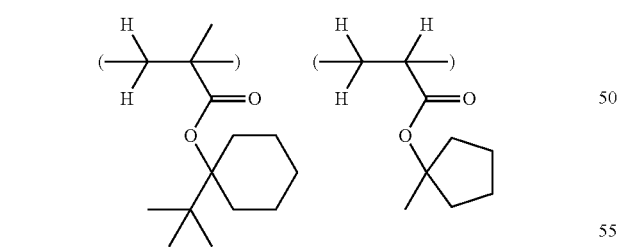
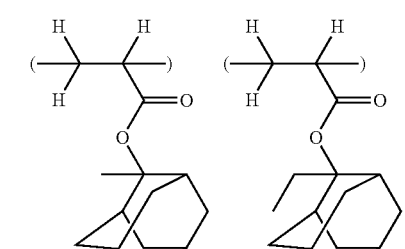
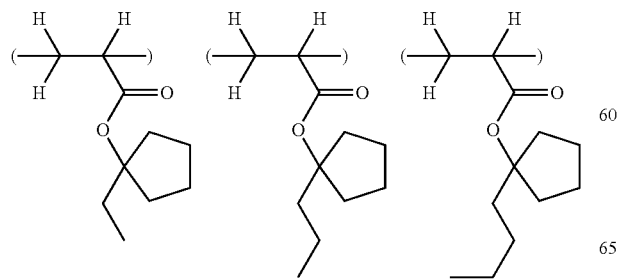
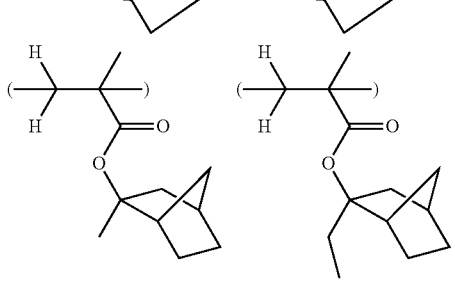

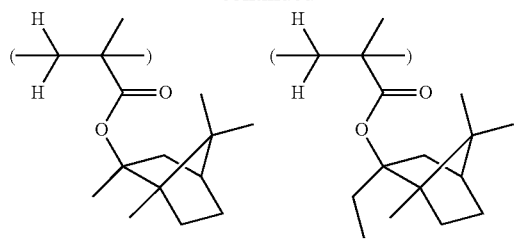
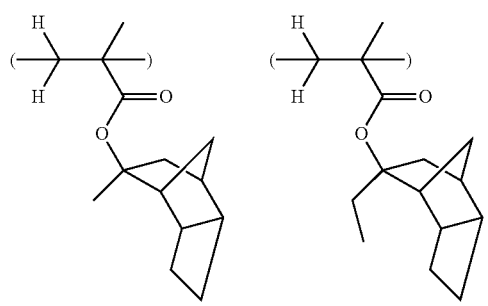
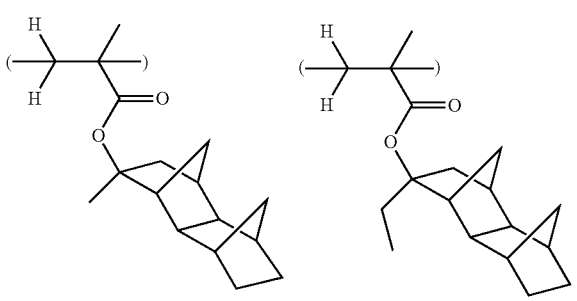
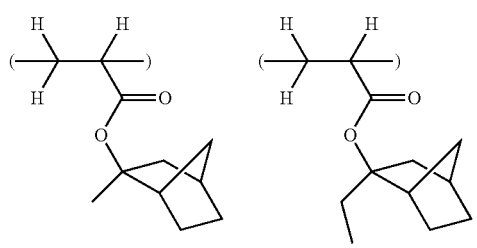
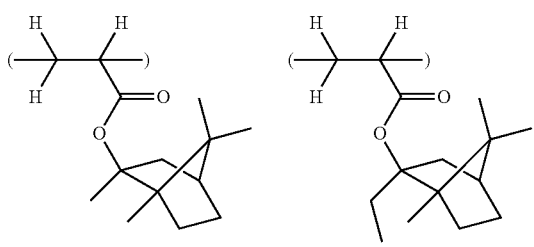
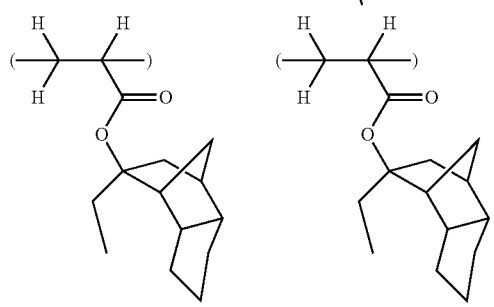
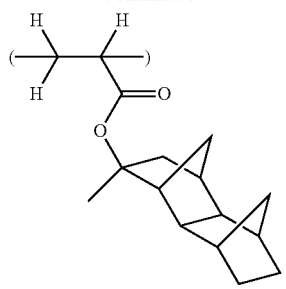
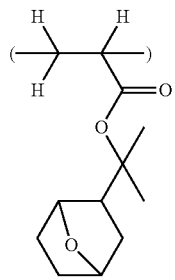
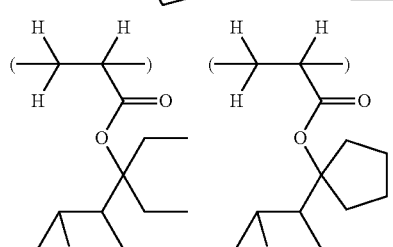
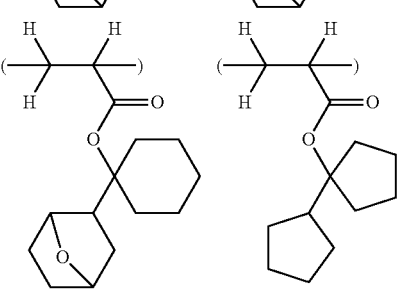
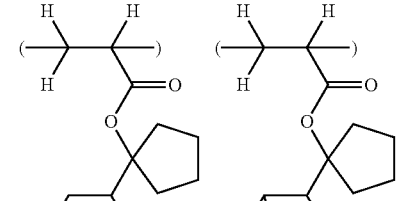
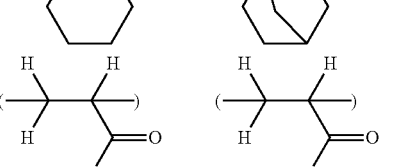
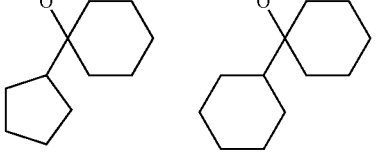

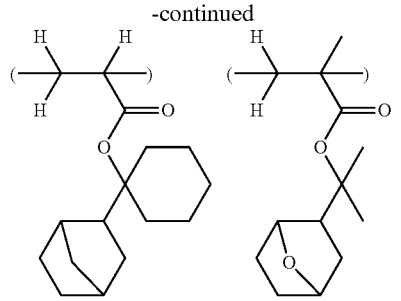
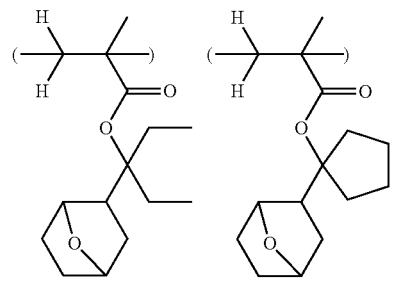
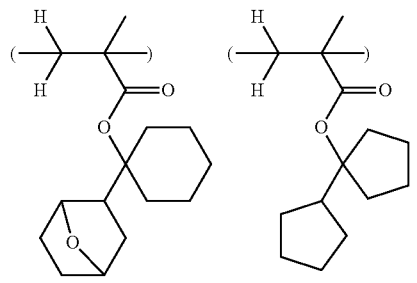
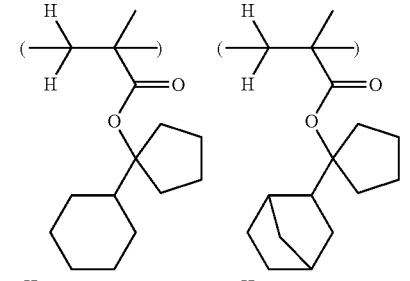
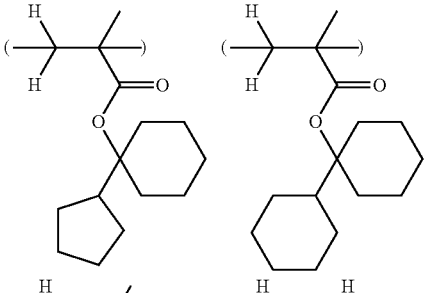
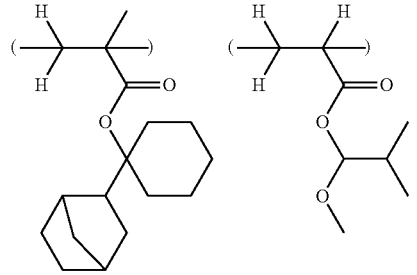
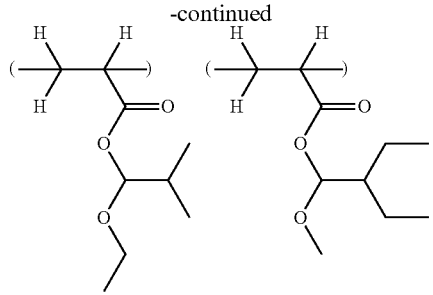
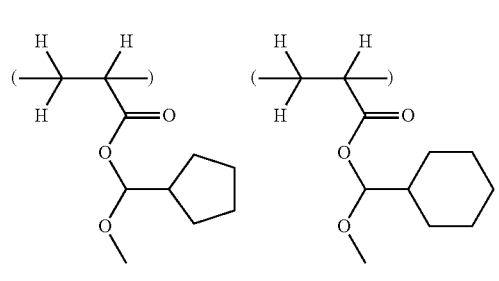
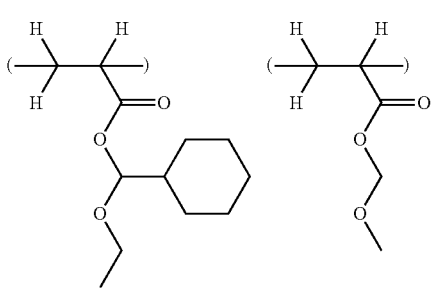
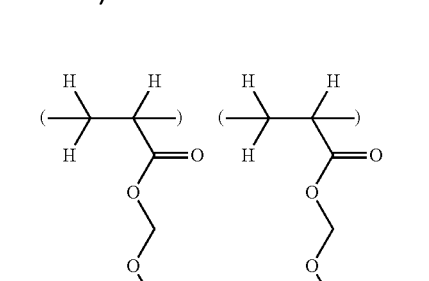
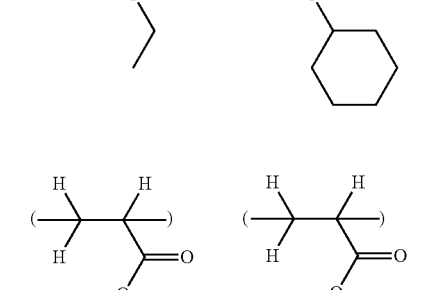
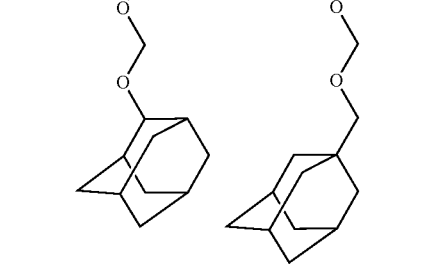

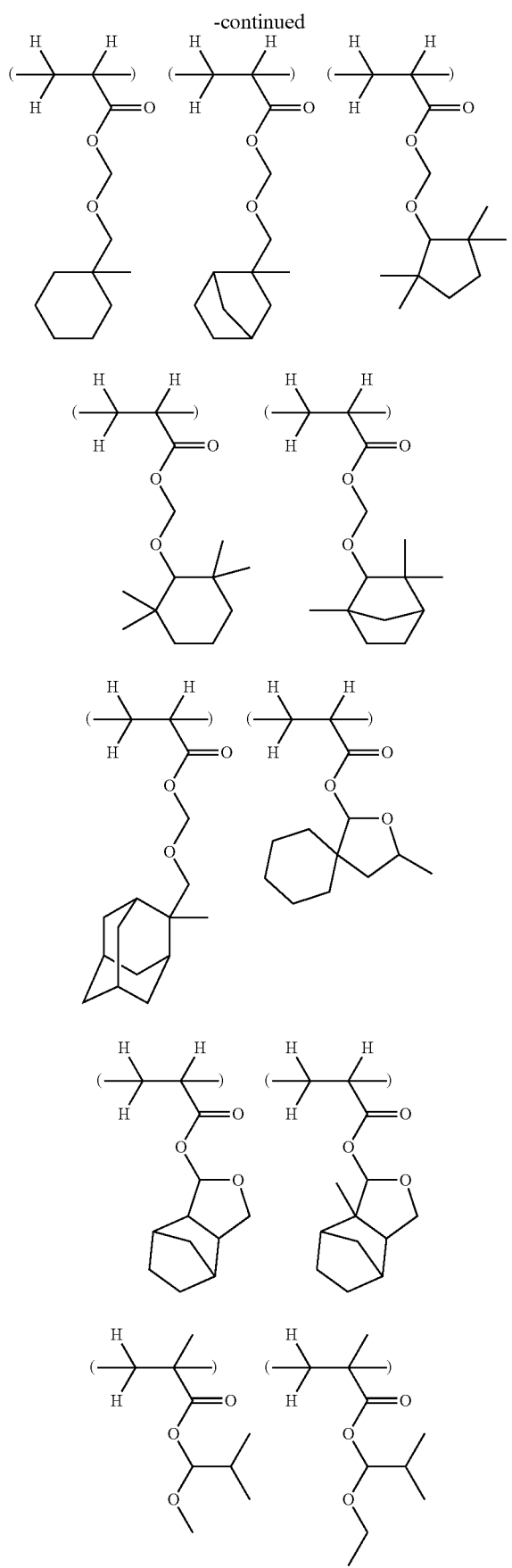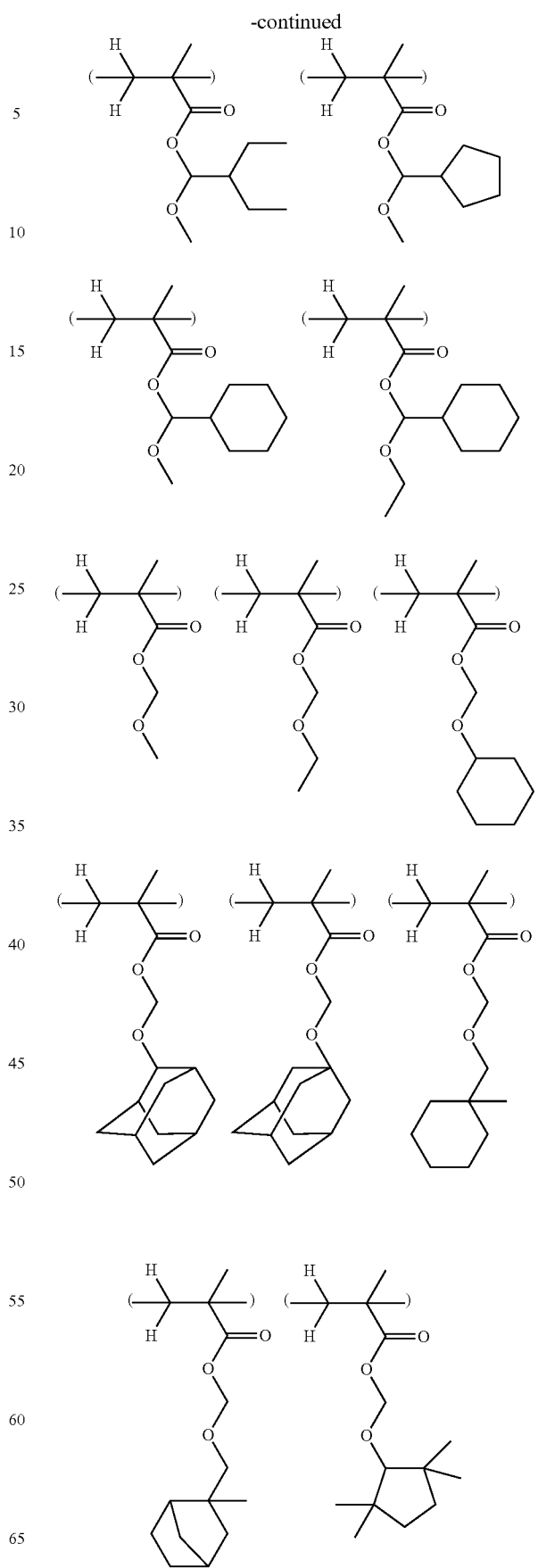

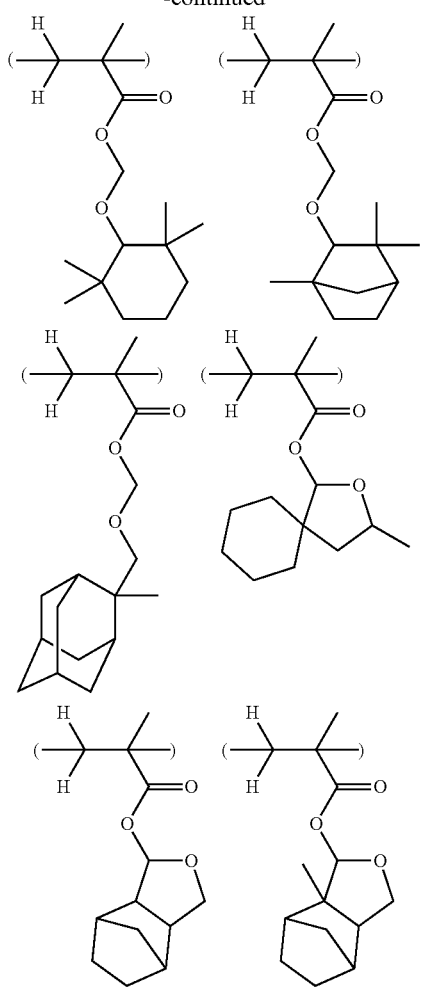
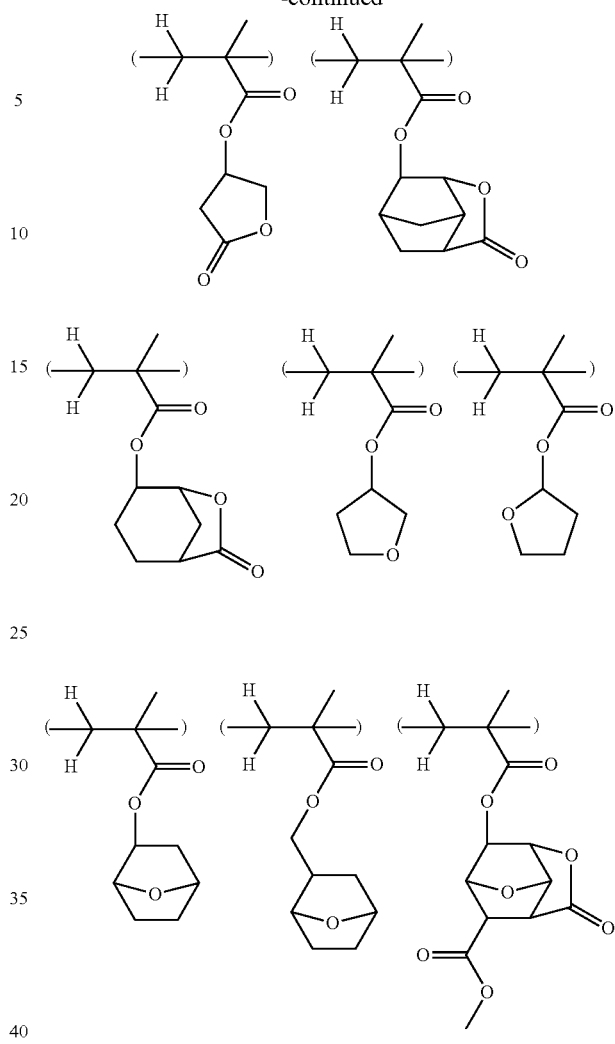

In the specific examples, Z represents a single bond. However, even when Z is not a single bond, the same acid labile group may be combined. Specific examples when Z is not a single bond may be as described above.

In the general formula (5), YL represents a polar group having one or more structures selected from a hydroxy group, a cyano group, a carbonyl group, an ether bond, an ester bond, a sulfonate ester bond, a carbonate bond, a lactone ring, a sultone ring, and a carboxylic acid anhydride. Specific examples thereof may be, but not limited to, as follows.

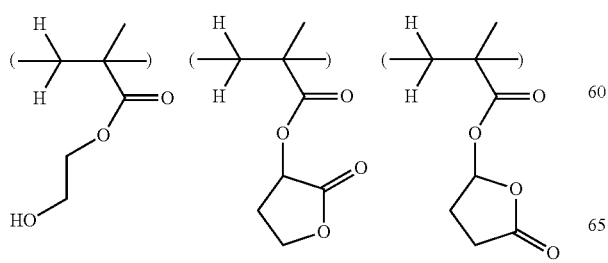
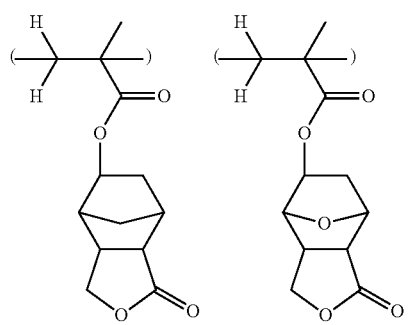
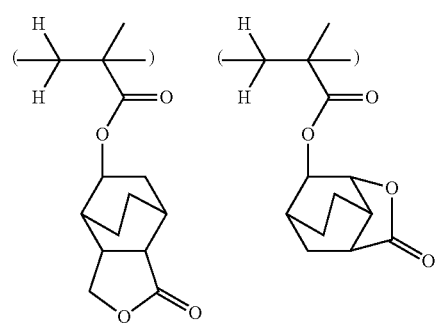

-continued
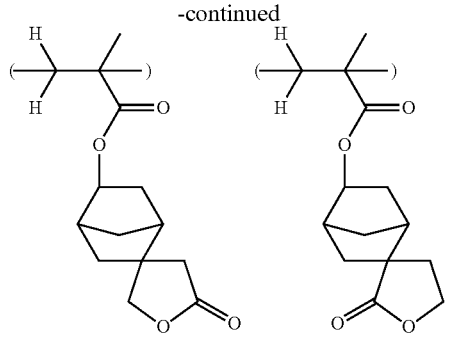
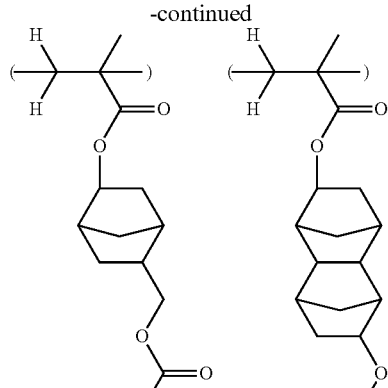
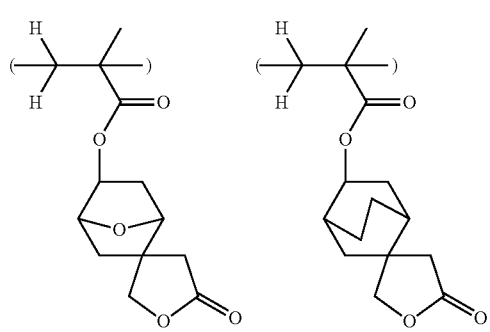
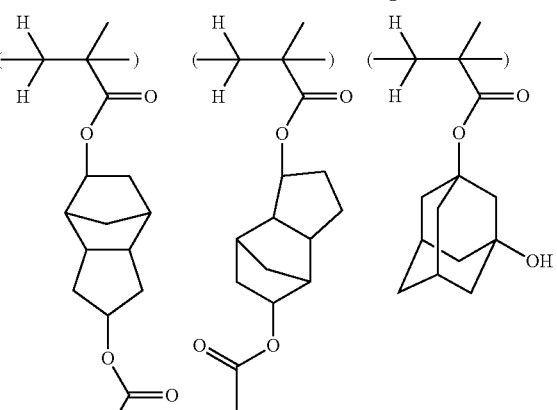
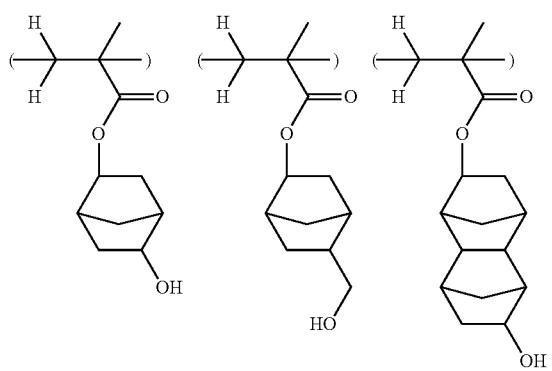
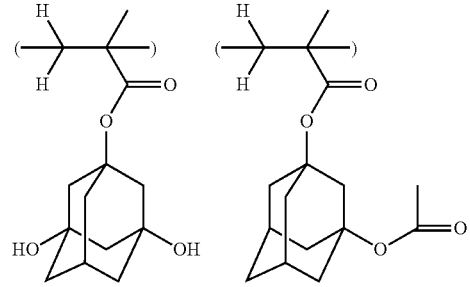
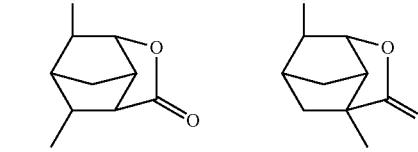
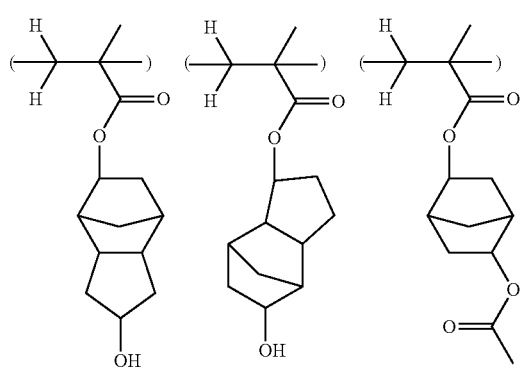
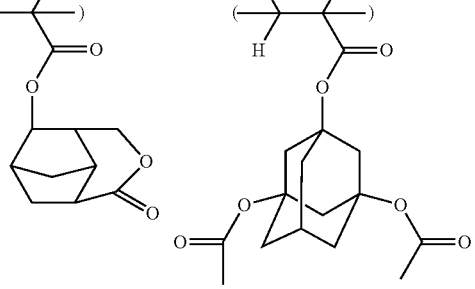

-continued
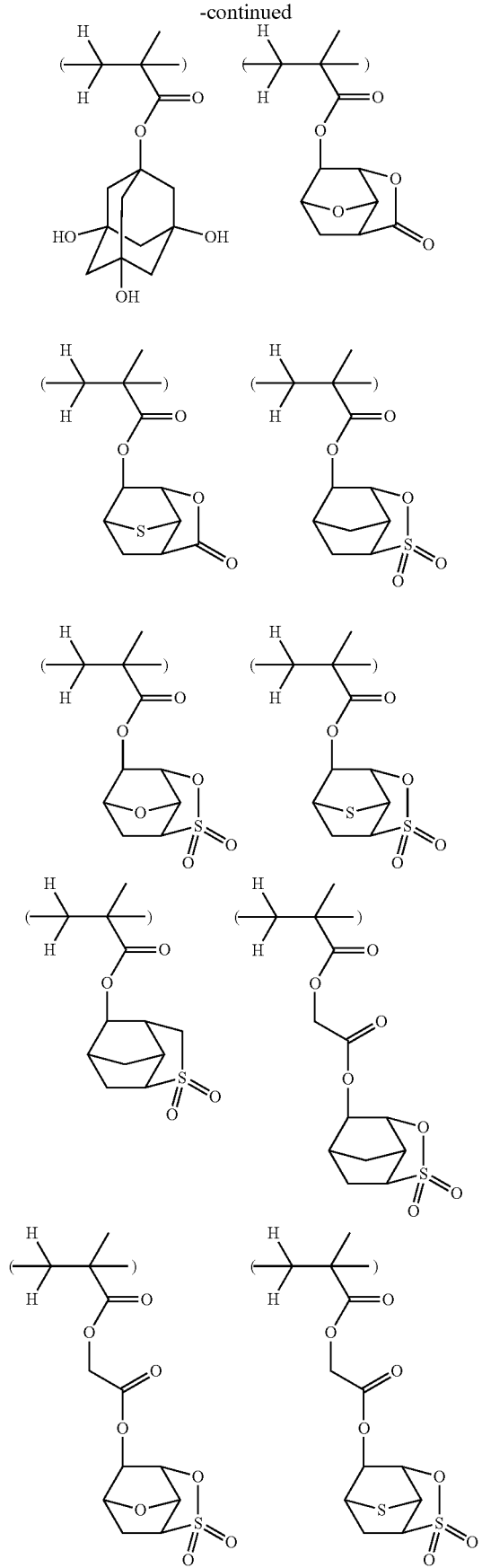
-continued
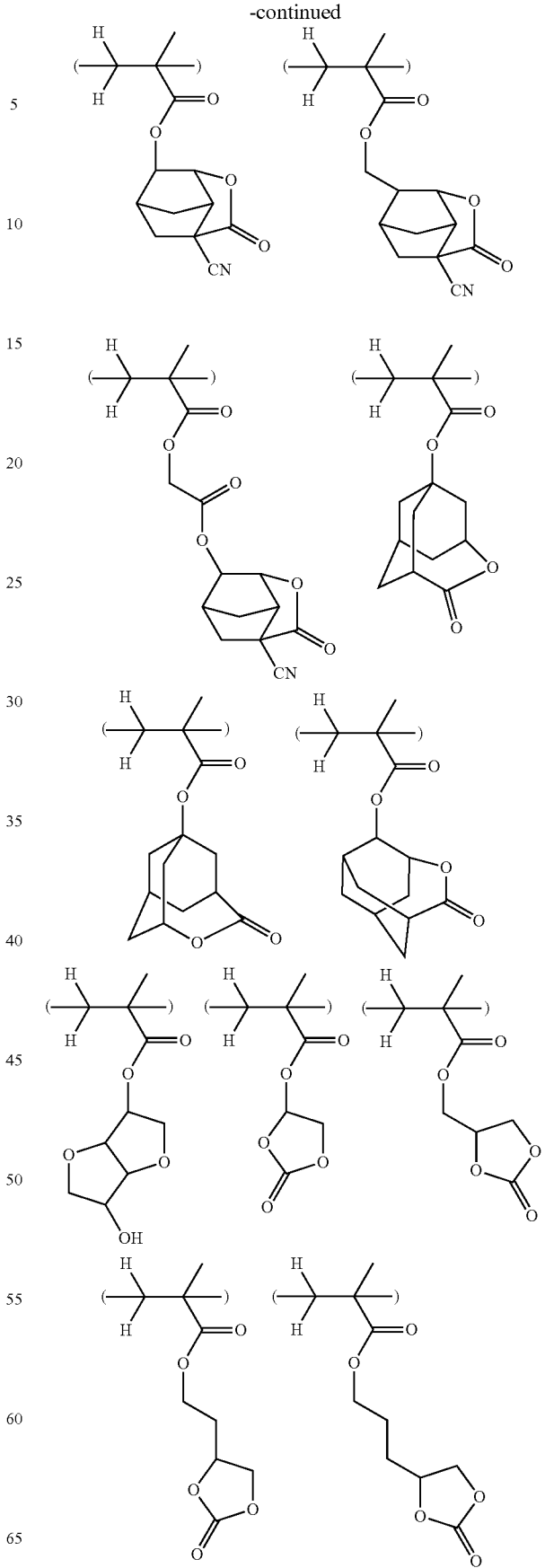

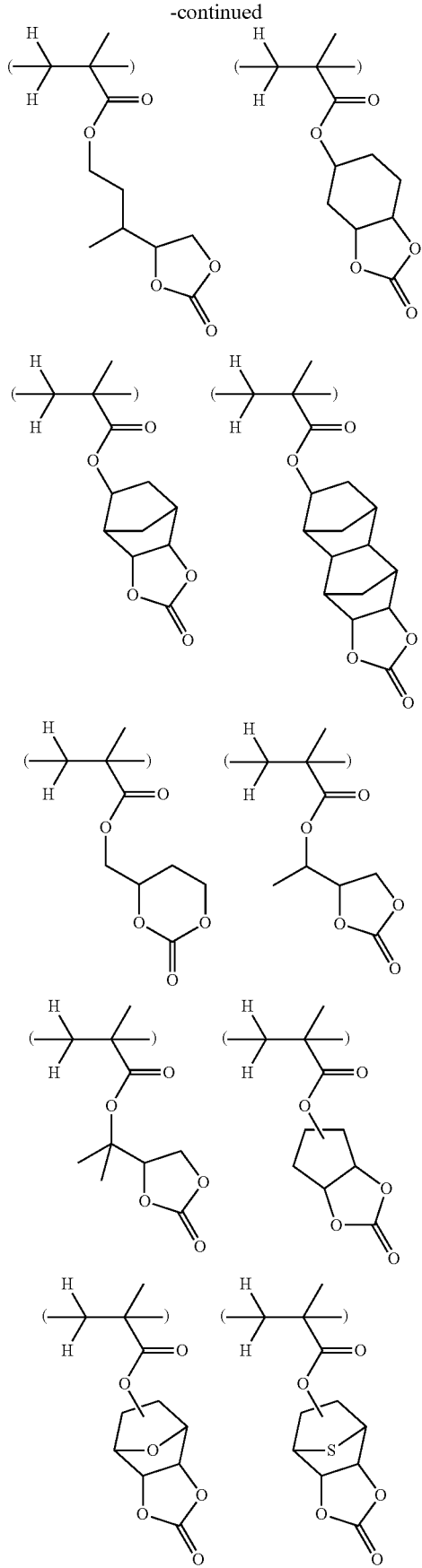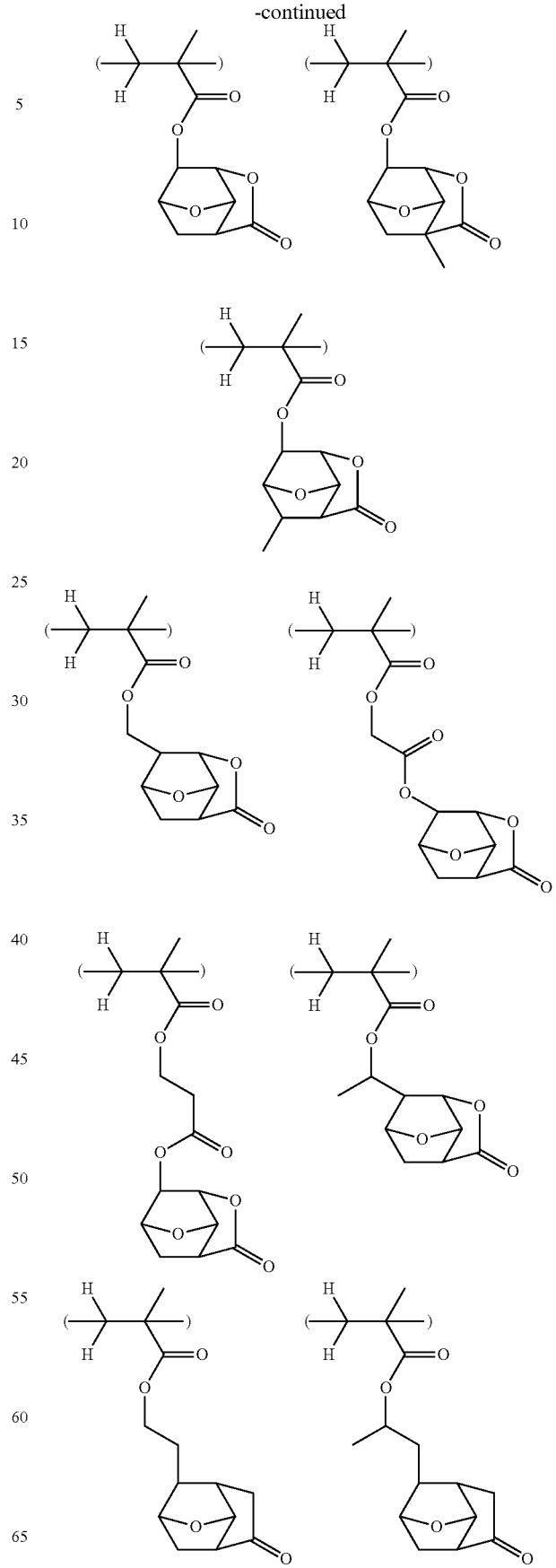

-continued
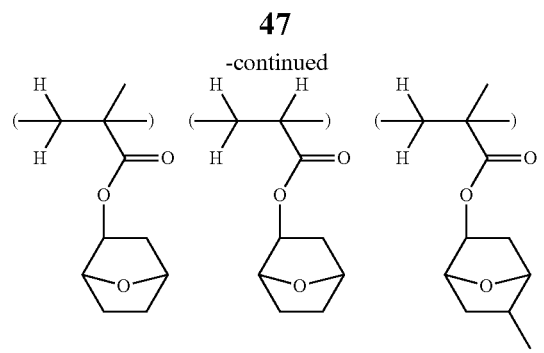 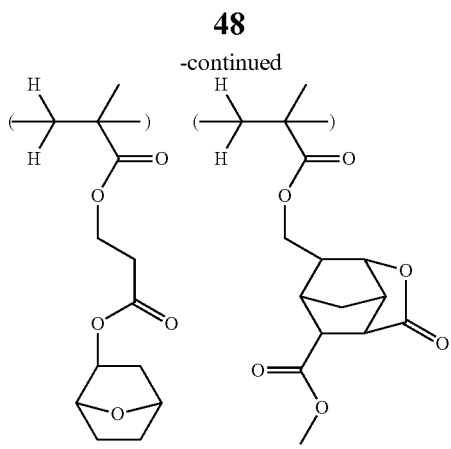
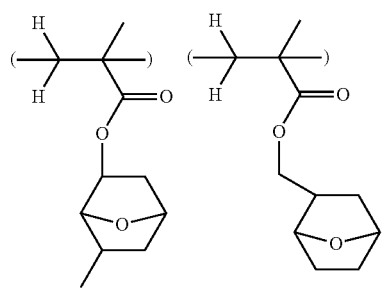 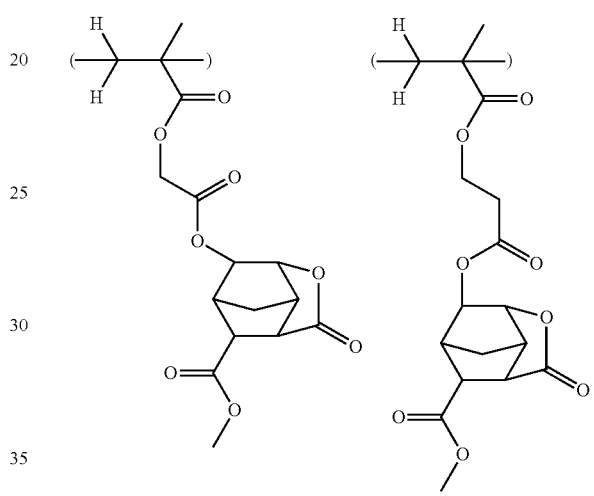
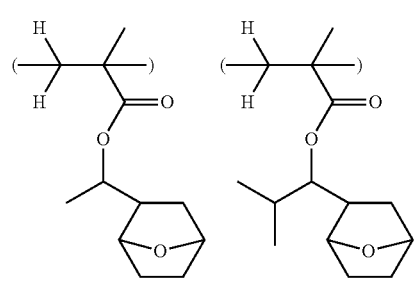 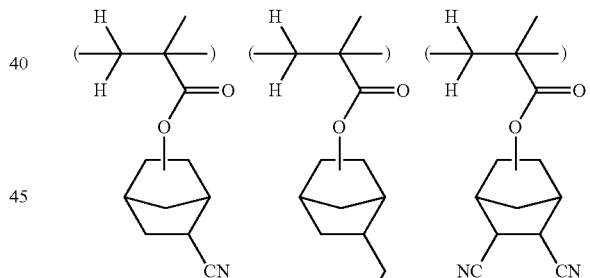
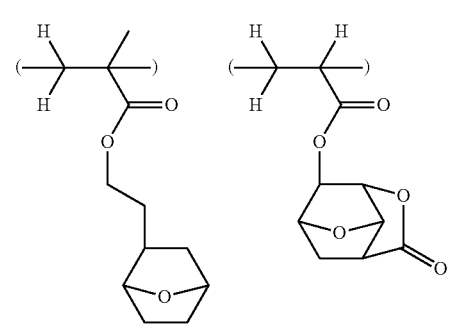
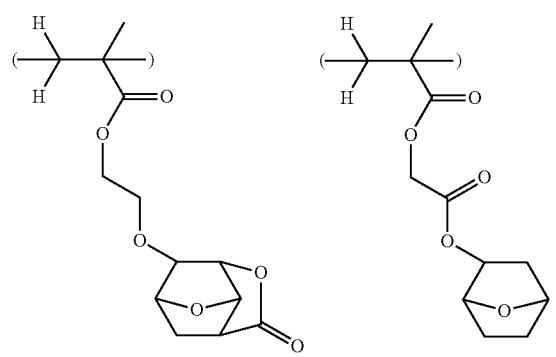 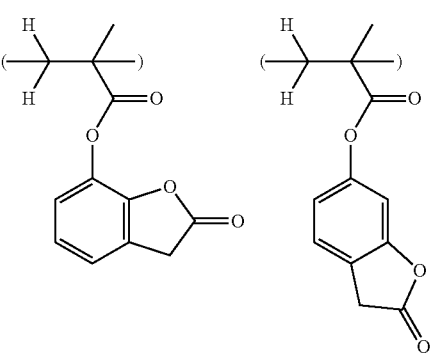

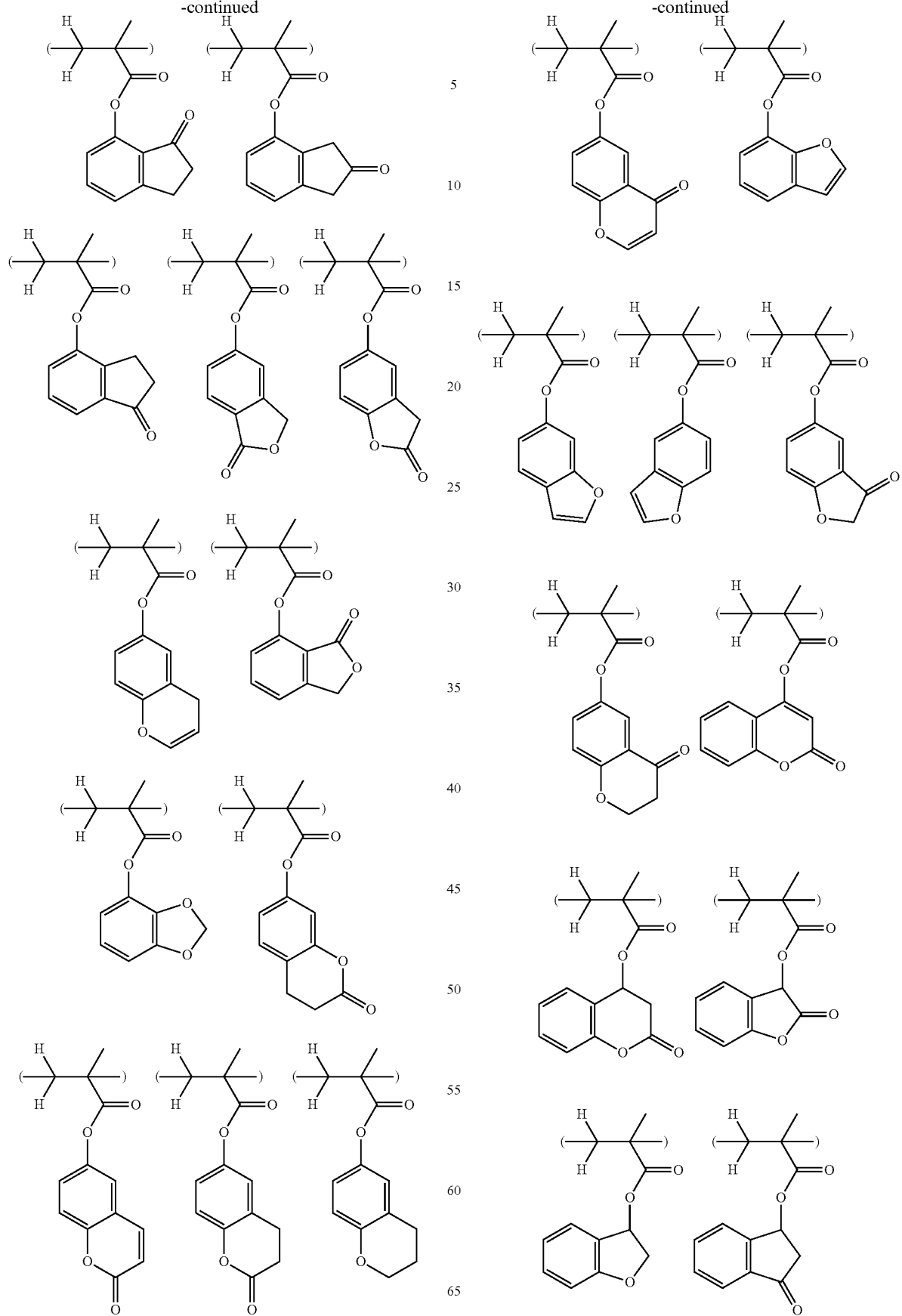

51
-continued
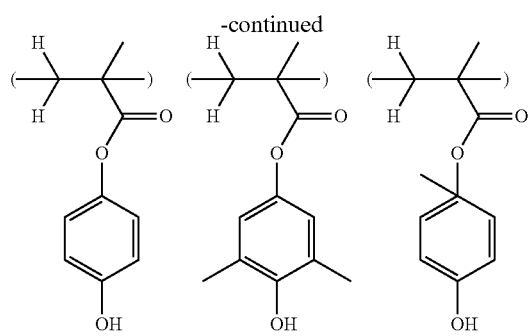
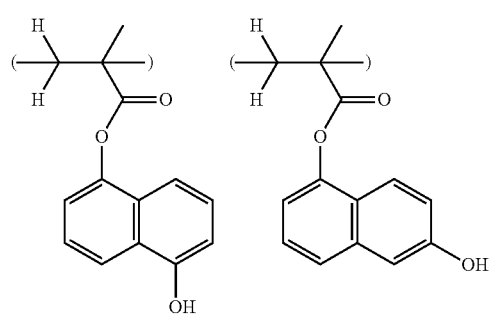
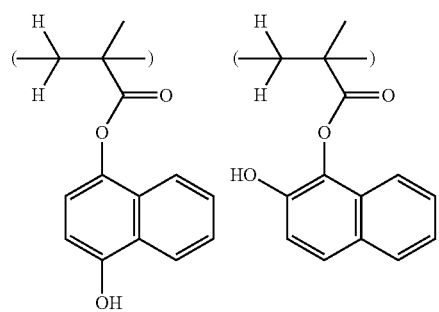
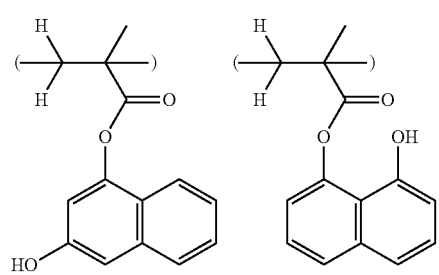
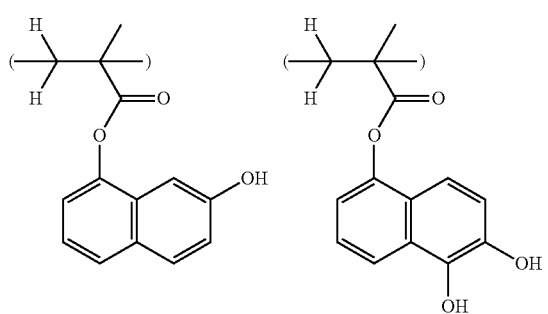
52
-continued
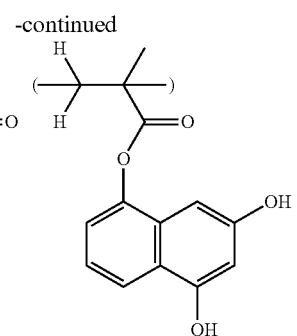
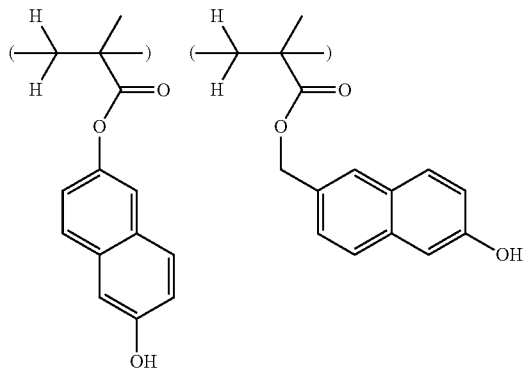
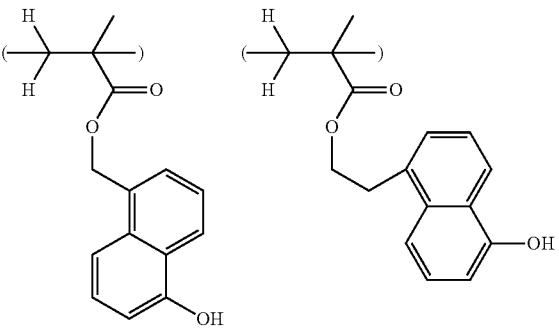
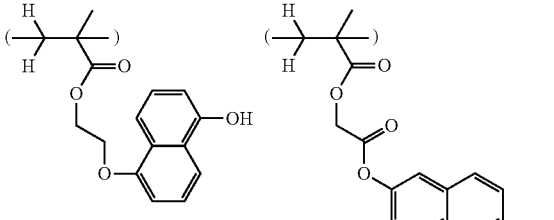
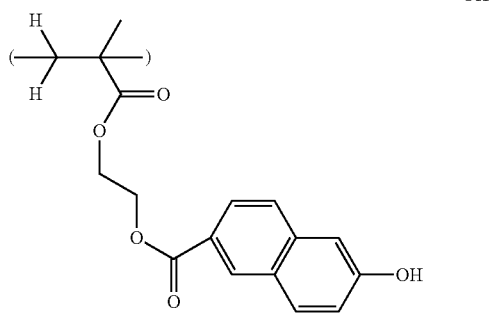

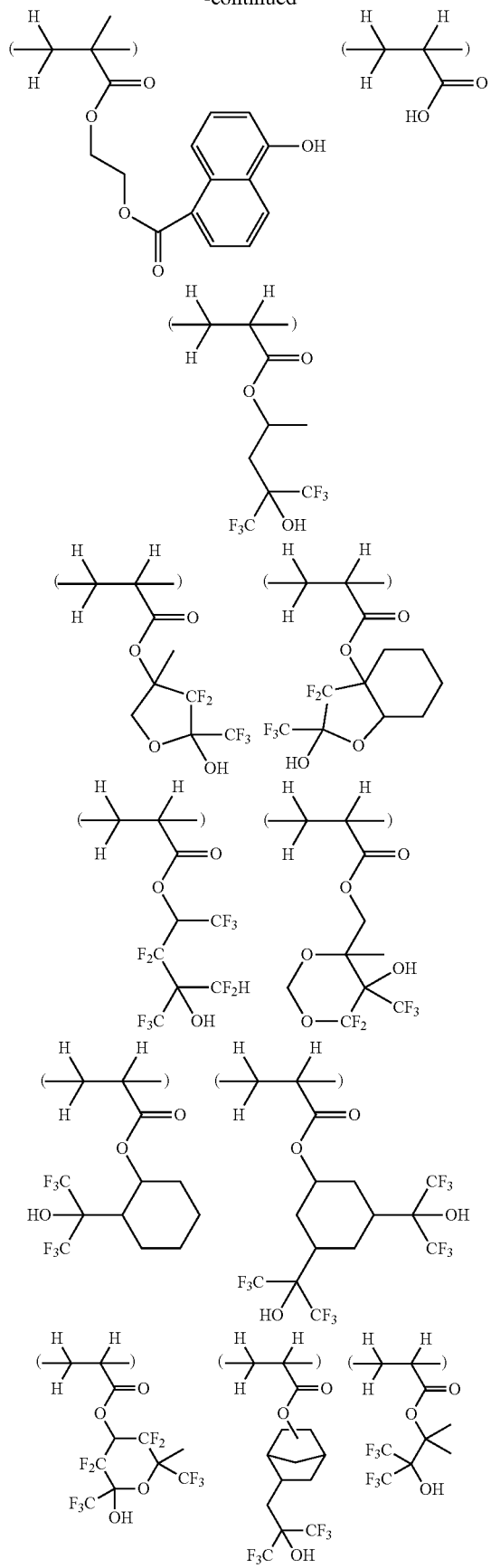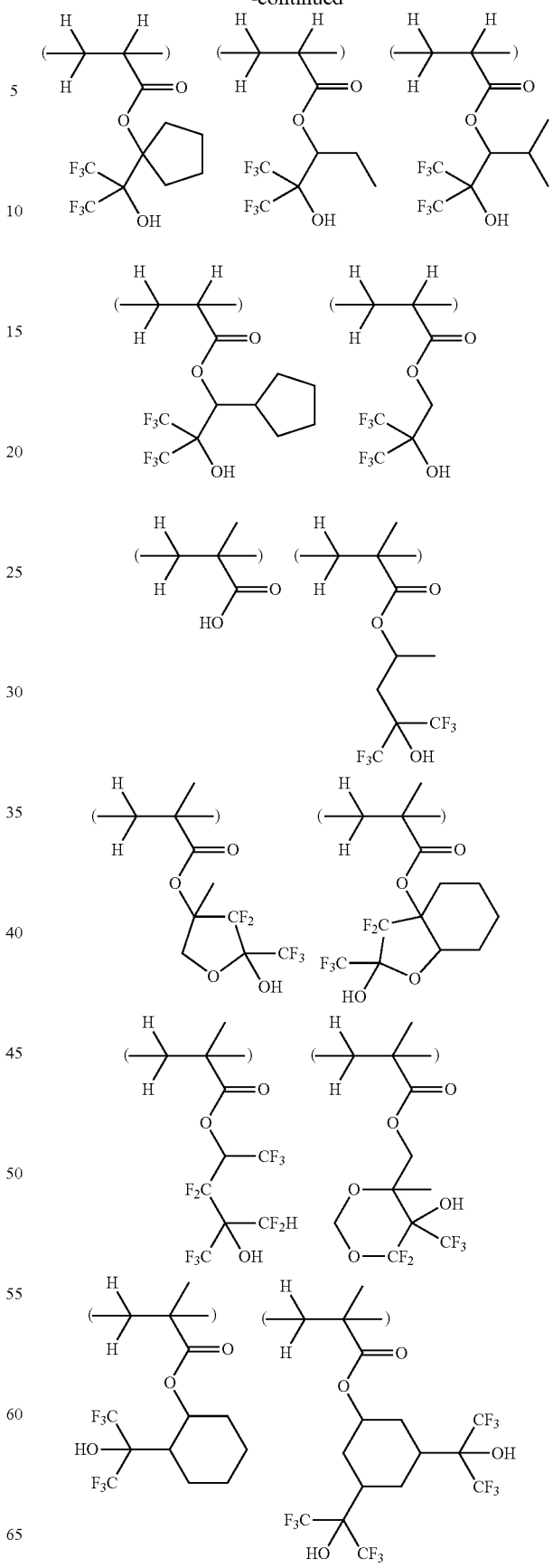

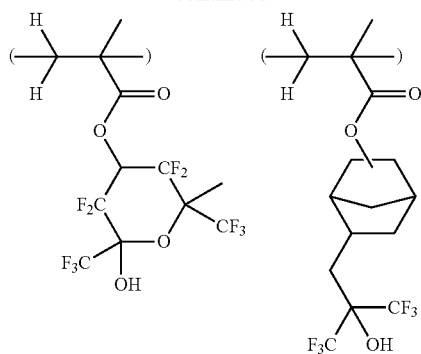
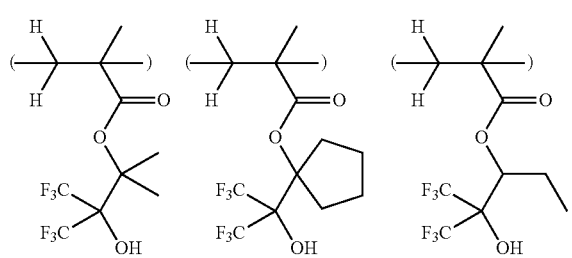
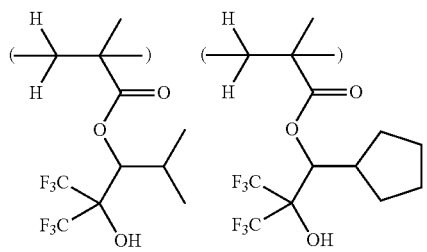
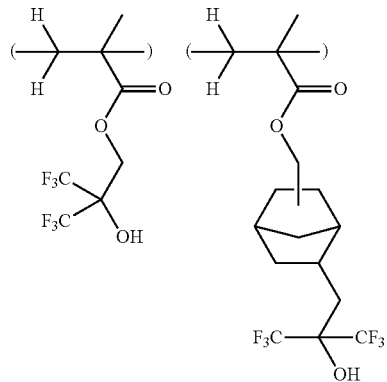
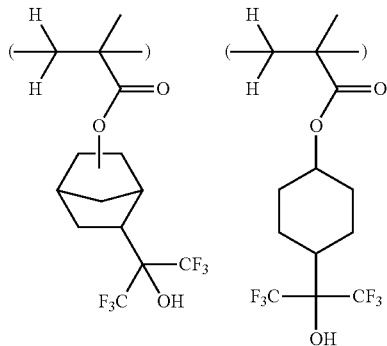
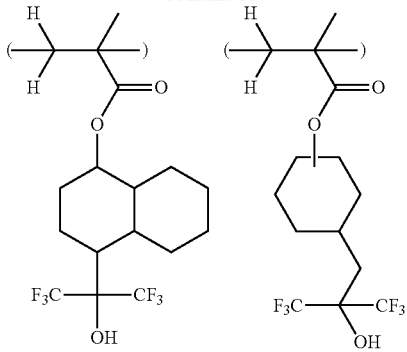
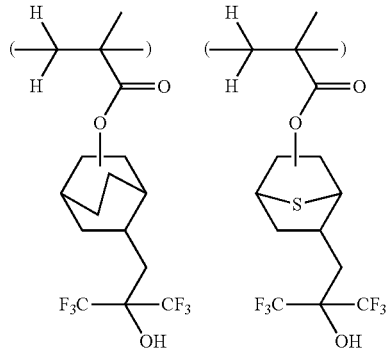
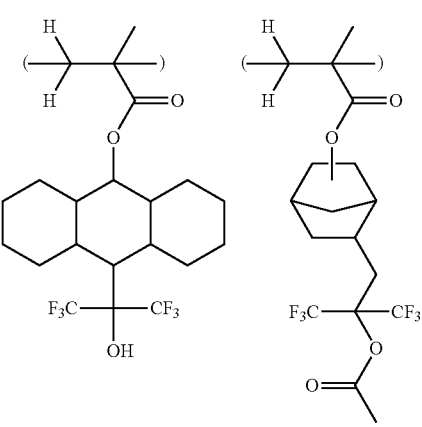
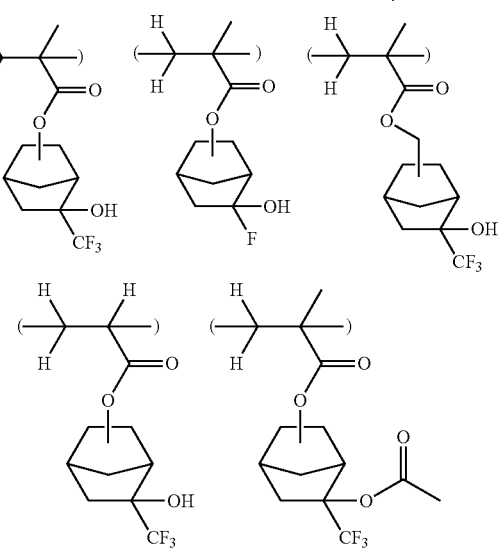

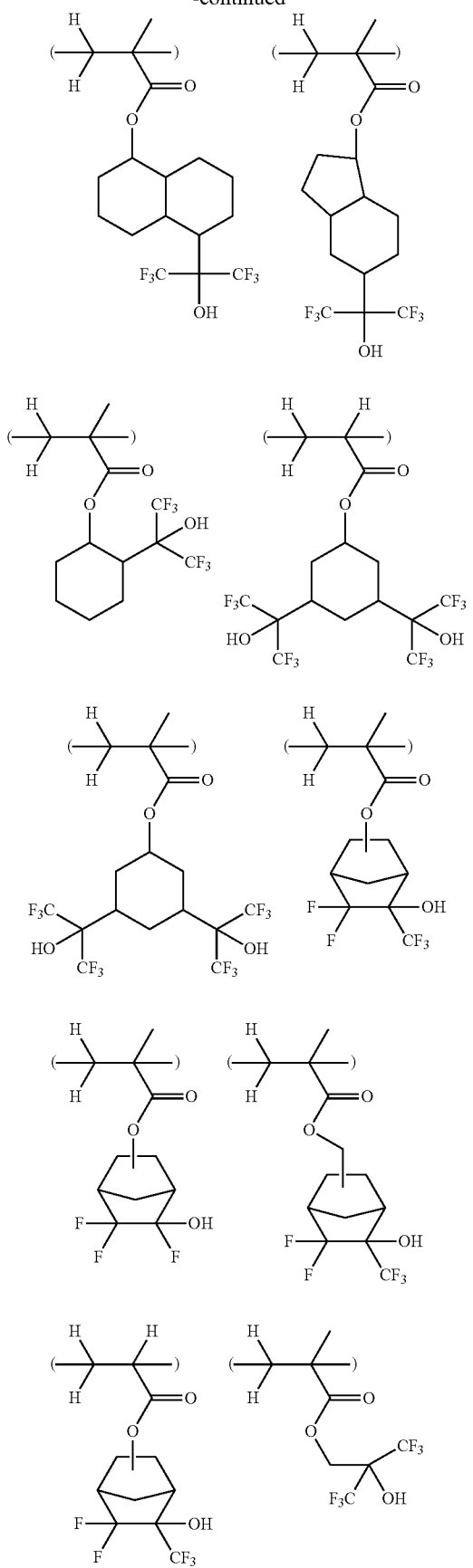
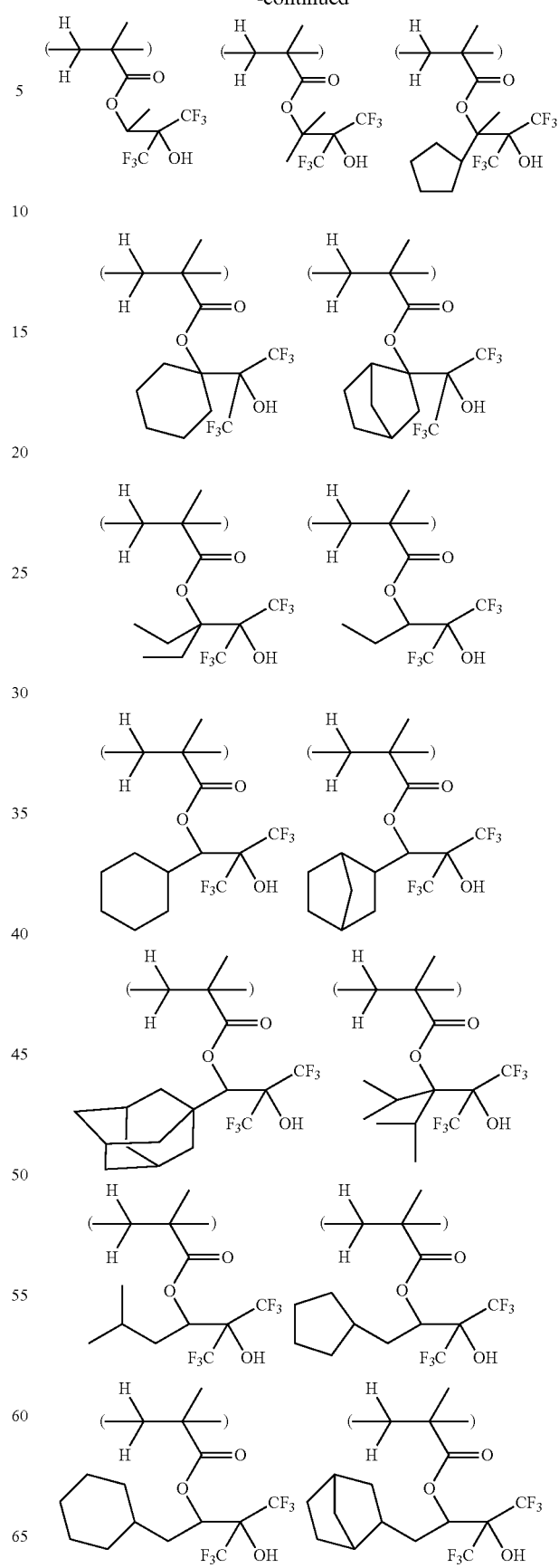

-continued
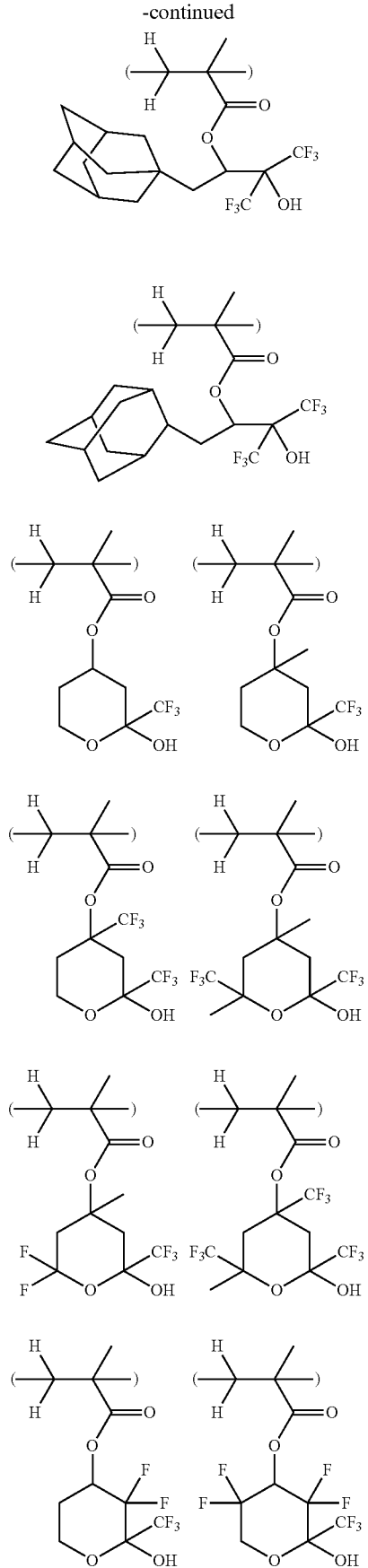
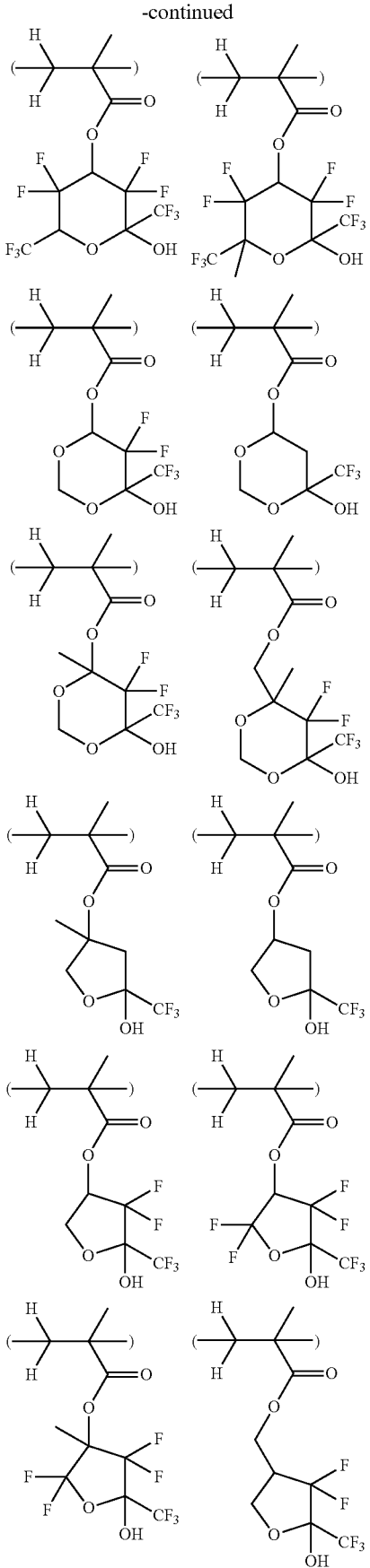

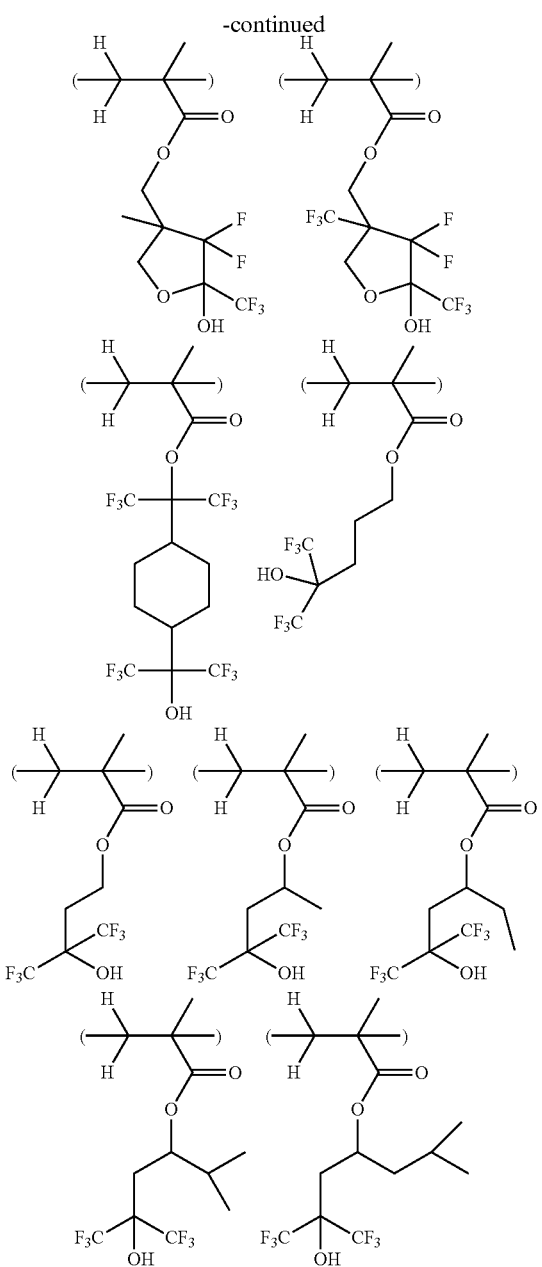

When the repeating unit represented by the general formula (5) is used, a repeating unit having a lactone ring as a polar group is most preferably used.

The repeating unit represented by the general formula (5) is used by copolymerization with the repeating unit represented by the general formula (4), and further may be used by copolymerization with another repeating unit.

The polymer used for the resist composition of the present invention may include repeating units derived from a monomer having a carbon-carbon double bond, including a substituted acrylic acid ester such as methyl methacrylate, methyl crotonate, dimethyl maleate, and dimethyl itaconate, an unsaturated carboxylic acid such as maleic acid, fumaric acid, and itaconic acid, a cyclic olefin such as norbornene, a norbornene derivative, and a tetracyclo[6.2.1.1$^{3,6}$.0$^{2,7}$]dodecene derivative, and an unsaturated acid anhydride such as itaconic acid anhydride, and another monomer, in addition to the above-described compounds. Hydrogenated products of ring-opening metathesis polymers described in Japanese Patent Laid-Open Publication No. 2003-66612 can be used.

The polymer used for the resist composition of the present invention has a weight average molecular weight of 1,000 to 500,000, preferably 3,000 to 100,000. Outside the range, the etching resistance may be extremely low and the resolution may be low because a difference in rate of dissolution before and after exposure is lost. For measurement of molecular weight, gel permeation chromatography (GPO) using a polystyrene as standard is used.

A typical method for synthesizing the polymer for the resist composition may be a method for thermally polymerizing one or more monomers having an unsaturated bond in an organic solvent by adding a radical polymerization initiator, which refers to Japanese Patent Laid-Open Publication No. 2005-264103 and many known documents.

An organic solvent used for the resist composition of the present invention is not particularly limited as long as the acid generator (including the acid generator of the present invention and other acid generators), the base resin, and other additives can be dissolved in it. Specific examples thereof include ketones such as cyclohexanone, and methyl-2-amyl ketone; alcohols such as 3-methoxy buthanol, 3-methyl-3-methoxy buthanol, 1-methoxy-2-propanol, and 1-ethoxy-2-propanol; ethers such as propylenegylcol monomethyl ether, ethylenegylcol monomethyl ether, propylenegylcol monoethyl ether, ethylenegylcol monoethyl ether, propylenegylcol dimethyl ether, and diethyleneglycol dimethyl ether; and esters such as propylenegylcol monomethyl ether acetate, propylenegylcol monoethyl ether acetate, ethyl lactate, ethyl pyruvate, butyl acetate, methyl 3-methoxypropionate, ethyl 3-ethoxypropionate, tert-butyl acetate, tert-butyl propionate, propylenegylcol monomethyl ether acetate, and propylenegylcol mono-tert-butyl ether acetate. These organic solvents may be used alone or a mixture of two or more kinds of them may be used, but are not limited to these. Among the organic solvents, diethyleneglycol dimethyl ether, 1-ethoxy-2-propanol, ethyl lactate, propyleneglycol monomethyl ether acetate, propyleneglycol monomethyl ether, or a mixed solvent thereof is preferably used in the present invention.

The amount of the organic solvent to be blended is preferably 200 to 10,000 parts by mass, particularly preferably 300 to 5,000 parts by mass, relative to 100 parts by mass of the base resin.

With the resist composition of the present invention, one or more quenchers may be blended.

As such a quencher, primary, secondary, and tertiary aliphatic amines, mixed amines, aromatic amines, heterocyclic amines, a nitrogen-containing compound having a carboxy group, a nitrogen-containing compound having a sulfonyl group, a nitrogen-containing compound having a hydroxy group, a nitrogen-containing compound having a hydroxyphenyl group, an alcoholic nitrogen-containing compound, amides, imides, carbamates, or ammonium salts are suitably used. Specific examples thereof are disclosed in Japanese Patent Laid-Open Publication No. 2008-111103, paragraphs [0146] to [0163].

The amount of the quencher to be blended is 0.01 to 20 parts by mass, preferably 0.1 to 10 parts by mass, relative to 100 parts by mass of the base resin. When the amount is 0.01 part by mass or more, the blending effect can be surely obtained. When the amount is 20 parts by mass or less, a good sensitivity can be maintained.

The chemically amplified resist composition of the present invention may include, as an optional component, a surfactant which is commonly used for improving the coating properties, in addition to the components.

Specific examples of the surfactant are disclosed in Japanese Patent Laid-Open Publication No. 2008-111103, paragraphs [0165] to [0166]. The added amount thereof may be a general amount.

In addition to the components, other components such as a cross-linking agent, a dissolution inhibitor, an acidic compound, a stabilizer, and a dye may be added as an optional component if necessary. The amounts of the added components may be general amounts.

[Patterning Process]

The chemically amplified resist composition of the present invention is suitably used as a resist composition for formation of a photoresist layer by a multilayer resist method (in particular, two-layer resist method, and three-layer resist method) or a monolayer resist method.

The present invention provides a patterning process including a step of applying the resist composition of the present invention to a substrate; a step of conducting heat-treatment; a step of exposing the substrate to a high-energy beam; a step of conducting heat-treatment; and a step of developing it with a developer.

The chemically amplified resist composition of the present invention may be used to form a pattern by a known lithography technique. For example, the chemically amplified resist composition is applied to a substrate for production of an integrated circuit (e.g., Si, $SiO_2$, SiN, SiON, TiN, WSi, BPSG, SOG, and organic antireflective film) or a substrate for production of a mask circuit (e.g., Cr, CrO, CrON, and MoSi) by a procedure such as spin coating to form an applied resist film having a thickness of 0.05 to 2.0 μm. The film is then pre-baked on a hot plate at 60 to 150° C. for 1 to 20 minutes, preferably at 80 to 140° C. for 1 to 10 minutes.

A patterning mask (photomask) having a desired pattern is then placed over the applied resist film, and the film is exposed through the mask to radiation of high-energy such as deep-UV rays, an excimer laser, x-rays, or an electron beam. Alternatively, the applied resist film is exposed to an electron beam without a patterning mask.

The chemically amplified resist composition of the present invention is best suited to fine patterning by exposure with a high-energy beam, particularly a KrF excimer laser, an ArF excimer laser, EUV lithography, or an electron beam.

The film is preferably exposed to light so that the exposure dose is 1 to 200 $mJ/cm^2$, preferably about 10 to 100 $mJ/cm^2$, or to an electron beam so that the exposure does is about 0.1 to 20 $\mu C/cm^2$, preferably about 3 to 10 $\mu C/cm^2$.

In the exposure, the general exposure method can be used. In some cases, the immersion method in which a liquid having a high refractive index of 1.0 or more (e.g., water, ethylene glycol, and glycerin) can be placed between the applied resist film and a projection lens to conduct immersion lithography can be used. Further, a top coat may be formed on the applied resist film, and the liquid may be placed between the top coat and the projection lens to conduct immersion lithography.

The applied resist film is then post-exposure baked (PEB) on a hot plate at 60 to 150° C. for 1 to 20 minutes, preferably at 80 to 140° C. for 1 to 10 minutes. Then, development may be carried out using as a developer an aqueous alkaline solution of 0.1 to 5% by mass, preferably 2 to 3% by mass tetramethylammonium hydroxide (TMAH) by the conventional method such as dip, puddle, or spray method for 0.1 to 3 minutes, preferably 0.5 to 2 minutes to form the desired pattern on the substrate.

The top coat insoluble in water prevents a substance eluted from the applied resist film and is used to increase water-sliding property of the film surface. The top coat is largely classified into two kinds. One is an organic solvent peeling type top coat which needs to be peeled before alkaline development by an organic solvent which does not dissolve the applied resist film. The other is an alkaline solubilized top coat which is soluble in an alkaline developer and is removed by removing an applied resist film soluble part.

For the latter, a polymer having a 1,1,1,3,3,3-hexafluoro-2-propanol residue, which is insoluble in water and soluble in an alkaline developer, is preferably used as a base and a material which is dissolved in an alcohol solvent having 4 or more carbon atoms, an ether solvent having 8 to 12 carbon atoms, and a mixed solvent thereof are preferable.

The surfactant insoluble in water and soluble in an alkaline developer may be dissolved in an alcohol solvent having 4 or more carbon atoms, an ether solvent having 8 to 12 carbon atoms, or a mixed solvent thereof to prepare a material.

As a means of the patterning process of the present invention, a photoresist film is formed, acid generators may be then extracted from the surface of the film by rinsing with pure water (post-soak), or particles may be washed off. Alternatively, after exposure, water left on the film may be removed by rinsing (post-soak). Various other steps such as etching, resist-removing, and washing steps may be also conducted. These other steps can be performed according to the conventional method.

The chemically amplified resist composition of the present invention can be used for formation of a negative pattern using an organic solvent as a developer.

As a developer of the organic solvent, a developer containing as components one or more selected from 2-octanone, 2-nonanone, 2-heptanone, 3-heptanone, 4-heptanone, 2-hexanone, 3-hexanone, diisobutyl ketone, methyl cyclohexanone, acetophenone, methyl acetophenone, propyl acetate, butyl acetate, isobutyl acetate, amyl acetate, butenyl acetate, isoamyl acetate, phenyl acetate, propyl formate, butyl formate, isobutyl formate, amyl formate, isoamyl formate, methyl valerate, methyl pentenoate, methyl crotonate, ethyl crotonate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate, can be used. From the viewpoints of improved pattern collapse, a developer in which the total amount of one or more developer components is 50% by mass or more is preferably used.

Descriptions of another method for forming a film, a substrate, and the like may be the same as in the patterning process using an alkaline developer.

EXAMPLES

Hereinafter, the present invention will be specifically described with reference to Synthesis Examples, Examples, and Comparative Examples, but is not limited to the following description.

Examples

Synthesis Example 1-1

Synthesis of triphenylsulfonium 1,1,3,3,3-pentafluoro-2-(3-cyclohexenecarbonyloxy)propane-1-sulfonate (PAG intermediate-1)

3-Cyclohexenecarbonyl chloride prepared by reaction of 4.2 g (0.03 mole) of 3-cyclohexenecarboxylic acid with 5.1 g (0.04 mole) of oxalyl chloride was dissolved in 12 g of methylene chloride. A solution of 3-cyclohexenecarbonyl chloride in methylen chloride, as prepared above, was added dropwise to a mixed solution of 15 g (0.03 mole) of triphenylsulfonium 1,1,3,3,3-pentafluoro-2-hydroxypropane-1-sulfonate prepared in accordance with the method described in Japanese Patent Laid-Open Publication No. 2007-145804, 2.4 g (24 millimoles) of triethylamine, 0.1 g (1 millimole) of N,N'-dimethylaminopyridine, and 60 g of methyle chloride. The mixture was then stirred at room temperature for 5 hours. After stirring, 30 g of 5% dilute hydrochloric acid was added to quench the reaction. An organic layer was isolated and washed with water. After washing with water, the organic layer was concentrated. To the organic layer, methyl isobutyl ketone was added, and the mixture was washed with water. After then, the washed organic layer was concentrated, and diisopropyl ether was added to perform recrystallization. The crystal was filtered off, collected, and dried under reduced pressure at 50° C. to obtain 14 g of triphenylsulfonium 1,1,3,3,3-pentafluoro-2-(3-cyclohexenecarbonyloxy)propane-1-sulfonate (PAG intermediate) which was a target compound as a white crystal (yield: 78%).

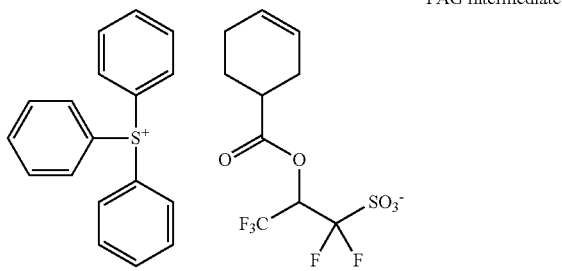

PAG intermediate

Figure 2:
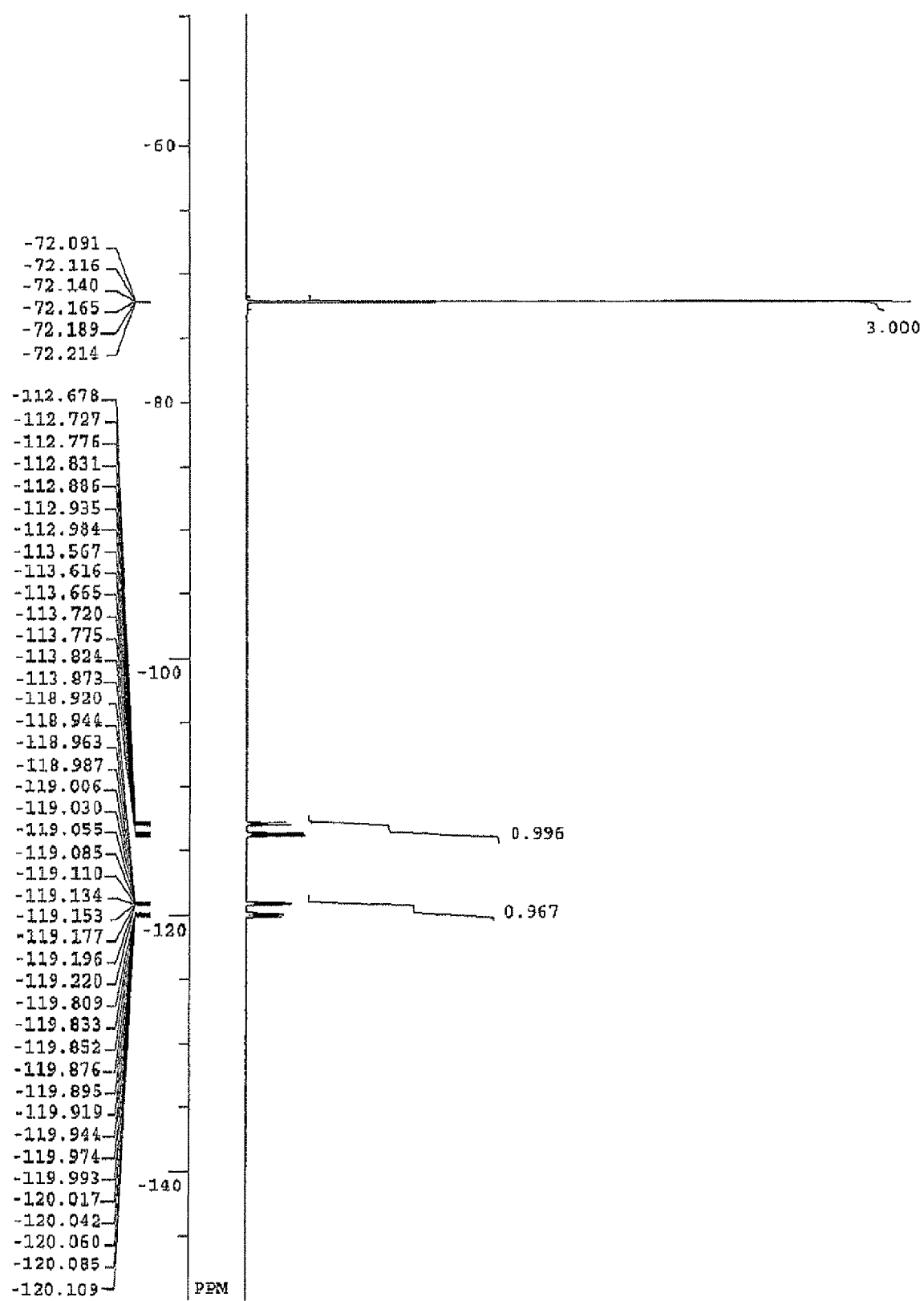
FIG. 2 is a graph showing $^{19}$F-NMR of [PAG intermediate] in Synthesis Example 1-1.

The spectrum data of the target compound is shown below. FIGS. 1 and 2 show the results of nuclear magnetic resonance spectra ($^1$H-NMR, and $^{19}$F-NMR/DMSO-$d_6$). In $^1$H-NMR, a minute amount of water is observed.

Infrared absorption spectrum (IR (D-ATR); cm$^{-1}$) 1760, 1476, 1446, 1367, 1266, 1250, 1218, 1183, 1162, 1114, 1095, 1064, 995, 927, 913, 887, 836, 752, 685, 640 cm$^{-1}$.

Time-of-Flight mass spectrometry (TOFMS; MALDI)

POSITIVE M$^+$263 (corresponding to $(C^6H^5)_3S^+$)

NEGATIVE M$^-$337 (corresponding to $(C_6H_9-CO_2)CH(CF_3)CF_2SO_3^-$)

Synthesis Example 1-2

Synthesis of triphenylsulfonium 1,1,3,3,3-pentafluoro-2-(3,4-cyclohexeneoxide-1-carbonyloxy)propane-1-sulfonate (PAG-1)

A mixed solution of 6.2 g (10 millimoles) of triphenylsulfonium 1,1,3,3,3-pentafluoro-2-(3-cyclohexenecarbonyloxy)propane-1-sulfonate prepared in Synthesis Example 1-1 and 20 g of methylene chloride was added dropwise to a mixed solution of 2.8 g (12 millimoles) of m-chloroperoxybenzoic acid and 10 g of methylene chloride under ice-cooling. The mixture was then stirred at room temperature for 4 hours. After stirring, an aqueous solution of 5% sodium thiosulfate was added to quench the reaction. An organic layer was isolated, washed with an aqueous solution of saturated sodium hydrogencarbonate, and then washed with water. After washing with water, the organic layer was concentrated. To the organic layer, methyl isobutyl ketone was added, and the organic layer was concentrated. Diisopropyl ether was added to the concentrated solution to perform recrystallization. The crystal was filtered off, collected, and dried under reduced pressure at 40° C. to obtain 5.4 g of triphenylsulfonium 1,1,3,3,3-pentafluoro-2-(3,4-cyclohexeneoxide-1-carbonyloxy)propane-1-sulfonate (PAG-1) which was a target compound as a white crystal (yield: 85%).

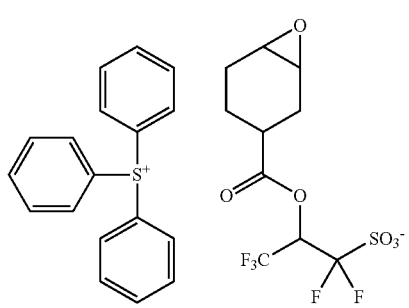

PAG-1

Figure 3:
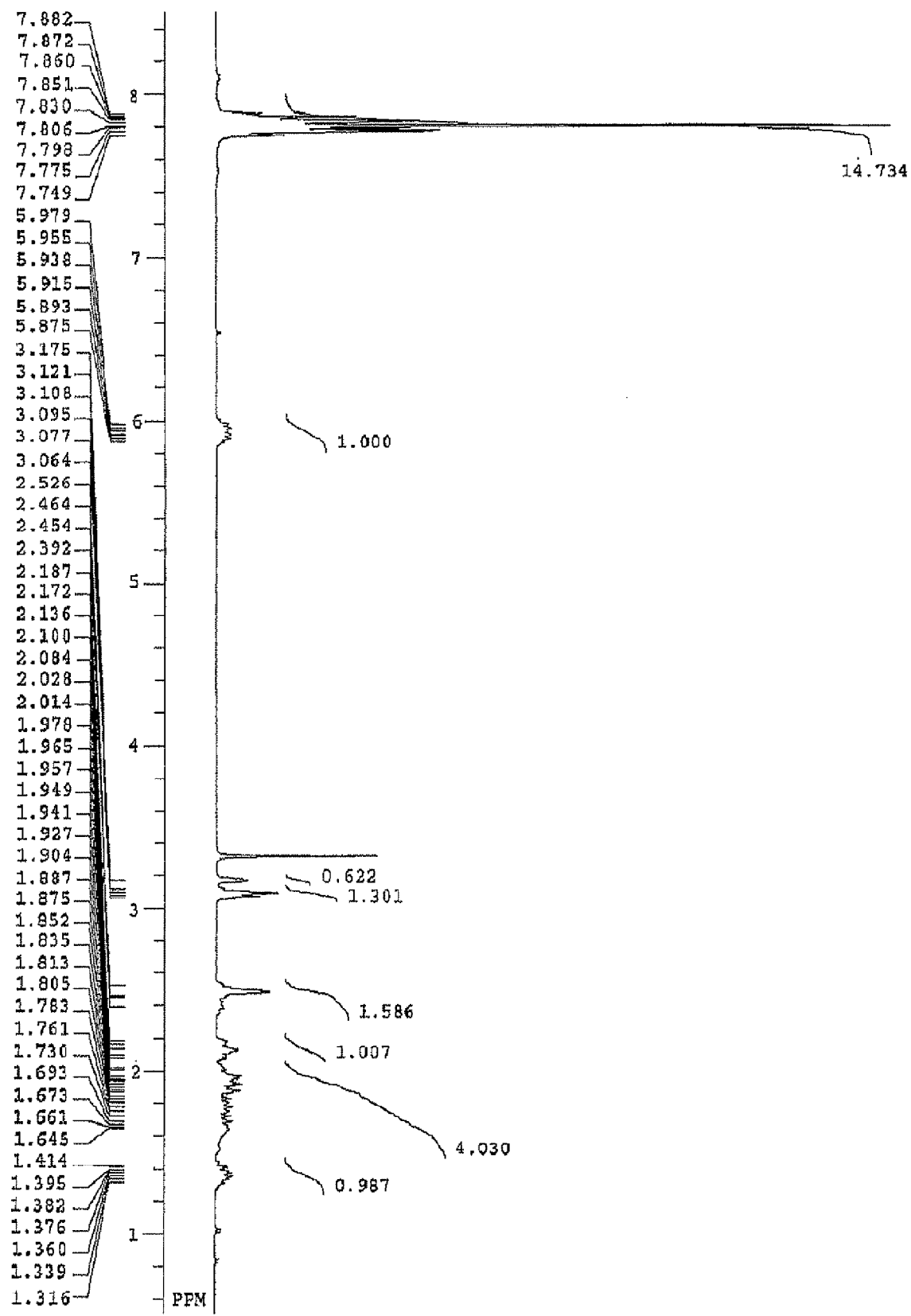
FIG. 3 is a graph showing $^1$H-NMR of [PAG-1] in Synthesis Example 1-2.
Figure 4:
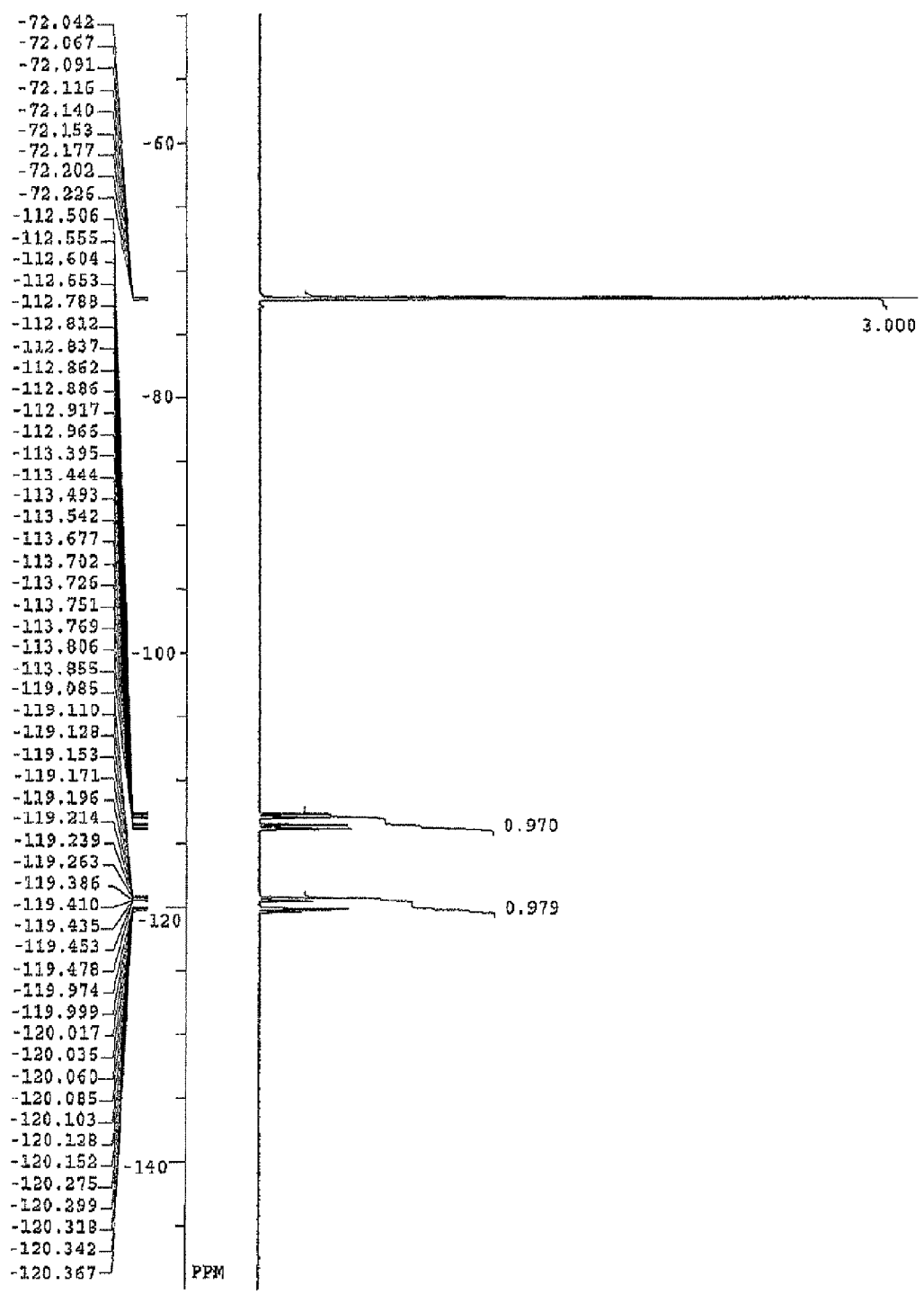
FIG. 4 is a graph showing $^{19}$F-NMR of [PAG-1] in Synthesis Example 1-2.

The spectrum data of the target compound is shown below. FIGS. 3 and 4 show the results of nuclear magnetic resonance spectra ($^1$H-NMR, and $^{19}$F-NMR/DMSO-$d_6$). In $^1$H-NMR, a minute amount of water is observed.

Infrared absorption spectrum (IR (D-ATR); cm$^{-1}$) 1762, 1476, 1446, 1367, 1328, 1265, 1251, 1219, 1184, 1162, 1124, 1084, 1065, 995, 925, 893, 837, 752, 685, 640 cm$^{-1}$.

Time-of-Flight mass spectrometry (TOFMS; MALDI)

POSITIVE M$^+$263 (corresponding to $(C^6H^5)_3S^+$)

NEGATIVE M$^-$353 (corresponding to $(C_6H_9O-CO_2)CH(CF_3)CF_2SO_3^-$)

A polymer used for the resist composition of the present invention was synthesized by the following procedure.

Synthesis Example 2-1

Synthesis of Polymer 1 (P-1)

7.1 g of 3-hydroxy-1-adamantyl methacrylate, 11.0 g of 3-ethyl-3-exo-tetracyclo[4.4.0.1$^{2,5}$.1$^{7,10}$]dodecyl, 6.7 g of 4,8-dioxatricyclo[4.2.1.0$^{3,7}$]nonan-5-on-2-yl methacrylate, and 0.9 g of dimethyl 2,2'-azobis(isobutyrate) were dissolved in 72.8 g of methyl ethyl ketone under a nitrogen atmosphere to prepare a solution. The solution was stirred at 80° C. under a nitrogen atmosphere, and was added dropwise to 20.7 g of methyl ethyl ketone over 4 hours. After completion of dropwise addition, the mixture was stirred for 2 hours while kept to 80° C., and cooled to room temperature. The polymerization solution was added dropwise to 400 g of hexane. The deposited solid material was collected by filtration, and washed with a mixed solvent of 45 g of methyl ethyl ketone and 195 g of hexane twice. The solid material was dried under vacuum at 50° C. for 20 hours to obtain a polymer represented by the following polymer 1 as a white powder. The yield was 23.6 g, and the yield rate was 95%. Mw represents a weight average molecular weight in terms of polystyrene measured by GPC.

(polymer 1)

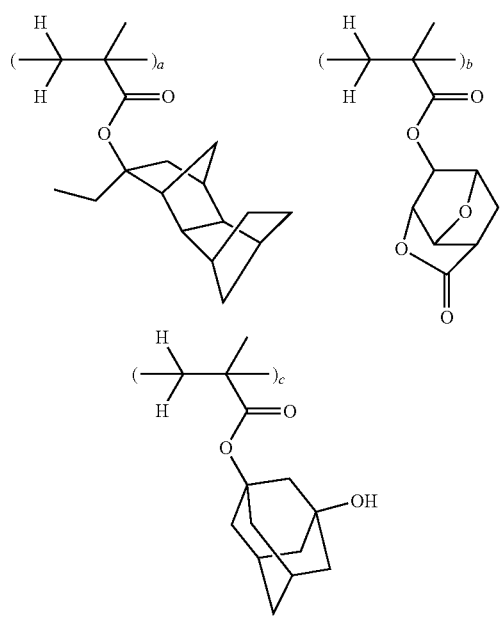

($a = 0.40, b = 0.30, c = 0.30$, Mw = 8,000)

Synthesis Examples 2-2 to 10

Synthesis of Polymers 2 to 10 (P-2 to 9-10)

Resins shown in Table 1 were produced in the same manner as in Synthesis Example 2-1 except that the kind of each monomer and a blending ratio were changed. The structures of each unit shown in Table 1 are shown in Tables 2 and 3. In Table 1, the introduction ratio is a molar ratio.

TABLE 1

| Resin | Unit 1 (introduction ratio) | | Unit 2 (introduction ratio) | | Unit 3 (introduction ratio) | | Unit 4 (introduction ratio) | | Molecular weight |
|---|---|---|---|---|---|---|---|---|---|
| P-1 | A-1 | (0.40) | B-1 | (0.30) | B-6 | (0.30) | — | | 8200 |
| P-2 | A-4 | (0.50) | B-1 | (0.10) | B-2 | (0.40) | — | | 8300 |
| P-3 | A-4 | (0.50) | B-1 | (0.10) | B-6 | (0.40) | — | | 8100 |
| P-4 | A-1 | (0.50) | B-1 | (0.15) | B-3 | (0.20) | B-7 | (0.15) | 7900 |
| P-5 | A-4 | (0.50) | B-1 | (0.10) | B-5 | (0.40) | — | | 8200 |
| P-6 | A-3 | (0.50) | B-2 | (0.50) | — | | — | | 8000 |
| P-7 | A-5 | (0.35) | B-1 | (0.20) | B-4 | (0.45) | — | | 8200 |
| P-8 | A-1 | (0.25) | A-2 | (0.25) | B-1 | (0.10) | B-6 | (0.40) | 7900 |
| P-9 | A-4 | (0.55) | B-2 | (0.15) | B-5 | (0.30) | — | | 8100 |
| P-10 | A-6 | (0.35) | B-1 | (0.20) | B-6 | (0.45) | — | | 8400 |

TABLE 2

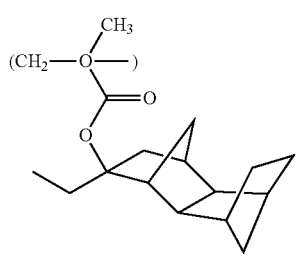
A-1

TABLE 2-continued

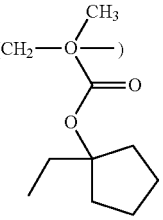
A-2

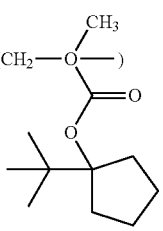
A-3

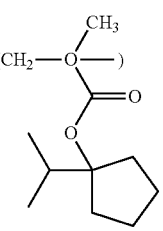
A-4

TABLE 2-continued

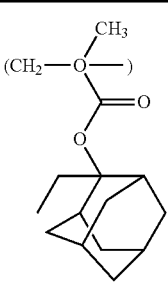
A-5

TABLE 2-continued

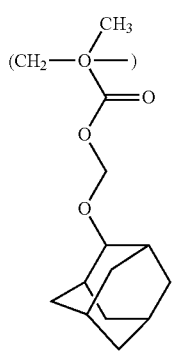
A-6

TABLE 3

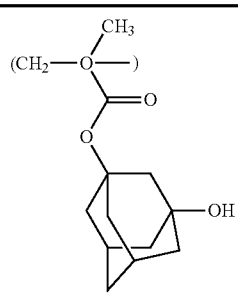
B-1

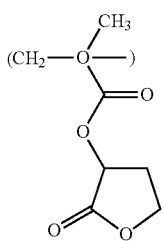
B-2

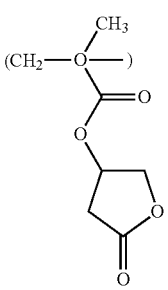
B-3

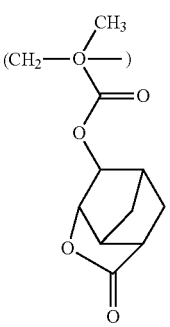
B-4

TABLE 3-continued

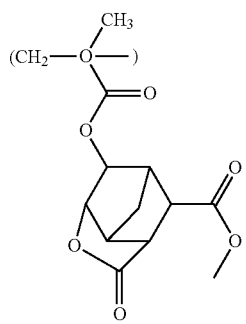
B-5

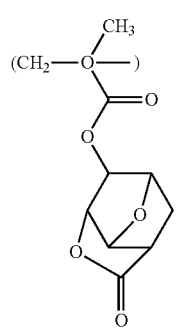
B-6

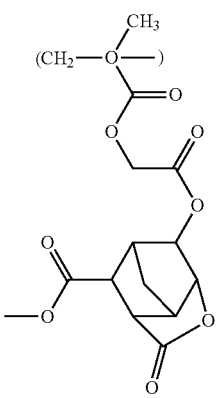
B-7

Examples 1-1 to 1-11 and Comparative Examples 1-1 to 1-6

A polymer shown in the synthesis example, a photoacid generator, an amine quencher, and an alkaline solubilized surfactant (F-1) in a combination shown in Table 4 were dissolved in a solvent containing 0.01% by mass of the following surfactant (F-2) (available from Omnova Solutions Inc.) to prepare a resist composition. The resist composition was filtered through a 0.2 μm Teflon (registered trademark) filter to prepare a resist solution.

TABLE 4

| Resist | | Resin (part by mass) | | Acid generator (part by mass) | | Quencher (part by mass) | | Surfactant (part by mass) | | Solvent 1 (part by mass) | | Solvent 2 (part by mass) | |
|---|---|---|---|---|---|---|---|---|---|---|---|---|---|
| Example 1-1 | R-01 | P-1 | (80) | PAG-1 | (9.5) | Q-1 | (1.6) | F-1 | (5.0) | PGMEA | (1344) | CyHO | (576) |
| Example 1-2 | R-02 | P-2 | (80) | PAG-1 | (9.5) | Q-1 | (1.6) | F-1 | (5.0) | PGMEA | (1728) | GBL | (192) |
| Example 1-3 | R-03 | P-3 | (80) | PAG-1 | (9.5) | Q-1 | (1.6) | F-1 | (5.0) | PGMEA | (1728) | GEL | (192) |
| Example 1-4 | R-04 | P-4 | (80) | PAG-1 | (9.5) | Q-1 | (1.6) | F-1 | (5.0) | PGMEA | (1344) | CyHO | (576) |
| Example 1-5 | R-05 | P-4 | (80) | PAG-1 PAG-C | (9.5) (2.5) | - | | F-1 | (5.0) | PGMEA | (1344) | CyHO | (576) |
| Example 1-6 | R-06 | P-5 | (80) | PAG-1 | (9.5) | Q-1 | (1.6) | F-1 | (5.0) | PGMEA | (1728) | GBL | (192) |
| Example 1-7 | R-07 | P-6 | (80) | PAG-1 | (9.5) | Q-1 | (1.6) | F-1 | (5.0) | PGMEA | (1728) | GBL | (192) |
| Example 1-8 | R-08 | P-7 | (80) | PAG-1 | (9.5) | Q-1 | (1.6) | F-1 | (5.0) | PGMEA | (1344) | CyHO | (576) |
| Example 1-9 | R-09 | P-8 | (80) | PAG-1 | (9.5) | Q-1 | (1.6) | F-1 | (5.0) | PGMEA | (1344) | CyHO | (576) |
| Example 1-10 | R-10 | P-9 | (80) | PAG-1 | (9.5) | Q-1 | (1.6) | F-1 | (5.0) | PGMEA | (1728) | GBL | (192) |
| Example 1-11 | R-11 | P-10 | (80) | PAG-1 | (9.5) | Q-1 | (1.6) | F-1 | (5.0) | PGMEA | (1344) | CyHO | (576) |
| Comparative Example 1-1 | R-12 | P-1 | (80) | PAG-A | (8.7) | Q-1 | (1.6) | F-1 | (5.0) | PGMEA | (1344) | CyHO | (576) |
| Comparative Example 1-2 | R-13 | P-1 | (80) | PAG-B | (10.1) | Q-1 | (1.6) | F-1 | (5.0) | PGMEA | (1344) | CyHO | (576) |
| Comparative Example 1-3 | R-14 | P-2 | (80) | PAG-B | (10.1) | Q-1 | (1.6) | F-1 | (5.0) | PGMEA | (1728) | GBL | (192) |
| Comparative Example 1-4 | R-15 | P-3 | (80) | PAG-B | (10.1) | Q-1 | (1.6) | F-1 | (5.0) | PGMEA | (1728) | GEL | (192) |
| Comparative Example 1-5 | R-16 | P-4 | (80) | PAG-B | (10.1) | Q-1 | (1.6) | F-1 | (5.0) | PGMEA | (1344) | CyHO | (576) |
| Comparative Example 1-6 | R-17 | P-5 | (80) | PAG-B | (10.1) | Q-1 | (1.6) | F-1 | (5.0) | PGMEA | (1728) | GBL | (192) |

In Table 4, the photoacid generator, solvent, amine quencher, alkaline solubilized surfactant (F-1), and surfactant (F-2) are as described below.

[Acid generator]
(PAG-A): triphenylsulfonium nonafluoro-1-butanesulfonate
(PAG-B): triphenylsulfonium 2-(adamantane-1-carbonyloxy)-1,1,3,3,3-pentafluoropropane-1-sulfonate (compound described in Japanese Patent Laid-Open Publication No. 2007-145797)
(PAG-C): triphenylsulfonium camphorsulfonate

[Organic solvent]
PGMEA: propylenegylcol monomethyl ether acetate
GBL: γ-butyrolactone
CyHO: cyclohexanone

[Amine quencher]
(Q-1) : 2,6-diisopropylaniline

[Surfactant]
(F-1) : the following polymer I (compound described in Japanese Patent Laid-Open Publication No. 2008-122932) poly (3,3,3-trifluoro-2-hydroxy-1,1-dimethyl-2-trifluoromethylpropyl methacrylate-1,1,1-trifluoro-2-hydroxy-6-methyl-2-trifluoromethylhepta-4-yl methacrylate) Weight average molecular weight (Mw): 7,300, dispersion degree (Mw/Mn): 1.86

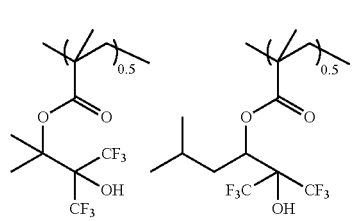

Polymer I (F-2):
3-methyl-3-(2,2,2-trifluoroethoxymethyl) oxetane-tetrahydrofuran-2,2-dimethyl-1,3-propanediol copolymer (available from Omnova Solutions Inc.) (the structural formula thereof is shown below)

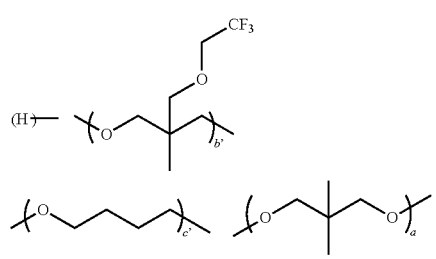

TABLE 4-continued

| Resist | Resin (part by mass) | Acid generator (part by mass) | Quencher (part by mass) | Surfactant (part by mass) | Solvent 1 (part by mass) | Solvent 2 (part by mass) |
|---|---|---|---|---|---|---|

[Structure of surfactant polymer with $F_3C$ group, showing repeating units with subscripts $b$, $b'$, $c$, $c'$ terminated with $-(H)$]

a: (b + b'): (c + c') = 1:4 to 7:0.01 to 1 (Molar ratio)
Weight average molecular weight 1,500

Evaluation of Resist Composition

Examples 2-1 to 2-11 and Comparative Examples 2-1 to 2-6

An anti-reflection coating solution (available from Nissan Chemical Industries, Ltd., ARC-29A) was applied to a silicon substrate, and baked at 200° C. for 60 seconds to prepare an anti-reflection coating substrate (film thickness: 100 nm). A resist solution was applied to the anti-reflection coating substrate by spin coating, and baked on a hot plate at 100° C. for 60 seconds to prepare an applied resist film having a thickness of 90 nm. Using an ArF excimer laser scanner (manufactured by Nikon Corporation, NSR-S610C, NA=1.30, dipole, 6% halftone phase shift mask), the applied resist film was subjected to immersion lithography. The applied resist film was then baked (PEB) at any temperature for 60 seconds, and developed for 60 seconds with an aqueous solution of 2.38% by mass tetramethylammonium hydroxide.

(Evaluation Method)

In the evaluation of resist, a 90-nm hole/180-nm pitch pattern was observed as a subject with an electron microscope, and the optimum exposure dose (Eop, $mJ/cm^2$) was an exposure dose so that the hole average diameter was 75 nm.

The exposure dose range in which the pattern size satisfies 75 nm±10% when the optimum exposure dose is changed is determined. As the evaluation of exposure margin (EL), the determined value is divided by the optimum exposure dose and expressed as a percentage. As the value is larger, variation of performance due to variation of exposure dose is small, and EL is good.

Exposure was conducted through a mask in which the pitch was fixed (180 nm) and only the hole diameter was changed (85 to 95 nm, in units of 1 nm) in the size of wafer at the above optimum exposure dose. After transcription of the wafer, the size was measured. On the hole diameters, the size of the transferred pattern relative to the size of mask design is plotted, the slope is calculated using collinear approximation to be a mask error factor (MEF). As MEF is smaller, the effect of error of finishing a mask pattern can be tempered. Therefore, MEF is good.

Variation (20 points measurement) of diameter of pattern of hole having a diameter of 75 nm, formed using the above optimum exposure dose, is determined. The value $3\sigma$ is regarded as circularity. As the value is smaller, the circularity is better.

Evaluation Results

The evaluation results of the resist compositions of the present invention shown in Table 4 and the comparative resist compositions are shown in Table 5.

TABLE 5

| | Resist | Optimum exposure dose ($mJ/cm^2$) | EL (%) | MEF | Circularity (nm) |
|---|---|---|---|---|---|
| Example 2-1 | R-01 | 51 | 21.6 | 4.7 | 3.2 |
| Example 2-2 | R-02 | 47 | 19.8 | 4.5 | 3.3 |
| Example 2-3 | R-03 | 49 | 22.0 | 4.5 | 3.1 |
| Example 2-4 | R-04 | 44 | 20.1 | 4.5 | 2.9 |
| Example 2-5 | R-05 | 46 | 20.5 | 4.7 | 2.8 |
| Example 2-6 | R-06 | 48 | 21.5 | 4.6 | 3.1 |
| Example 2-7 | R-07 | 50 | 22.2 | 4.2 | 3.0 |
| Example 2-8 | R-08 | 50 | 22.1 | 4.5 | 3.2 |
| Example 2-9 | R-09 | 49 | 21.8 | 4.4 | 3.3 |
| Example 2-10 | R-10 | 51 | 20.9 | 4.3 | 2.9 |
| Example 2-11 | R-11 | 43 | 19.1 | 4.7 | 3.4 |
| Comparative Example 2-1 | R-12 | 34 | 13.1 | 6.0 | 3.8 |
| Comparative Example 2-2 | R-13 | 34 | 13.3 | 6.3 | 3.7 |
| Comparative Example 2-3 | R-14 | 30 | 12.4 | 6.1 | 3.8 |
| Comparative Example 2-4 | R-15 | 29 | 12.2 | 6.3 | 3.9 |
| Comparative Example 2-5 | R-16 | 28 | 12.1 | 5.9 | 3.8 |
| Comparative Example 2-6 | R-17 | 30 | 12.5 | 6.2 | 3.7 |

The results shown in Table 5 confirms that the resist composition of the present invention has good performances of EL, MEF, and circularity.

The present invention is not restricted to the embodiments shown above. The embodiments shown above are merely examples so that any embodiments composed of substantially the same technical concept as disclosed in the claims of the present invention and expressing a similar effect are included in the technical scope of the present invention.

What is claimed is:

1. An acid generator that generates a sulfonic acid selected from the following formulae in response to high-energy beam or heat,

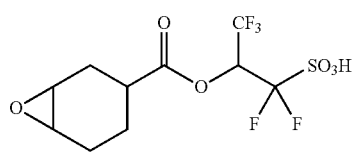

(PAG-1)

-continued
(PAG-3) 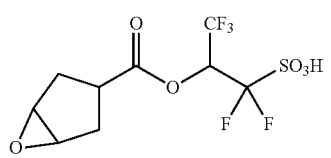
(PAG-5) 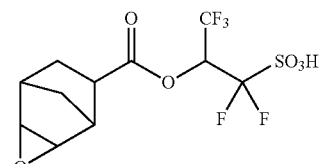
(PAG-7) 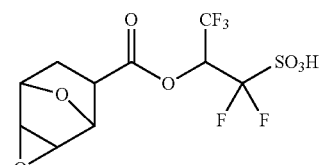
(PAG-9) 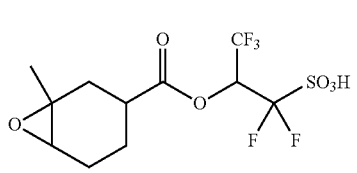
(PAG-11) 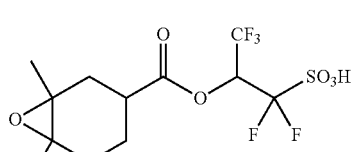
(PAG-13) 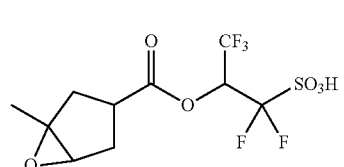
(PAG-15) 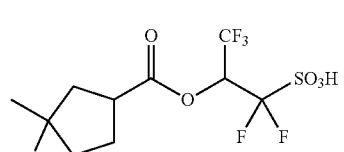
(PAG-17) 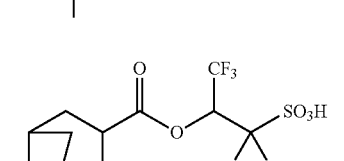
(PAG-23) 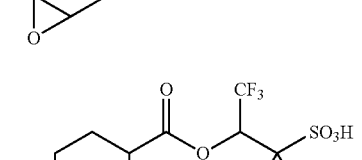
-continued
(PAG-25) 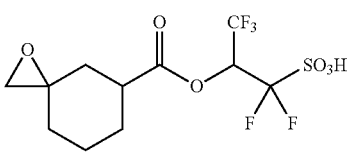
(PAG-27) 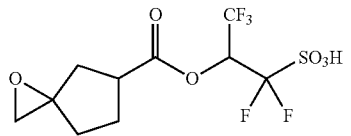
(PAG-29) 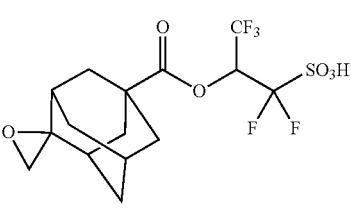
(PAG-31) 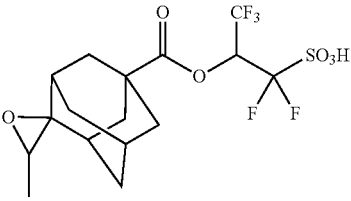
(PAG-33) 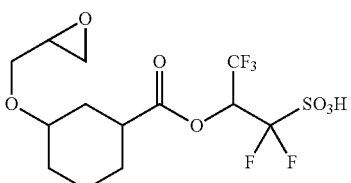
(PAG-35) 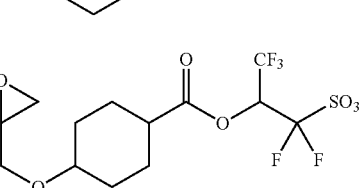
(PAG-37) 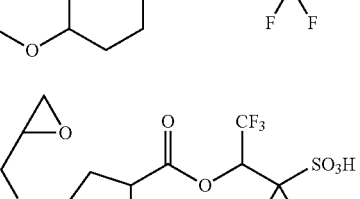
(PAG-39) 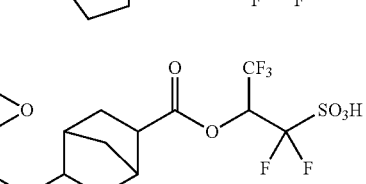
(PAG-41) 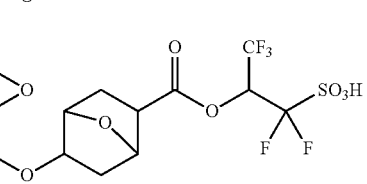

-continued (PAG-43)
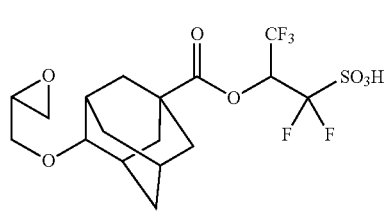

(PAG-45)
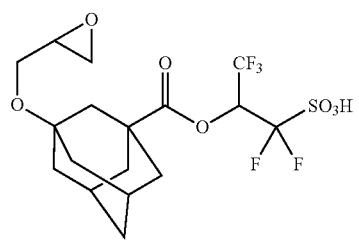

(PAG-47)
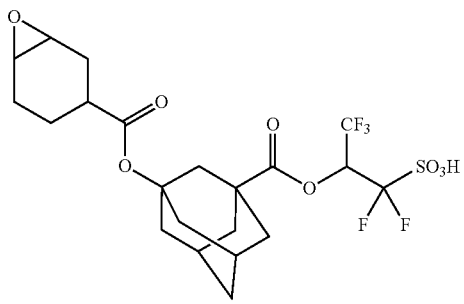

(PAG-49)
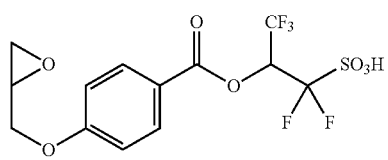

(PAG-51)
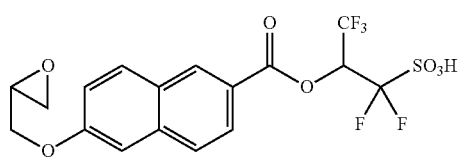

(PAG-53)
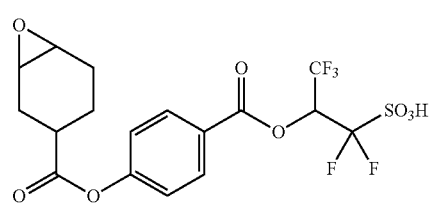

(PAG-57)
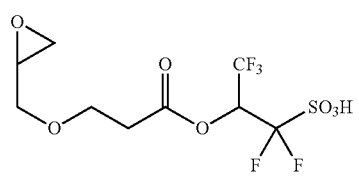

-continued (PAG-59)
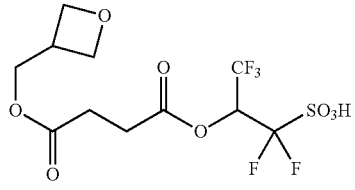

(PAG-61)
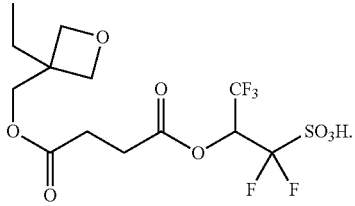

2. The acid generator according to claim 1, wherein the acid generator is a sulfonium salt of one of the formulae selected, having a sulfonium cation represented by:

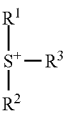

wherein
each of $R^1$, $R^2$, and $R^3$ independently represents any of a linear or a branched alkyl group, alkenyl group, and oxoalkyl group, substituted or unsubstituted, having 1 to 10 carbon atoms, or any of an aryl group, an aralkyl group, and an aryloxoalkyl group, substituted or unsubstituted, having 6 to 18 carbon atoms, and any two or more of $R^1$, $R^2$, and $R^3$ may be bonded to form a ring together with the sulfur atom.

3. The acid generator according to claim 2, wherein the sulfonium cation is represented by:

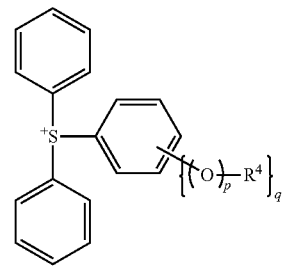

wherein
$R^4$ represents a linear, a branched, or a cyclic alkyl group or alkenyl group, substituted or unsubstituted, having 1 to 20 carbon atoms, or a substituted or an unsubstituted aryl group having 6 to 14 carbon atoms;
p represents 0 or 1; and
q represents an integer of 1 to 5.

4. A chemically amplified resist composition, comprising:
a base resin,
the acid generator according to claim 3,
a quencher, and
an organic solvent.

5. The chemically amplified resist composition according to claim 4, wherein the base resin is a polymer containing a repeating unit having an acid labile group represented by the following general formula (4) and a repeating unit represented by the following general formula (5),

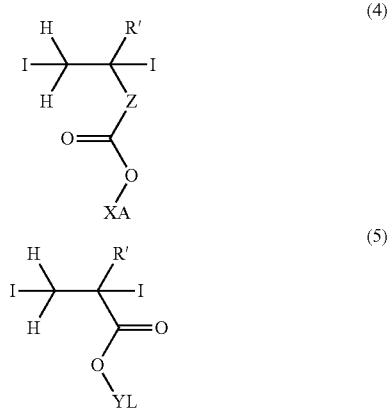

(4)

(5)

wherein
R' represents any of a hydrogen atom, a fluorine atom, a methyl group, and a trifluoromethyl group;
Z represents any of a single bond, a phenylene group, a naphthylene group, and (main chain)-C(=O)—O—Z'—;
Z represents any of a single bond, a phenylene group, a naphthylene group, and (main chain)-C(=O)—O—Z'—; where Z' represents a linear, a branched, or a cyclic alkylene group having 1 to 10 carbon atoms, optionally containing any of a hydroxy group, an ether bond, an ester bond, and a lactone ring, a phenylene group, or a naphthylene group;
XA represents an acid labile group; and
YL represents a hydrogen atom or a polar group having one or more structures selected from a hydroxy group, a cyano group, a carbonyl group, a carboxyl group, an ether bond, an ester bond, a sulfonate ester bond, a carbonate bond, a lactone ring, a sultone ring, and a carboxylic acid anhydride.

6. A patterning process, comprising:
applying the chemically amplified resist composition according to claim 5 to a substrate to form an applied resist film;
conducting heat-treatment;
exposing the applied resist film to any of a KrF excimer laser, an ArF excimer laser, EUV lithography, and an electron beam through a photomask;
again conducting heat-treatment; and then developing the applied resist film with a developer.

7. A patterning process, comprising:
applying the chemically amplified resist composition according to claim 4 to a substrate to form an applied resist film;
conducting heat-treatment;
exposing the applied resist film to any of a KrF excimer laser, an ArF excimer laser, EUV lithography, and an electron beam through a photomask;
again conducting heat-treatment; and then developing the applied resist film with a developer.

8. A chemically amplified resist composition, comprising:
a base resin,
the acid generator according to claim 2,
a quencher, and
an organic solvent.

9. The chemically amplified resist composition according to claim 8, wherein the base resin is a polymer containing a repeating unit having an acid labile group represented by the following general formula (4) and a repeating unit represented by the following general formula (5),

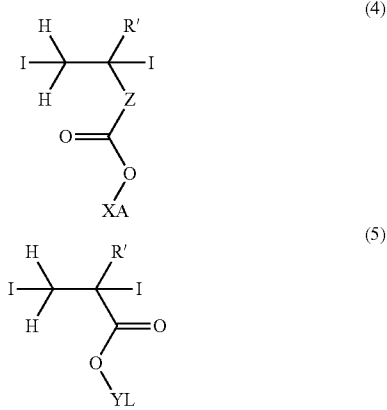

(4)

(5)

wherein
R' represents any of a hydrogen atom, a fluorine atom, a methyl group, and a trifluoromethyl group;
Z represents any of a single bond, a phenylene group, a naphthylene group, and (main chain)-C(=O)—O—Z'—; where Z' represents a linear, a branched, or a cyclic alkylene group having 1 to 10 carbon atoms, optionally containing any of a hydroxy group, an ether bond, an ester bond, and a lactone ring, a phenylene group, or a naphthylene group;
XA represents an acid labile group; and
YL represents a hydrogen atom or a polar group having one or more structures selected from a hydroxy group, a cyano group, a carbonyl group, a carboxyl group, an ether bond, an ester bond, a sulfonate ester bond, a carbonate bond, a lactone ring, a sultone ring, and a carboxylic acid anhydride.

10. A patterning process, comprising:
applying the chemically amplified resist composition according to claim 9 to a substrate to form an applied resist film;
conducting heat-treatment;
exposing the applied resist film to any of a KrF excimer laser, an ArF excimer laser, EUV lithography, and an electron beam through a photomask;
again conducting heat-treatment; and then
developing the applied resist film with a developer.

11. A patterning process, comprising:
applying the chemically amplified resist composition according to claim 8 to a substrate to form an applied resist film;
conducting heat-treatment;
exposing the applied resist film to any of a KrF excimer laser, an ArF excimer laser, EUV lithography, and an electron beam through a photomask;
again conducting heat-treatment; and then
developing the applied resist film with a developer.

12. A chemically amplified resist composition, comprising:
a base resin,
the acid generator according to claim 1, a quencher, and
an organic solvent.

13. The chemically amplified resist composition according to claim 12, wherein the base resin is a polymer containing a repeating unit having an acid labile group represented by the following general formula (4) and a repeating unit represented by the following general formula (5),

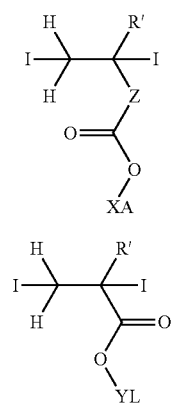

wherein
R' represents any of a hydrogen atom, a fluorine atom, a methyl group, and a trifluoromethyl group;
Z represents any of a single bond, a phenylene group, a naphthylene group, and (main chain)-C(=O)—O—Z'—; where Z' represents a linear, a branched, or a cyclic alkylene group having 1 to 10 carbon atoms, optionally containing any of a hydroxy group, an ether bond, an ester bond, and a lactone ring, a phenylene group, or a naphthylene group;
XA represents an acid labile group; and
YL represents a hydrogen atom or a polar group having one or more structures selected from a hydroxy group, a cyano group, a carbonyl group, a carboxyl group, an ether bond, an ester bond, a sulfonate ester bond, a carbonate bond, a lactone ring, a sultone ring, and a carboxylic acid anhydride.

14. A patterning process, comprising:
applying the chemically amplified resist composition according to claim 13 to a substrate to form an applied resist film;
conducting heat-treatment;
exposing the applied resist film to any of a KrF excimer laser, an ArF excimer laser, EUV lithography, and an electron beam through a photomask;
again conducting heat-treatment; and then developing the applied resist film with a developer.

15. A patterning process, comprising;
applying the chemically amplified resist composition according to claim 12 to a substrate to form an applied resist film;
conducting heat-treatment;
exposing the applied resist film to any of a KrF excimer laser, an ArF excimer laser, EUV lithography, and an electron beam through a photomask;
again conducting heat-treatment; and then
developing the applied resist film with a developer.

16. The patterning process according to claim 15, wherein the exposing comprises placing a liquid having an index of refraction of 1.0 or more between the applied resist film and a projection lens to conduct immersion lithography.

17. The patterning process according to claim 16, further comprising forming a top coat on the applied resist film, wherein the liquid is placed between the top coat and the projection lens to perform immersion lithography.

* * * * *